US011827987B2

(12) United States Patent
Stowell et al.

(10) Patent No.: US 11,827,987 B2
(45) Date of Patent: Nov. 28, 2023

(54) COHERENT GRAPHENE IN A METAL LATTICE

(71) Applicant: Lyten, Inc., San Jose, CA (US)

(72) Inventors: Michael Stowell, Sunnyvale, CA (US); Lauren Sienko, Champaign, IL (US); Daniel Jacobson, Champaign, IL (US); Bruce Lanning, Littleton, CO (US)

(73) Assignee: Lyten, Inc., San Jose, CA (US)

( * ) Notice: Subject to any disclaimer, the term of this patent is extended or adjusted under 35 U.S.C. 154(b) by 0 days.

(21) Appl. No.: 17/957,937

(22) Filed: Sep. 30, 2022

(65) Prior Publication Data

US 2023/0145800 A1 May 11, 2023

Related U.S. Application Data

(60) Continuation-in-part of application No. 17/241,852, filed on Apr. 27, 2021, which is a division of application No. 16/752,693, filed on Jan. 27, 2020, now abandoned, which is a continuation-in-part of application No. 16/460,177, filed on Jul. 2, 2019, now abandoned.

(60) Provisional application No. 63/252,304, filed on Oct. 5, 2021, provisional application No. 62/868,493, filed on Jun. 28, 2019, provisional application No. 62/839,995, filed on Apr. 29, 2019, provisional application No. 62/797,306, filed on Jan. 27, 2019, provisional application No. 62/720,677, filed on Aug. 21, 2018, provisional application No. 62/714,030, filed on Aug. 2, 2018.

(51) Int. Cl.
| | | |
|---|---|---|
| C23C 4/067 | (2016.01) | |
| B22F 1/12 | (2022.01) | |
| B22F 1/10 | (2022.01) | |
| C22C 32/00 | (2006.01) | |
| C23C 4/134 | (2016.01) | |

(52) U.S. Cl.
CPC ............ *C23C 4/067* (2016.01); *B22F 1/10* (2022.01); *B22F 1/12* (2022.01); *C22C 32/0084* (2013.01); *C23C 4/134* (2016.01)

(58) Field of Classification Search
CPC ........ C23C 4/067; C22C 32/0084; B22F 1/10
See application file for complete search history.

(56) References Cited

U.S. PATENT DOCUMENTS

| | | |
|---|---|---|
| 10,711,327 B2 | 7/2020 | Scherer et al. |
| 11,097,511 B2 | 8/2021 | Zhao et al. |
| 2016/0136928 A1 | 5/2016 | Zhao et al. |
| 2016/0273079 A1 | 9/2016 | Das et al. |
| 2019/0283379 A1 | 9/2019 | Lin et al. |
| 2020/0385272 A1 | 12/2020 | Cross et al. |
| 2023/0040722 A1 | 2/2023 | Stowell et al. |

FOREIGN PATENT DOCUMENTS

| | | |
|---|---|---|
| WO | 2022129736 A1 | 6/2022 |
| WO | 2022200694 A1 | 9/2022 |

OTHER PUBLICATIONS

U.S. Appl. No. 17/241,852 (Year: 2021).*
Tian et al., "A Review on the Strengthening of Nanostructured Materials," International Journal of Current Engineering and Technology, vol. 8, No. 2, 2018, pp. 236-249.
Bakir et al., "Novel metal-carbon nanomaterials: A review on covetics," Advanced Materials Letters, vol. 8, No. 9, 2017, pp. 884-890.
Wang et al., "Improvement of interfacial interaction and mechanical properties in copper matrix composites reinforced with copper coated carbon nanotubes," Materials Science and Engineering A, vol. 715, 2018, pp. 163-173.
Uglov et al., "Mechanical properties of copper/carbon nanocomposite films formed by microwave plasma assisted deposition techniques from argon-methane and argon-acetylene gas mixtures," Composites Science and Technology, vol. 65, 2005, pp. 785-791.
Varnell et al., "Understanding the influence of carbon addition on the corrosion behavior and mechanical properties of Al alloy 'covetics'," Journal of Materials Science, vol. 54, No. 3, Feb. 2019, 14 pages.
Balachandran, U., "Covetic Materials," Argonne National Laboratory, U.S. DOE Advanced Manufacturing Office Program Review Meeting, May 2015, 17 pages.
Isaacs, R., "Characterization of copper covetic bulk and films: Copper with high carbon content," University of Maryland, 2016, 130 pages, retrieved from https://drum.lib.umd.edu/handle/1903/18380.

(Continued)

*Primary Examiner* — Edward J Cain
(74) *Attorney, Agent, or Firm* — Zilka-Kotab, P.C.

(57) ABSTRACT

Inventive techniques for forming unique compositions of matter are disclosed, as well as various advantageous physical characteristics, and associated properties of the resultant materials. In particular, metal(s) (including various alloys, such as Inconel superalloys) are characterized by having carbon disposed within the metal lattice structure thereof. The carbon is primarily, or entirely, present at interstitial sites of the metal lattice, and may be present in amounts ranging from about 15 wt % to about 90 wt %. The carbon, moreover, forms non-polar covalent bonds with both metal atoms of the lattice and other carbon atoms present in the lattice. This facilitates substantially homogeneous dispersal of the carbon throughout the resultant material, conveying unique and advantageous properties such as strength-to-weight ratio, density, mechanical toughness, sheer strength, flex strength, hardness, anti-corrosiveness, electrical and/or thermal conductivity, etc. as described herein. In some approaches, the composition of matter may be powderized, or the powder may be pelletized.

20 Claims, 54 Drawing Sheets

(56) References Cited

OTHER PUBLICATIONS

Pham et al., "A method to obtain homogeneously dispersed carbon nanotubes in Al powders for preparing Al/CNTs nanocomposite," Advances in Natural Sciences: Nanoscience and Nanotechnology, vol. 4, 2013, 6 pages.

Basu, B., "Some fundamentals on Spark Plasma Sintering as a processing tool to fabricate Biomaterials," Department of Materials Science and Engineering, Indian Institute of Technology Kanpur, retrieved from https://www.iitk.ac.in/biomaterialslab/Spark%20Plasma%20Sintering%20-%20Fundamentals.pdf on Aug. 30, 2022, 44 pages.

Washington Education Structures, "Structures of Metals," Washington Education Structures, retrieved from https://web.archive.org/web/20170124054449/https://depts.washington.edu/matseed/mse_resources/Webpage/Metals/metalstructure.htm on Sep. 23, 2020, 4 pages.

Stowell et al., U.S. Appl. No. 17/957,989, filed Sep. 30, 2022.

Restriction Requirement from U.S. Appl. No. 17/957,989, dated Jun. 22, 2023.

Non-Final Office Action from U.S. Appl. No. 17/957,989, dated Aug. 1, 2023.

\* cited by examiner

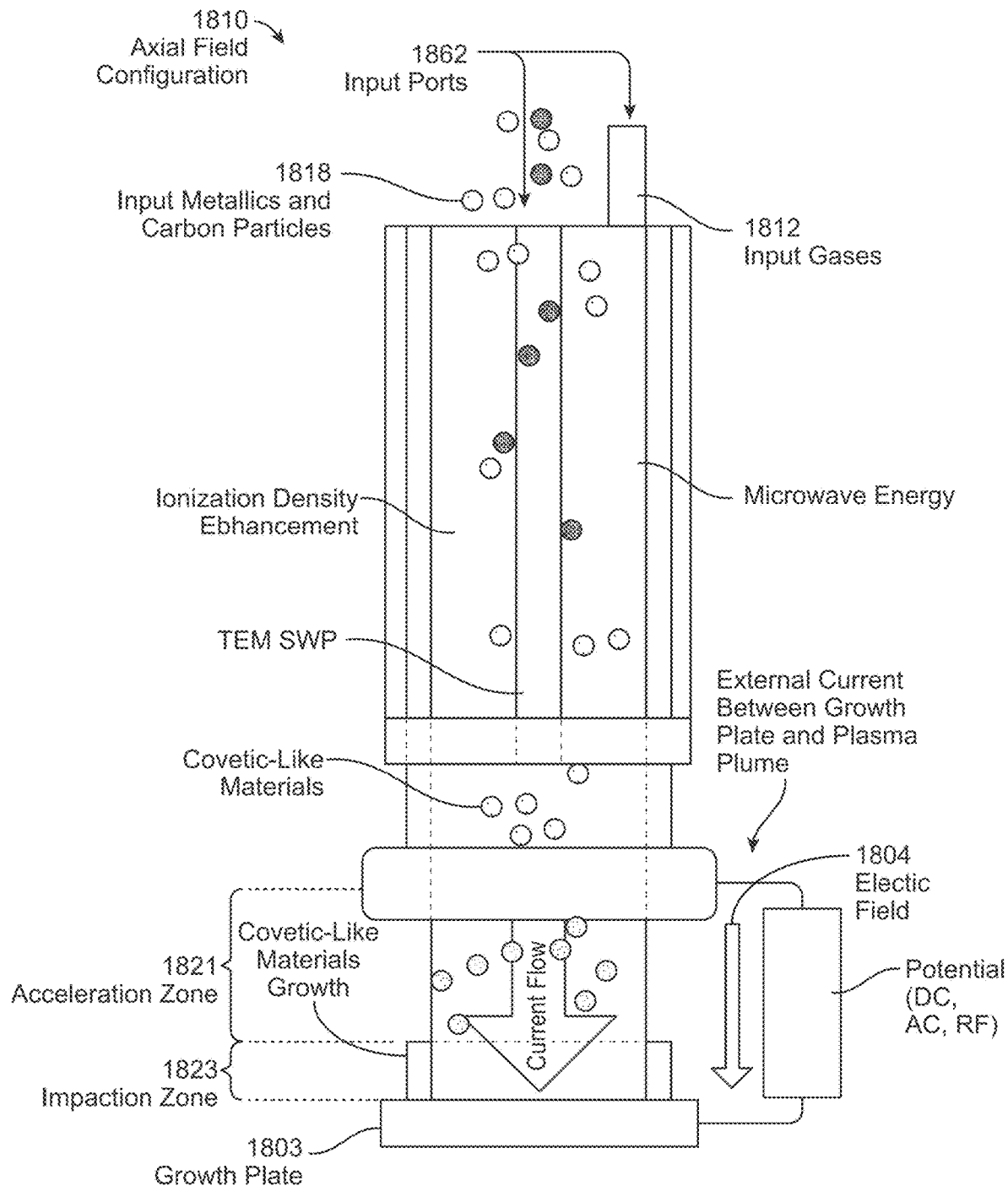
FIG. 18A1

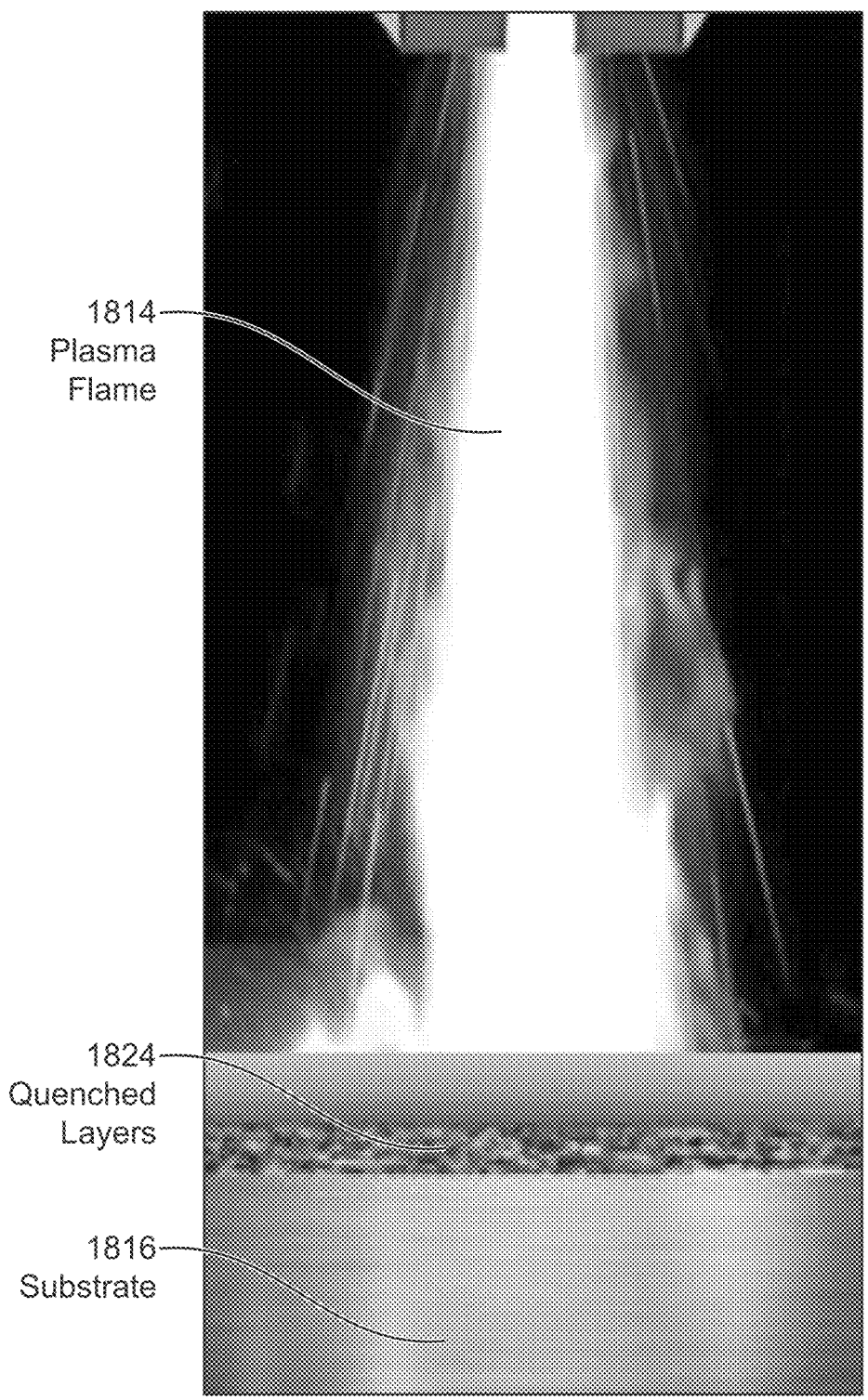
FIG. 18A2

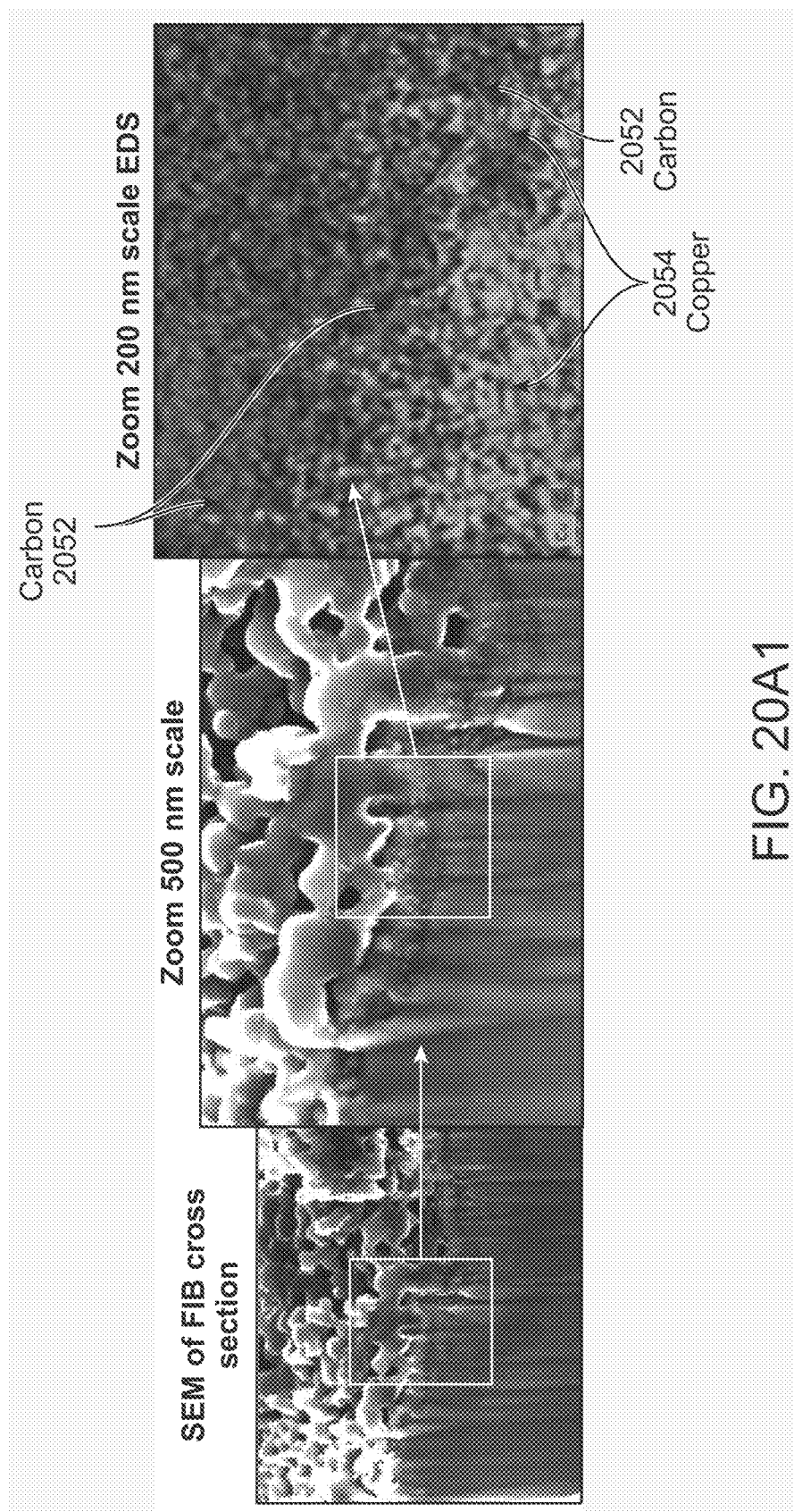
FIG. 20A1

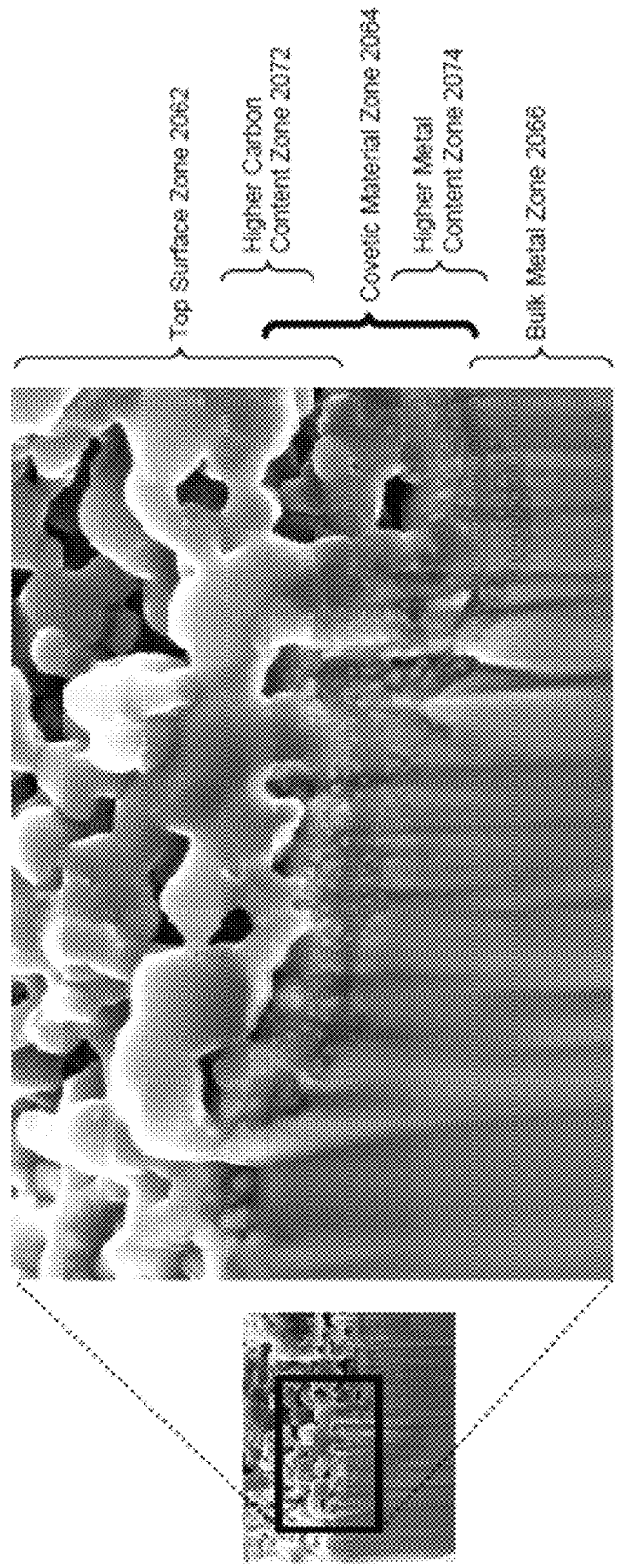
FIG. 20A2

Configure a microwave reactor with (1) an inlet for a process gas (2) an inlet for a metal melt, and (3) an exit port 21B02

Introduce a hydrocarbon process gas into a first region of the reactor such that the hydrocarbon process gas dissociates into carbon and hydrogen species before reaching the metal melt 21B10

Introduce a metal melt into a second region of the reactor 21B20

Maintain the temperature in the second region until the dissociated carbon mixes with the metal melt
21B30

To next page

*FIG. 21B*

From previous page

Move the mixture into a third region of the reactor 21B40

Reduce the temperature of the mixture until at least some of the carbon condenses out of the mixture 21B50

Move the mixture through the exit port 21B60

Deposit the mixture onto a substrate 21B70

*FIG. 21B cont.*

From previous page

Move the mixture into a third region of the reactor 22B40

Reduce the temperature of the mixture until at least some of the molten metal wraps around at least some of the carbon particles 22B50

Move the mixture through the exit port 21B60

Deposit the mixture onto a substrate 21B70

FIG. 22B cont.

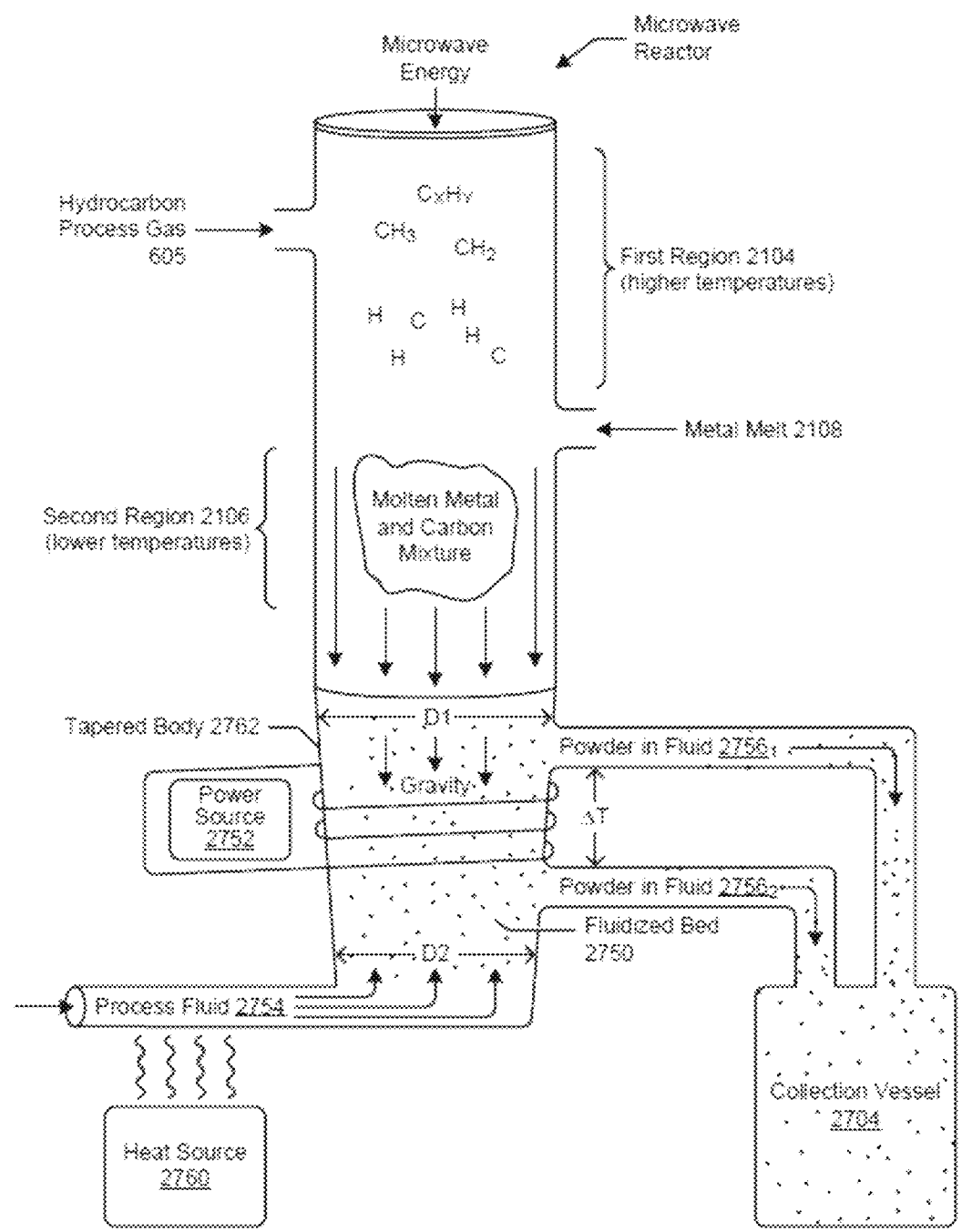
*FIG. 27B1*

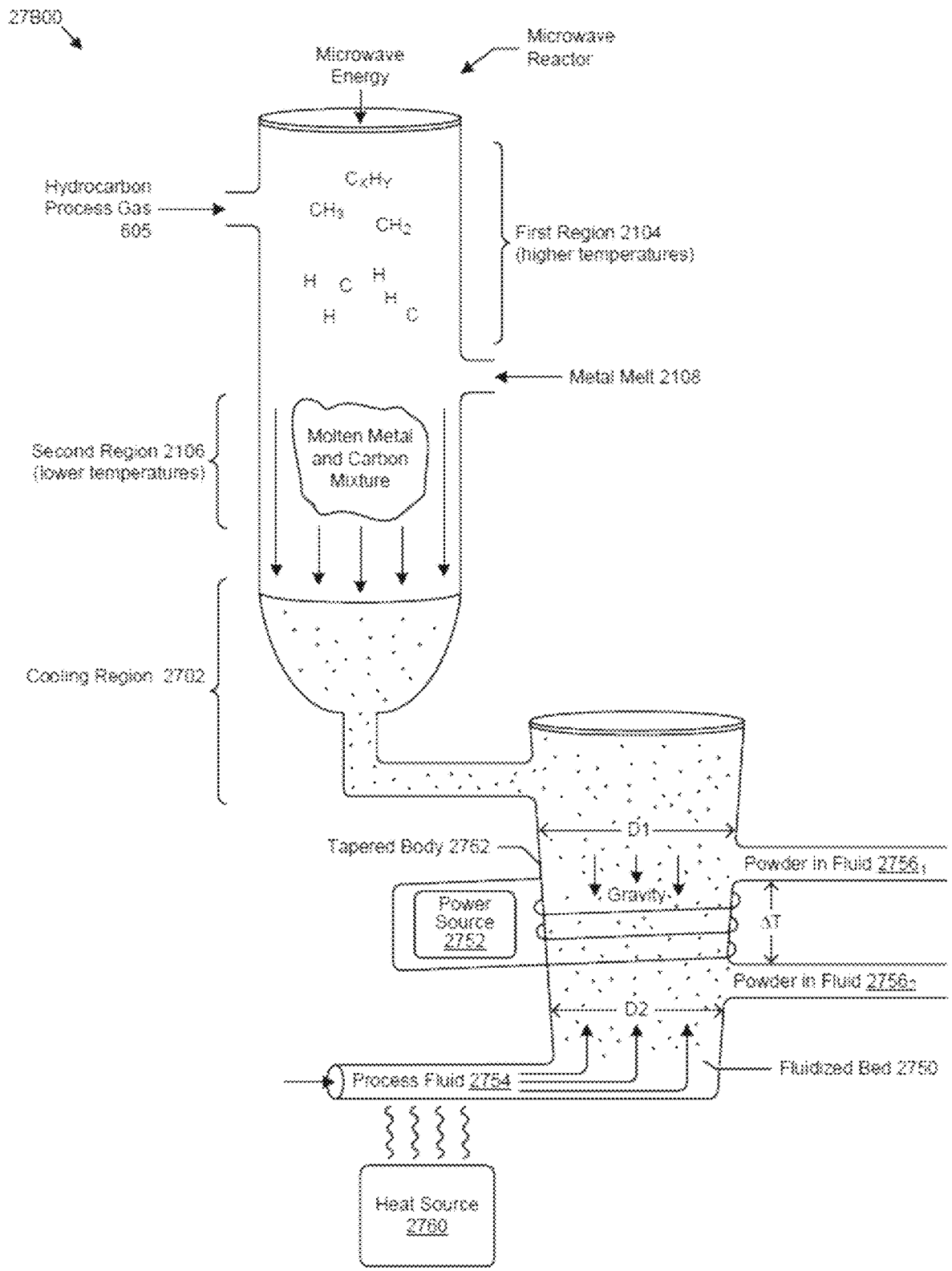
*FIG. 27B2*

```
From previous page
         │
         ▼
```

Introduce the melted selected powdered covetic material into a mold 2840

Maintain a prescribed temperature and a prescribed pressure inside the mold for a prescribed duration 2850

Bring the temperature and pressure inside the mold to about 30 degrees C and about atmospheric pressure 2860

Remove the mold to release the component 2870

Deploy the component in the application 2880

*FIG. 28 cont.*

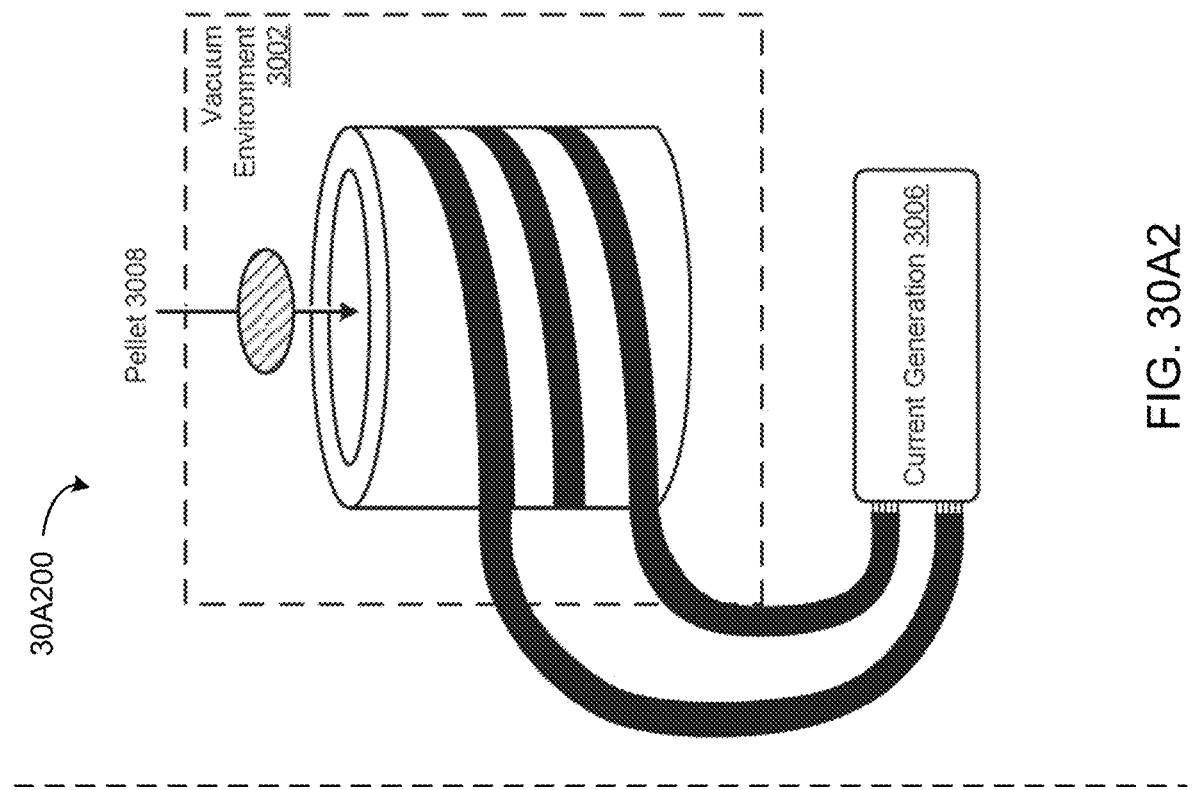
FIG. 30A2
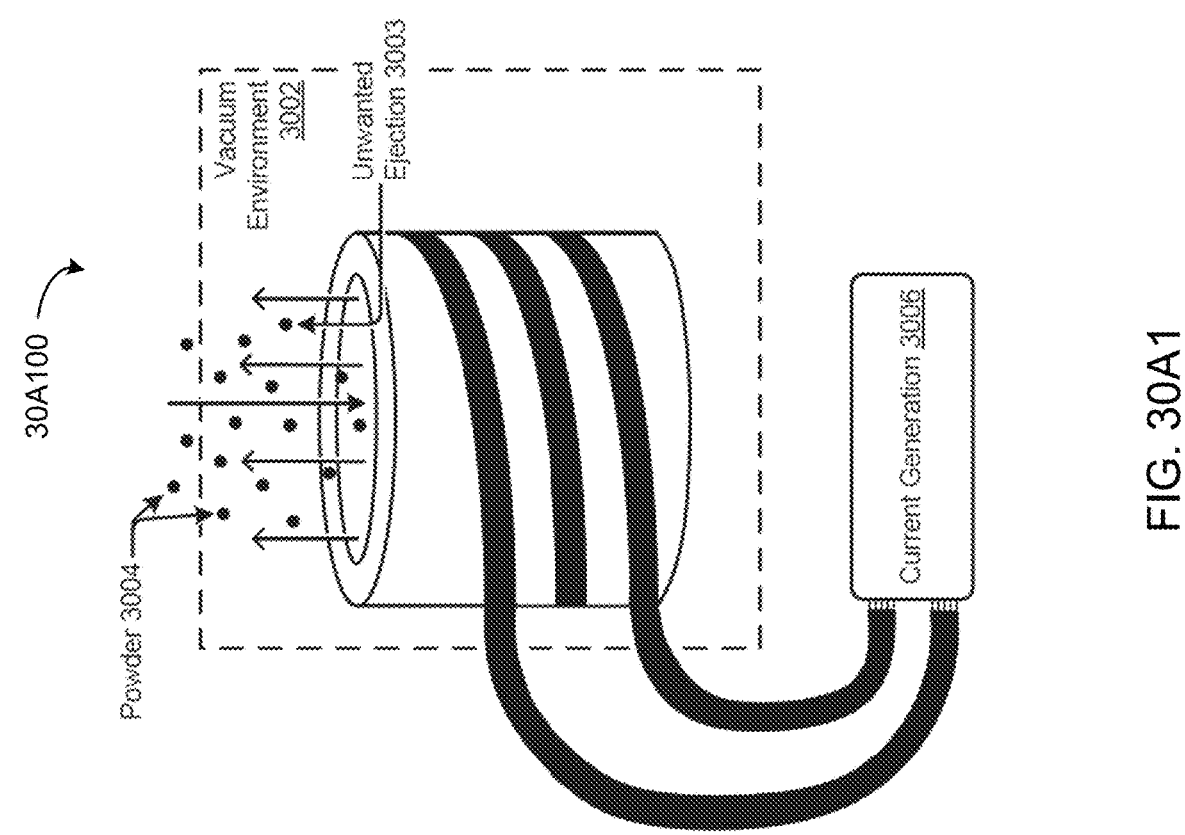
FIG. 30A1

COHERENT GRAPHENE IN A METAL LATTICE

RELATED APPLICATIONS

This patent application is a continuation-in-part of, and claims priority to U.S. patent application Ser. No. 17/241,852 entitled "COVETIC MATERIALS" and filed on Apr. 27, 2021, which is a divisional application of U.S. patent application Ser. No. 16/752,693 entitled "COVETIC MATERIALS" and filed on Jan. 27, 2020, which is a continuation in part of U.S. patent application Ser. No. 16/460,177 entitled "PLASMA SPRAY SYSTEMS AND METHODS" and filed on Jul. 2, 2019, which claims priority to U.S. Provisional Patent Application No. 62/720,677 entitled "PLASMA SPRAY SYSTEMS AND METHODS" and filed on Aug. 21, 2018, and to U.S. Provisional Patent Application No. 62/714,030 entitled "PLASMA SPRAY DEPOSITION" and filed on Aug. 2, 2018. U.S. patent application Ser. No. 16/752,693 claims priority to U.S. Provisional Patent Application No. 62/868,493 filed on Jun. 28, 2019, to U.S. Provisional Patent Application No. 62/839,995 filed on Apr. 29, 2019, and to U.S. Provisional Patent Application No. 62/797,306 filed on Jan. 27, 2019.

This application also claims priority to U.S. Provisional Patent Application No. 63/252,304 filed on Oct. 5, 2021. The disclosures of all prior applications are considered part of and are incorporated by reference in this patent application.

TECHNICAL FIELD

This disclosure generally relates to making and using carbon-containing alloys in an induction melting furnace.

BACKGROUND

Specialized alloys are smelted in vacuum induction melting (VIM) furnaces. The crucible of such a VIM furnace is used to melt and mix various admixture components (e.g., metals and non-metals). Once the various components of the melt are mixed, the melt can be disposed (e.g., poured) into a mold and cooled. Some admixtures include constituents that are in powder form. Unfortunately, the emotive forces from the induction coils of the VIM furnace act on the powders so as to eject the powder from the VIM furnace. This inhibits mixing of the powders with the other constituents. What is needed are improved methods for using powdered constituents in vacuum induction melting furnaces.

As used herein, the term "covetic materials" refers to metals infused with nanoscale-sized carbon particles. Covetic materials are desired in various applications since covetic materials possess many physical, chemical, and electrical properties that exceed the capabilities of traditional non-carbon infused materials.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods, and devices of this disclosure each have several innovative aspects, no single one of which is solely responsible for the desirable attributes disclosed herein.

Various implementations of the subject matter disclosed herein relate generally to apparatuses, methods, and various compositions of carbon-metal composite materials. The apparatuses are shown and discussed as may be relevant to controlled usage of a plasma spray torch apparatus to produce various carbon-metal bonded compositions of matter, referred to generally and in the present disclosure as "covetic materials". In some cases, the materials are metal-decorated carbons. In some cases, the materials are carbon-decorated metals. In other aspects, carbon may be combined with materials other than metals, such as ceramics, plastics, composites, silicon, etc. as described in greater detail hereinbelow.

One configuration of a plasma spray torch is embodied as apparatus having a reaction chamber configured to receive a hydrocarbon process gas that is mixed with a plurality of molten metal nanoscale-sized particles, a microwave energy source operatively coupled to the reaction chamber to provide power thereto, and a controller to adjust the microwave energy source to create conditions in the reaction chamber such that the hydrocarbon process gas dissociates into its constituent carbon atoms, and single layer graphene (SLG) or few layer graphene (FLG) is grown from the carbon atoms onto the molten metal nanoscale-sized particles to form a plurality of carbon-metal nanoscale-sized particles. In some configurations, the conditions in the reaction chamber cause: (i) a first temperature at which the carbon atoms dissolve into the molten metal nanoscale-sized particles, and (ii) a second temperature at which at least some of the dissolved carbon atoms combine with the molten metal in a crystallographic configuration. Some configurations of the apparatus avail of a cooling zone to cool the plurality of carbon-metal nanoscale-sized particles to a powdered form that can be collected and stored in a containment vessel that is juxtaposed in proximity with the reaction chamber.

According to various implementations, the presently disclosed inventive concepts may be embodied as compositions of matter having any of the following physical and/or structural characteristics, and associated properties. Moreover, these characteristics and/or properties may, according to different embodiments, be included in different combinations or permutations, without limitation.

In one aspect, a composition of matter includes one or more particles, and each particle independently comprises a metal lattice having one or more coherent, planar layers of graphene disposed therein. Preferably, at least some carbon atoms of the one or more coherent, planar layers of graphene are disposed in interstitial sites within the metal lattice. More preferably, the one or more coherent, planar layers of graphene are interlaced interstitially between basal planes of the metal lattice. The graphene may be present as a single layer (e.g., "single layer graphene" or "SLG"), or as multiple layers (e.g., two layers, three layers, five layers, ten layers, or any number of layers up to fifteen, also referred to herein as "few layer graphene" or "FLG"). At least some carbon atoms of the one or more layers of graphene are covalently bonded to metal atoms of the metal lattice, and the covalent bonds between carbon atoms and the metal atoms are, or include non-polar covalent bonds. In some embodiments, the covalent bonds may consist essentially, or entirely, of non-polar covalent bonds. Similarly, carbon atoms of the one or more layers of graphene may be covalently bonded to other carbon atoms of the one or more layers of graphene, and these covalent bonds may comprise, consist essentially, or consist entirely, of non-polar covalent bonds, according to different implementations. Accordingly, the one or more particles may substantially, or entirely, exclude polar covalent bonds. In like manner, the metal lattice of each particle may substantially, or entirely, exclude ionic bonds. The one or more layers of graphene are each preferably substantially devoid of defects, such that the graphene is "pristine". Preferably, each particle is also characterized by a substantial, or more preferably complete, lack of carbon aggregate(s) and/or agglomerate(s) at grain boundaries and/or at surface(s) of the metal lattice. Owing to the inventive processing techniques described herein, total carbon loading of the particle(s) may range from about 15 wt % to about 90 wt %, with various intermediate loadings also being demonstrated (e.g., about 20 wt %, about 25 wt %, about 33 wt %, about 40 wt %, about 50 wt %, about 60 wt %, about 75 wt %, or up to 90 wt %, in various implementations). Moreover, the particles may be characterized by a diameter in a range from about 20 nm to about 3.5 µm, and/or by having a largest discernable feature size is in a range from about 0.1 nm to about 1 µm. In some implementations, the particles may be pressed into a pellet.

According to another aspect, a composition of matter includes an Inconel alloy having carbon disposed in a metal lattice thereof. Preferably, at least some of the carbon is disposed at interstitial sites of the metal lattice, and more preferably, the carbon is substantially homogenously distributed throughout the metal lattice. Moreover, grain boundaries of the composition of matter, and/or surfaces of the metal lattice, are substantially devoid of carbon aggregate(s) and/or agglomerate(s), in some implementations. Accordingly, a largest discernable feature size of the composition of matter may be in a range from about 0.1 nm to about 1 µm. At least some carbon atoms are covalently bonded to metal atoms of the metal lattice, and the covalent bonds between carbon atoms and the metal atoms are, or include non-polar covalent bonds. In some embodiments, the covalent bonds may consist essentially, or entirely, of non-polar covalent bonds. Similarly, carbon atoms may be covalently bonded to other carbon atoms, and these covalent bonds may comprise, consist essentially, or consist entirely, of non-polar covalent bonds, according to different implementations. Accordingly, the one or more composition of matter may substantially, or entirely, exclude polar covalent bonds. In like manner, the metal lattice may substantially, or entirely, exclude ionic bonds.

Pursuant to yet another aspect, a composition of matter includes a metal lattice having at least about 15 wt % carbon disposed therein. Preferably, at least some of the carbon is disposed at interstitial sites of the metal lattice, and more preferably, the carbon is substantially homogenously distributed throughout the metal lattice. Moreover, grain boundaries of the composition of matter, and/or surfaces of the metal lattice, are substantially devoid of carbon aggregate(s) and/or agglomerate(s), in some implementations. Accordingly, a largest discernable feature size of the composition of matter may be in a range from about 0.1 nm to about 1 µm. At least some carbon atoms are covalently bonded to metal atoms of the metal lattice, and the covalent bonds between carbon atoms and the metal atoms are, or include non-polar covalent bonds. In some embodiments, the covalent bonds may consist essentially, or entirely, of non-polar covalent bonds. Similarly, carbon atoms may be covalently bonded to other carbon atoms, and these covalent bonds may comprise, consist essentially, or consist entirely, of non-polar covalent bonds, according to different implementations. Accordingly, the one or more composition of matter may substantially, or entirely, exclude polar covalent bonds. In like manner, the metal lattice may substantially, or entirely, exclude ionic bonds.

In various implementations of the foregoing aspects, the metal lattice may include one or more metals selected from the group consisting of: aluminum, copper, iron, nickel, titanium, tantalum, tungsten, chromium, molybdenum, cobalt, manganese, niobium, and combinations thereof. Accordingly, the metal lattice may be characterized by a crystalline structure such as face centered cubic (FCC), body-centered cubic (BCC), or hexagonal close packed (HCC). Furthermore, the metal lattice may comprise anywhere from about 15 wt % to about 90 wt % carbon (e.g., about 20 wt %, about 25 wt %, about 33 wt %, about 40 wt %, about 50 wt %, about 60 wt %, about 75 wt %, or up to 90 wt %, in various implementations). The carbon is preferably present at interstitial sites of the metal lattice. The metal(s) may be present in the form of alloy(s), in some approaches. For instance, in particularly preferred approaches, the metals are present in the form of one or more Inconel alloys, such as Inconel 600, Inconel 617, Inconel 625, Inconel 690, Inconel 718 and/or Inconel X-750. Even more preferably, the Inconel alloy(s) are superalloy(s).

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Implementations of the subject matter disclosed herein are illustrated by way of example and are not intended to be limited by the figures of the accompanying drawings. Like numbers reference like elements throughout the drawings and specification. Note that the relative dimensions of the following figures may not be drawn to scale.

FIG. 18A1-2, FIG. 18B, FIG. 18C, and FIG. 18D depict various configurations of a plasma spray reactor, in accordance with one or more of the disclosed implementations.

FIG. 20A1 are images depicting organo-metallic bonding that occurs when combining carbon and copper using a plasma spray torch, in accordance with some of the disclosed implementations.

FIG. 20A2 are images depicting a graded composition of matter applied into a substrate material and showing multiple (such as three) material property zones, in accordance with some of the disclosed implementations.

FIG. 21B depicts a method for spraying materials (e.g., covetic materials) into a substrate, in accordance with one or more of the disclosed implementations.

FIG. 27B1 and FIG. 27B2 depict an example fluidized bed apparatus for cooling and handling powdered materials, e.g., powdered covetics, in a fluid, in accordance with one or more of the disclosed implementations.

FIG. 30A1 and FIG. 30A2 depict problems and solutions associated with melting powder (e.g., metal-decorated carbons) as compared to melting in the same or similar materials in pellet form, according to some embodiments.

DETAILED DESCRIPTION

Figure 1A:
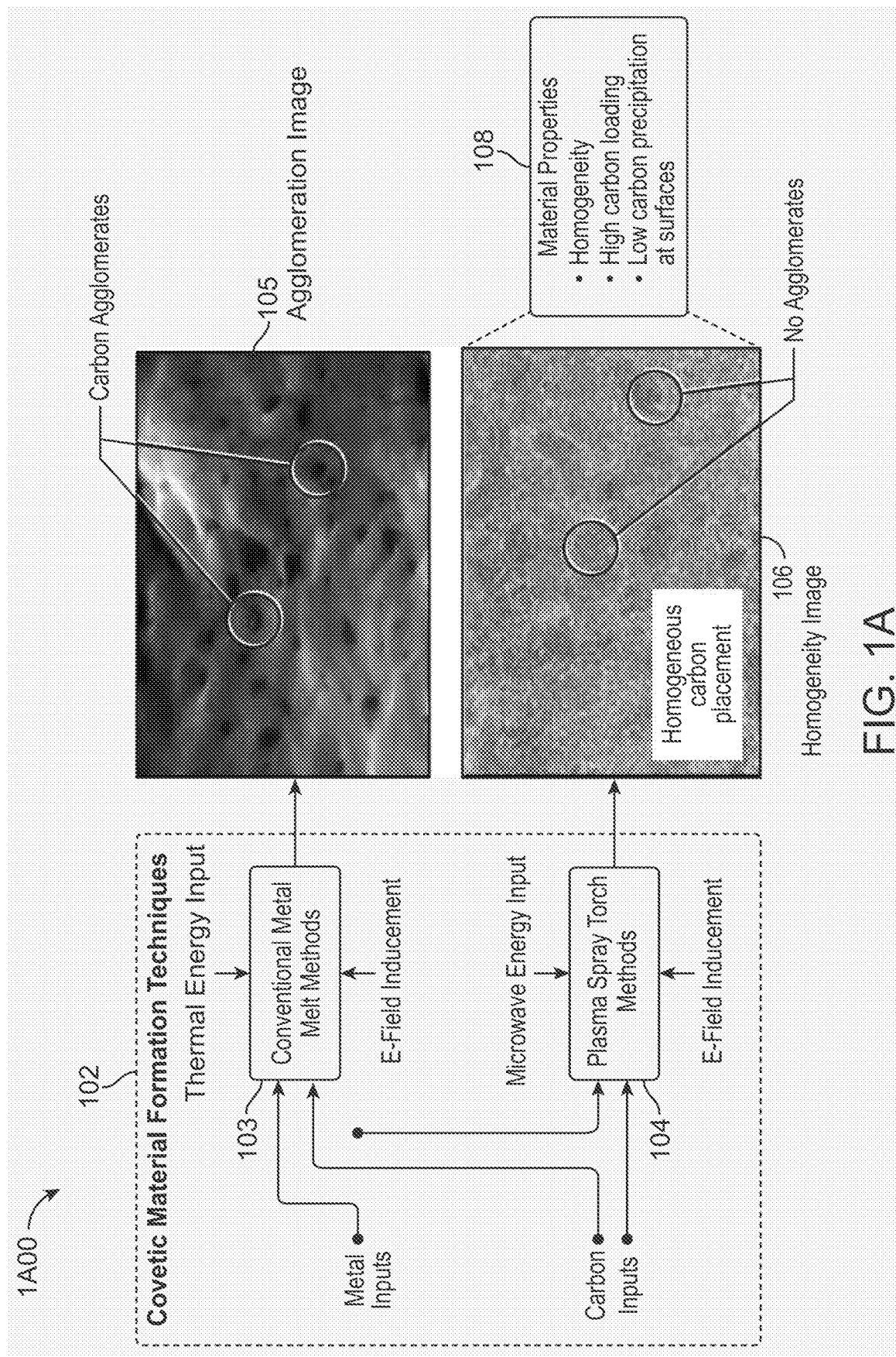
FIG. 1A is a comparison chart showing two different covetic material formation techniques and example materials that result from application of each, respectively, according to some implementations.

Aspects of the present disclosure are directed to approaches for creating covetic materials using spraying techniques, rather than by mixing carbon-based materials into the bulk of a molten metal slurry. Some implementations relate to techniques for reduction of the size of interstitial carbon structures down to the nanometer (nm) scale. The accompanying figures and discussions herein present example environments, example systems, and example methods for creating "covetic" materials, understood generally and defined herein to imply comprised of high concentrations (>6% wt, and up to 90% wt) of carbon, integrated into other materials (such as metals, metal-containing materials, plastics, composites, ceramics, etc. as described herein according to various embodiments) in such a way that the carbon does not separate out during melting or magnetron sputtering. The resulting material has many unique and improved properties over the base material from which it is produced. The carbon is dispersed through the (e.g., metal) matrix in several ways that contribute to improvements in material properties. For instance, the carbon is bound into the resulting material (e.g., a covetic material) very strongly, often resisting many standard methods at detecting and characterizing its form. Inclusion of nanoscale carbon raises the melting points and surface tension of the resulting material. Materials produced according to the techniques described herein have higher warm-worked and cold-worked strengths.

Identification and Significance of Problem and Opportunity

Metal matrix composites may be composed of (at least) a metal or metal alloy (referring to a metal made by combining two or more metallic elements, especially to give greater strength or resistance to corrosion) matrix, in combination with a higher strength modulus ceramic, carbon-based reinforcement, or micro filler in the form of continuous or discontinuous fibers, whiskers, or particles. The size of the reinforcement is important as micrometer-sized reinforcement metals may exhibit improved strength and stiffness up to acceptable levels over base alloys. Nevertheless, such improvements may also be accompanied with undesirably poor ductility and undesirably low yield strength, machinability, and fracture toughness at threshold loadings due to undesirable non-homogeneous disposition of carbon between particles (e.g., at grain boundaries) during processing. To avoid premature cracking and other shortcomings of metal matrix composites with incompatible micrometer-sized reinforcements, it is essential to reduce the size of a reinforcing phase to nanometer scale. Further, methods are needed such that the reinforcing phase is incorporated into the (e.g., metal alloy) matrix, and most preferably such that the reinforcing phase is homogeneously incorporated into the matrix.

Significant increases in mechanical, thermal, electrical, and tribological (referring to the science and engineering of interacting surfaces in relative motion) properties have been observed commensurate with the addition of the aforementioned carbon-based reinforcement. Notably, such properties may change and/or improve as the size of the reinforcement is reduced from a microscale (such as 1-1000 μm) to a nanoscale (such as <100 nm) due to increased cohesion forces between the matrix and the particles. The improvement in properties can be attributed to formation of strong interfaces that promote efficient strengthening mechanisms. Enhancements in tensile and yield strength were reported for nanosized particles (~20 nm) versus micro-sized particles (~3.5 μm), although with as much as an order of magnitude less volume loading of the nano-size particles versus the micron-sized particles. Legacy techniques such as induction melting, plasma spark sintering, etc. as known in the art thus often fail to provide reinforcement at nanometer scales. Accordingly, there is a current need for the reduction of carbon structures having interstitial vacancies contained therein down to the nanometer scale.

Microwave (MW) Plasma Torch Reactor

Using a microwave (MW) plasma torch reactor, pristine 3D few layer graphene (FLG) particles can be continuously nucleated, such as in-flight in an atmospheric-pressure vapor flow stream of a carbon-containing species, such as methane gas, where such nucleation occurs from an initially synthesized carbon-based or carbon-including "seed" particle. Ornate, highly structured, and tunable 3D mesoporous carbon-based particles composed of multiple layers of FLG (such as 5-15 layers) are grown from the carbon-containing species along with concomitant incorporation of metal elements or metal-based alloys to form at least partially covalently bonded (as well as at least partially metallically or ionically bonded) carbon-metal composite, also referred to herein as "covetic", particle structures. In some implementations, "pristine" graphene (referring to graphene with no defects, or very few defects) is provided or generated in the described MW torch reactor is not oxidized, or contains very little (such as <1%) oxygen content. By itself, in some implementations, metal (in the resultant covetic materials) is held together by metallic bonding and, by itself, carbon (prevalent in graphene or some other organized carbon based 2D or 3D structure, such as a matrix or lattice), is held together by (primarily) non-polar covalent bonds. The composite carbon-metal structure may include non-polar covalent bonds between the carbon and metal atoms that occur at the metal-carbon interface. In preferred implementations, the covalent bonds between carbon atoms and/or between carbon and metal atoms present in the composition of matter consist essentially, or entirely, of non-polar covalent bonds.

Moreover, the carbon may be present in amounts not capable of being achieved using conventional techniques, e.g., the resulting materials may include more than about 6 wt % carbon, more than about 15 wt % carbon, more than about 40 wt % carbon, more than about 60 wt % carbon, or up to about 90 wt % carbon, according to various embodiments. In various embodiments, the carbon may be included in the metal lattice in the foregoing amounts, such that all or substantially all of the carbon is incorporated into the metal (or other material) lattice, and grain boundaries/lattice surfaces are substantially or entirely devoid of carbon aggregates and/or agglomerates. Further still, the carbon is preferably located at interstitial sites of the lattice.

In particularly preferred embodiments, a material may be provided in the form of a powder having the physical characteristics of "covetic" materials as described herein. The powder may comprise a plurality of particles, e.g., particles having a diameter from about 20 nm to about 3.5 μm, where each particle includes metal-decorated carbon (either in the form of carbon on metal, or metal on carbon) having carbon disposed in the metal lattice as described herein. Most preferably, the particles each independently comprise a metal lattice having one or more (e.g., one, two, five, ten, or up to fifteen) coherent, planar layers of graphene disposed in the metal lattice. FIGS. 21C and 27C show an exemplary cross-sectional structure of such a coherent, planar layer of graphene disposed along a basal plane of an aluminum matrix, according to one aspect of the presently described inventive concepts. Skilled artisans will appreciate that various implementations of the presently described powder may include particles exhibiting such a cross sectional structure. In practice, as the carbon is incorporated into the lattice, it advantageously wicks to the basal plane surfaces rather than precipitating at grain boundaries (or other lattice surfaces). This process is only possible due to the wettable nature of graphene on the nanoscale, and is not observed when producing carbon-implanted materials using conventional techniques.

In various aspects, at least some carbon atoms of the one or more coherent, planar layers of graphene are disposed in interstitial sites within the metal lattice, and preferably one or more coherent, planar layers of graphene are juxtaposed parallel to a basal plane of the metal lattice. In some embodiments, one or more coherent, planar layers of graphene are juxtaposed interstitially between basal planes of the metal lattice. In some embodiments, one or more coherent, planar layers of graphene are interlaced interstitially between basal planes of the metal lattice. Skilled artisans reading the present disclosure will appreciate that this unique distribution of carbon at interstitial sites, and disposal with respect to the basal planes of the lattice, are possible due to the inventive processing described herein, which takes advantage of high "wettability" of graphene (particularly pristine graphene) at the nanoscale, and enables both the high carbon loading, substantially homogeneous carbon dispersion, and substantial absence of carbon aggregates and/or agglomerates as described herein, all of which are not achievable using conventional techniques. See, e.g., FIGS. 1A-1B for a graphical comparison of conventionally produced "covetic materials" compared to materials produced using the inventive techniques described herein, as well as corresponding descriptions below.

With continuing reference to powdered materials according to the present disclosure, at least some of the carbon atoms may be covalently bonded to metal atoms of the metal lattice, while also allowing for non-polar covalent bonding between carbon atoms, and/or metallic bonding between metal atoms of the material. More specifically, the non-polar covalent bonding between the carbon atoms, and/or between the carbon atoms and metal atoms, is characterized by equal sharing of electrons between the bonded atoms, as opposed to polar covalent bonding (where electrons are shared between bonded atoms) or ionic bonding (where bonded atoms are held together due to charge difference following transfer of electron(s) from one atom to the other). In some aspects, particles of the powdered materials may substantially, or entirely, exclude polar covalent bonds and/or ionic bonds. In the present context, "substantial" exclusion of polar covalent bonds and/or ionic bonds refers to compositions whose properties (e.g., crystalline structure, mechanical strength, thermal/electrical conductivity, reflectivity, etc. as described hereinbelow, inter alia, with reference to FIG. 29) are not caused by presence of polar covalent bonds and/or ionic bonds. Compositions that substantially exclude polar covalent bonds and/or ionic bonds may be considered as consisting essentially or entirely of non-polar covalent bonds, at least with respect to the carbon and metal atoms bonded together within the structure.

Moreover, the graphene is preferably "pristine", in that the 2D or 3D structure is substantially devoid of defects such as vacancies, inclusions, contaminants, etc. as would be understood by a person having ordinary skill in the art upon reading the present disclosure.

The metal lattice may include one or more metals, such as aluminum, copper, iron, nickel, titanium, tantalum, tungsten, chromium, molybdenum, cobalt, manganese, niobium, and combinations thereof. Where combinations are included, the metals are preferably in the form of an alloy, such as an Inconel alloy, preferably an Inconel formed from nickel, chromium, aluminum, copper, iron, titanium, tantalum, molybdenum, cobalt, manganese, and/or niobium, and most preferably the Inconel superalloy is Inconel 600, Inconel 617, Inconel 625, Inconel 690, Inconel 718, Inconel X-750, or a combination thereof. In some cases, combinations include tin and/or tungsten, and/or silver, and/or antimony, either singularly or in combination. In some embodiments one or more of the foregoing metals may be used singly or in combination as surfactants to improve wettability of the metal-carbon combination.

Powdered materials as described herein are preferably formed using a non-equilibrium plasma, such as may be generated using a microwave plasma-based reactor as described herein. Presently disclosed microwave plasma-based reactor processes provide a reaction and processing environment in which gas-solid reactions can be controlled under non-equilibrium conditions (referring to physical systems that are not in thermodynamic equilibrium but can be described in terms of variables that represent an extrapolation of the variables used to specify the system in thermodynamic equilibrium; non-equilibrium thermodynamics is concerned with transport processes and with the rates of chemical reactions, and the incipient melting of metal powders that can be independently controlled by ionization potentials and momentum along with thermal energy).

After nucleation in-situ (referring to in-place within the reactor or reaction chamber), exiting solid, substantially solid, or semi-solid carbon-based particles from the plasma torch can be deposited in an additive, layer-by-layer fashion onto a temperature-controlled substrate (such as a drum). The exiting particles can be sprayed onto and bonded onto or into a specific substrate. In some instances, a substrate is not used, rather, groupings of exiting semi-solid particles form one or more directionally organized, free-standing, self-supported structures. Unlike a standard plasma torch where operational flows, power and configuration are limited, presently disclosed microwave plasma torch includes control mechanisms (such as flow control, power control, temperature control, etc.) to independently control one or more constituent material temperatures and gas-solid reaction chemistries to create unique, ornate, highly-organized, covalently-bound carbon-metal structures having a favorably surprising and extremely high degree of homogeneity.

To elucidate, the largest discernable feature size, e.g., a defined by a length measured along a longitudinal axis of the "feature" in question, of a homogeneously-dispersed metal-carbon combination, according to various implementations, is in a range from about 0.01 nanometers (nm) to one micrometer (μm), preferably in a range from about 0.01 nm to about one μm, more preferably in a range from about 0.01 nm to about 750 nm, even more preferably in a range from about 0.01 nm to about 500 nm, still more preferably in a range from about 0.01 nm to about 100 nm, in a range, still yet more preferably in a range from about 0.01 nm to about 50 nm, and most preferably in a range from about 0.01 nm to about 10 nm feature size. This is in contrast with non-homogenous dispersions, which are characterized by relatively large feature sizes on the order of several (e.g., 3-5) micrometers or more.

The composition of matter may also include a plurality of "aggregates" and/or a plurality of "agglomerates", where each aggregate includes a multitude of particles joined together, and each agglomerate includes a multitude of aggregates joined together. In some implementations, each of the particles may have a principal dimension in between 20 nm and 150 nm. Each of the aggregates may have a principal dimension in between 40 nm and 10 μm. Each of the agglomerates may have a principal dimension in between 0.1 μm and 1,000 μm.

Covetic materials produced by the presently disclosed MW reactor-based techniques yield various competitive advantages otherwise not available in current materials or products. One such advantage relates to an inherent scalability and versatility to formulate unique, physically and chemically stable, versatile metal-carbon composites exhibiting predictable deformation (referring to stress, strain, elasticity, or some other ascertainable physical characteristic) in a variety of configurations and/or architectures such as (but not limited to): (1) dense thin film implantations, (2) coatings, (3) thick strips, and (4) powdered particles that can be subjected to subsequent re-melting and casting and/or for use in forming engineered metal alloy components. Any of the foregoing dense thin film MW-reactor produced carbon-based metal composite implantations and/or coatings, and/or strips, and/or powdered particles all exhibit enhanced physical, chemical, and electrical properties as compared with existing parent metal alloy formulations.

Materials produced using powders as described hereinabove (and/or pellets formed from such powders) share many of the same advantageous physical characteristics and properties of the powder itself, with the exception that the macroscale material may not exhibit the presence of carbon in coherent planar layer(s) disposed along the basal plane of the metal lattice. Instead, macroscale materials (e.g., produced by a microwave plasma spray torch, or other suitable technique described herein (and equivalents thereof that would be appreciated by a skilled artisan upon reading such descriptions)) are characterized by heretofore unachievable carbon loading (e.g., from 1.5 wt % to 90 wt %, and any amount therebetween), uniform/heterogeneous dispersion of carbon throughout the metal matrix, and absence of carbon aggregates and/or agglomerates at lattice surface(s) (e.g., grain boundaries). Other than this distinction, the final products produced using powdered materials, preferably powdered covetic materials, may exhibit any one or more physical characteristics and/or properties of the powdered precursor, in any combination, without departing from the scope of the presently described inventive concepts.

GENERAL EMBODIMENTS

According to one general aspect, a composition of matter includes one or more particles, wherein each particle independently comprises a metal lattice having one or more coherent, planar layers of graphene disposed in the metal lattice.

According to another general aspect, a composition of matter includes an Inconel alloy having carbon disposed in a metal lattice of the Inconel alloy.

According to yet another general aspect, a composition of matter includes a metal lattice having at least about 15 wt % carbon disposed in the metal lattice.

Moreover, in various implementations, the foregoing aspects may include any of the following physical and/or structural characteristics, and associated properties. Moreover, these characteristics and/or properties may, according to different embodiments, be included in different combinations or permutations, without limitation.

In one aspect, a composition of matter includes one or more particles, and each particle independently comprises a metal lattice having one or more coherent, planar layers of graphene disposed therein. Preferably, at least some carbon atoms of the one or more coherent, planar layers of graphene are disposed in interstitial sites within the metal lattice. More preferably, the one or more coherent, planar layers of graphene are interlaced interstitially between basal planes of the metal lattice. The graphene may be present as a single layer (e.g., "single layer graphene" or "SLG"), or as multiple layers (e.g., two layers, three layers, five layers, ten layers, or any number of layers up to fifteen, also referred to herein as "few layer graphene" or "FLG"). At least some carbon atoms of the one or more layers of graphene are covalently bonded to metal atoms of the metal lattice, and the covalent bonds between carbon atoms and the metal atoms are, or include non-polar covalent bonds. In some embodiments, the covalent bonds may consist essentially, or entirely, of non-polar covalent bonds. Similarly, carbon atoms of the one or more layers of graphene may be covalently bonded to other carbon atoms of the one or more layers of graphene, and these covalent bonds may comprise, consist essentially, or consist entirely, of non-polar covalent bonds, according to different implementations. Accordingly, the one or more particles may substantially, or entirely, exclude polar covalent bonds. In like manner, the metal lattice of each particle may substantially, or entirely, exclude ionic bonds. The one or more layers of graphene are each preferably substantially devoid of defects, such that the graphene is "pristine". Preferably, each particle is also characterized by a substantial, or more preferably complete, lack of carbon aggregate(s) and/or agglomerate(s) at grain boundaries and/ or at surface(s) of the metal lattice. Owing to the inventive processing techniques described herein, total carbon loading of the particle(s) may range from about 15 wt % to about 90 wt %, with various intermediate loadings also being demonstrated (e.g., about 20 wt %, about 25 wt %, about 33 wt %, about 40 wt %, about 50 wt %, about 60 wt %, about 75 wt %, or up to 90 wt %, in various implementations). Moreover, the particles may be characterized by a diameter in a range from about 20 nm to about 3.5 µm, and/or by having a largest discernable feature size is in a range from about 0.1 nm to about 1 µm. In some implementations, the particles may be pressed into a pellet.

According to another aspect, a composition of matter includes an Inconel alloy having carbon disposed in a metal lattice thereof. Preferably, at least some of the carbon is disposed at interstitial sites of the metal lattice, and more preferably, the carbon is substantially homogenously distributed throughout the metal lattice. Moreover, grain boundaries of the composition of matter, and/or surfaces of the metal lattice, are substantially devoid of carbon aggregate(s) and/or agglomerate(s), in some implementations. Accordingly, a largest discernable feature size of the composition of matter may be in a range from about 0.1 nm to about 1 µm. At least some carbon atoms are covalently bonded to metal atoms of the metal lattice, and the covalent bonds between carbon atoms and the metal atoms are, or include non-polar covalent bonds. In some embodiments, the covalent bonds may consist essentially, or entirely, of non-polar covalent bonds. Similarly, carbon atoms may be covalently bonded to other carbon atoms, and these covalent bonds may comprise, consist essentially, or consist entirely, of non-polar covalent bonds, according to different implementations. Accordingly, the one or more composition of matter may substantially, or entirely, exclude polar covalent bonds. In like manner, the metal lattice may substantially, or entirely, exclude ionic bonds.

Pursuant to yet another aspect, a composition of matter includes a metal lattice having at least about 15 wt % carbon disposed therein. Preferably, at least some of the carbon is disposed at interstitial sites of the metal lattice, and more preferably, the carbon is substantially homogenously distributed throughout the metal lattice. Moreover, grain boundaries of the composition of matter, and/or surfaces of the metal lattice, are substantially devoid of carbon aggregate(s) and/or agglomerate(s), in some implementations. Accordingly, a largest discernable feature size of the composition of matter may be in a range from about 0.1 nm to about 1 µm. At least some carbon atoms are covalently bonded to metal atoms of the metal lattice, and the covalent bonds between carbon atoms and the metal atoms are, or include non-polar covalent bonds. In some embodiments, the covalent bonds may consist essentially, or entirely, of non-polar covalent bonds. Similarly, carbon atoms may be covalently bonded to other carbon atoms, and these covalent bonds may comprise, consist essentially, or consist entirely, of non-polar covalent bonds, according to different implementations. Accordingly, the one or more composition of matter may substantially, or entirely, exclude polar covalent bonds. In like manner, the metal lattice may substantially, or entirely, exclude ionic bonds.

In various implementations of the foregoing aspects, the metal lattice may include one or more metals selected from the group consisting of: aluminum, copper, iron, nickel, titanium, tantalum, tungsten, chromium, molybdenum, cobalt, manganese, niobium, and combinations thereof. Accordingly, the metal lattice may be characterized by a crystalline structure such as face centered cubic (FCC), body-centered cubic (BCC), or hexagonal close packed (HCC). Furthermore, the metal lattice may comprise anywhere from about 15 wt % to about 90 wt % carbon (e.g., about 20 wt %, about 25 wt %, about 33 wt %, about 40 wt %, about 50 wt %, about 60 wt %, about 75 wt %, or up to 90 wt %, in various implementations). The carbon is preferably present at interstitial sites of the metal lattice. The metal(s) may be present in the form of alloy(s), in some approaches. For instance, in particularly preferred approaches, the metals are present in the form of one or more Inconel alloys, such as Inconel 600, Inconel 617, Inconel 625, Inconel 690, Inconel 718 and/or Inconel X-750. Even more preferably, the Inconel alloy(s) are superalloy(s).

OVERVIEW

The disclosure herein describes integration of a low dose nanofiller carbon-based material such as graphene, known for its inherent structural characteristics such as a high aspect ratio and "2D" planar geometry, with metals. Graphene possesses astonishing favorable mechanical, physical, thermal, and electrical properties due to its in-plane $sp^2$ C=C bonding (resulting in 2D planar geometry). Therefore, graphene would serve as an ideal reinforcement for metal matrix composites as compared with alternatives such as micro-filler polyacrylonitrile (PAN)-based carbon fiber. It should be noted that even at low graphene nanoplatelet content (loadings), a 3D network is formed with an anisotropic (referring to an object or substance having a physical property that has a different value when measured in different directions), that result in marked improvements to thermal and electrical conductivities as well as mechanical features.

A challenge encountered in using carbon nanofillers in metal matrix composites includes difficulty with dispersion due to poor wetting (referring to the ability of a liquid to maintain contact with a solid surface, resulting from intermolecular interactions when the two are brought together; the degree of wetting, referred to as wettability, is determined by a force balance between adhesive and cohesive forces). The increased surface area presented by nanofillers causes particles to form into clusters and twists due to Van der Waals forces between carbon atoms. Clustering of nanofillers in metal matrix composites can lead to formation of undesirable cracks and pores that may ultimately compromise structural integrity of the resultant material yielding premature failure under high load or performance conditions.

Although a number of processing approaches, such as conventional powder metallurgy, hot rolling, casting, and additive manufacturing have been (and may currently also be) used to produce metal matrix composites, there are still challenges with uniformly dispersing nanofillers. Damage to nanofiller from applied stress during consolidation, and undesirable or uncontrollable chemical reactions with the matrix at elevated temperatures during sintering and casting, are some examples of challenges faced during attempts to achieve nanofiller dispersion.

Defect free, the basal plane of graphene exhibits exceptional favorable chemical stability compared to sides and ends of a graphene sheet, which may be more prone to interact with metals to form carbides (thermodynamically favored as per the Gibbs free energy). During processing, however, defects can readily form in the basal plane, leading to carbide formation and adverse effects to composite properties. Hence, relatively severe processing conditions such as high temperatures and pressures, can adversely affect the quality of the interface between carbon nanofillers and their surrounding metal-based matrix. Specifically, high temperatures and pressures can adversely affect wetting ability, structural integrity, may unwantedly influence carbide formation, and may otherwise cause other deleterious interface reactions.

An alternative process, referred to as covetics (as introduced earlier), has been successfully used to incorporate carbon nanofillers into metal matrices. In covetic related processes, a network of graphene 'ribbons' and nanoparticles have been shown to form within a liquid metal by using an applied electric field that exhibits exceptional stability within the metal matrix, even after re-melting. Correspondingly, the composite structure conducts heat and electricity more efficiently than the parent metal.

Uniform Dispersion

Since one of the challenges to incorporating graphene into a metal matrix is achieving uniform dispersion, covetics processing overcomes this problem through the concomitant exfoliation and wetting of the graphene ribbons and/or particles within an applied electric field (either from the carbon electrodes or from the breakdown of carbon additives). Impurities, such as oxygen and hydrogen, can be managed via redox reactions at the particle surface, assuming a properly induced voltage at the surface, to promote wetting/dispersion. A challenge is one of controlling the structural integrity and uniformity of the graphene ribbons and/or particles (such as uniformity with respect to size, defects, etc.), as well as controlling chemical reactivity with the metal at elevated temperatures, and as well as controlling distribution of particles in the bulk as well as at the surface of the melt.

Additional Complexities

Although fundamental modes of energy conduction in metals (both thermal and electrical) can be (at least in part) carried out by electrons and is controlled by the degree of crystallinity and impurities for a filler such as graphene to enhance thermal conductivity in the metal matrix composite (where conduction is via phonons in graphene), there either needs to be some degree of registry and/or coherency (such as an integrally bound nanoscale carbon) with the metal lattice (additionally or alternatively referred to as a scaffold, matrix, or structure) or a minimum platelet spacing (such as proximity or network) threshold for conduction between platelets (such as the graphene would need to be a single layer or just a few layers and 10's of nanometers in length). With respect to strengthening the metal matrix, however, graphene may need to be chemically (or in some instances, also physically) bonded to the matrix for proper load transfer (noting that the length of graphene can be greater than ~0.5 m for maximum load transfer). Aside from solid solution strengthening, which relies on coherent and/or semi-coherent elastic strains between carbon (graphene) nanofiller and metal lattice, a discrete graphene nanoparticle can serve as a barrier to dislocation pile-up or pinning (such as Hall Petch grain refinement, referring to a method of strengthening materials by changing their average crystallite (grain) size; it is based on the observation that grain boundaries are insurmountable borders for dislocations and that the number of dislocations within a grain have an effect on how stress builds up in the adjacent grain, which will eventually activate dislocation sources and thus enabling deformation in the neighboring grain, too; so, by changing grain size one can influence the number of dislocations piled up at the grain boundary and yield strength) at grain boundaries, both of which improve mechanical properties.

Again, because of its 2D nature and high surface area, graphene can orient along regions at grain boundaries in addition to aligning along slip planes within the metal structure. Irrespective of whether the property of interest is chemical, mechanical, thermal, or electrical, the greater the alignment and registry of the nanofiller to the crystal structure of the surrounding metal matrix (at the atomic level), the greater the enhancement as well as stability of the property in a metal matrix composite structure.

Figure 10:
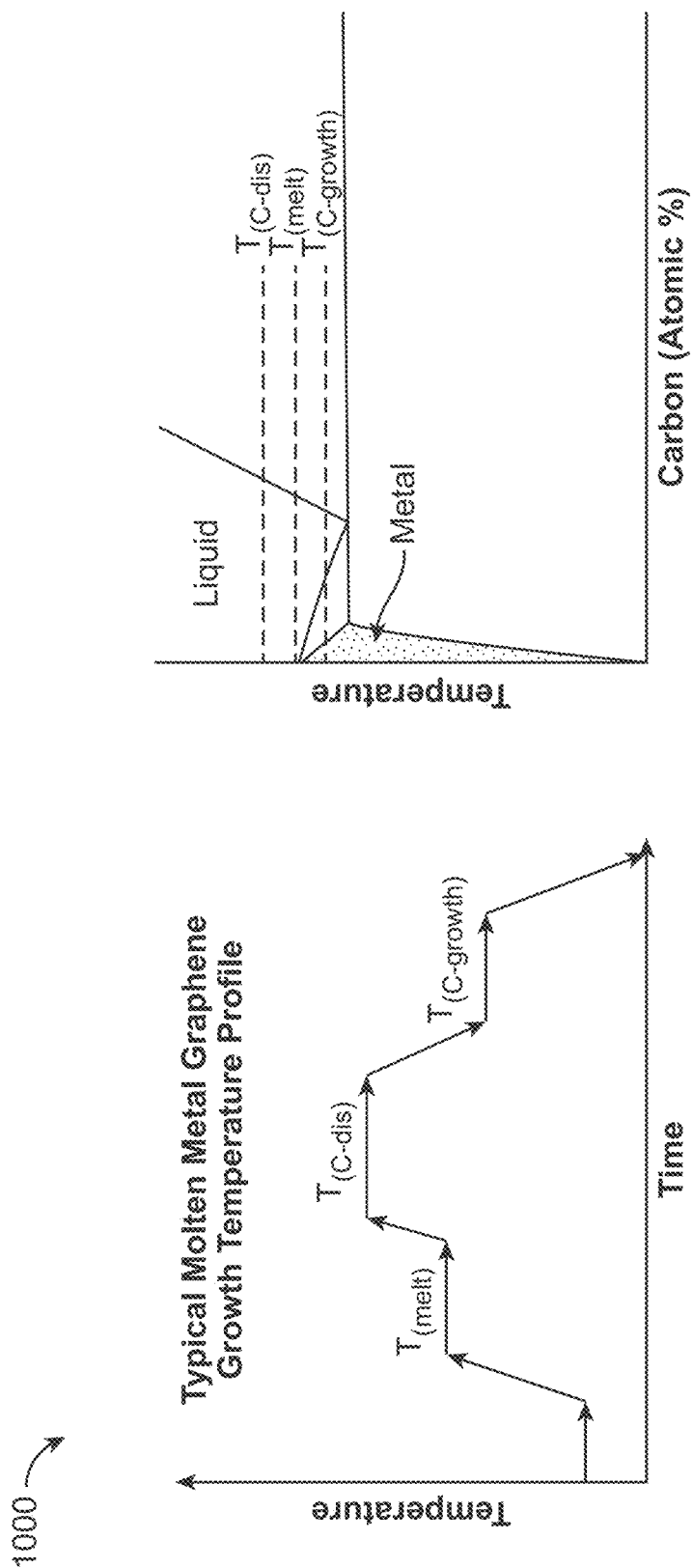
FIG. 10 shows a chart depicting a graphene growth temperature profile and a binary phase diagram, in accordance with one or more of the disclosed implementations.

Fundamentally, growth of carbon at a metal surface (heterogeneous) or precipitation out of solution in the melt (homogeneous) is dependent on the solubility of carbon in the metal (as per the binary phase diagram shown on the right side of FIG. 10). The solubility of carbon in pure transition metals (and many pure metals, generally) is very low, such as near the melting point of the metal, although increases as the temperature increases to well above the melting point of the metal (such as up to 2,000° C. and above). The solubility of carbon in nickel, for example, near the hypereutectic point of around 2.5% is one of the higher solubilities of carbon in a pure metal. Note that the addition of interstitial impurities such as oxygen, boron, or nitrogen, or substitutional atoms to a metal, can affect (such as potentially increase) the solubility of carbon. It has been shown that the higher the solubility of carbon in a metal, or the higher the temperature of the molten metal, the thicker the carbon that precipitates at the surface of the metal as the metal is cooled down and solidified. Important to note is that solubility of carbon is higher near a free surface, which, in combination with the interfacial energy of the liquid-air interface, favors precipitation of solid carbon at the metal melt-air interface. Equipment and techniques for operating the equipment to overcome the problems attendant to this phenomenon are addressed as pertains to the figures and corresponding discussions.

Definitions and Use of Figures

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Various implementations are described herein with reference to the figures. It should be noted that the figures are not necessarily drawn to scale, and that elements of similar structures or functions are sometimes represented by like reference characters throughout the figures. It should also be noted that the figures are only intended to facilitate the description of the disclosed implementations—they are not representative of an exhaustive treatment of all possible implementations, and they are not intended to impute any limitation as to the scope of the claims. In addition, an illustrated implementation need not portray all aspects or advantages of usage in any particular environment.

An aspect or an advantage described in conjunction with a particular implementation is not necessarily limited to that implementation and can be practiced in any other implementations even if not so illustrated. References throughout this specification to "some implementations" or "other implementations" refer to a particular feature, structure, material, or characteristic described in connection with the implementations as being included in at least one implementation. Thus, the appearance of the phrases "in some implementations" or "in other implementations" in various places throughout this specification are not necessarily referring to the same implementation or implementations. The disclosed implementations are not intended to be limiting of the claims.

DESCRIPTIONS OF EXAMPLE IMPLEMENTATIONS

FIG. 1A is a comparison chart 1A00 showing two different covetic material formation techniques 102 and example materials that result from the application of each, respectively.

In the case of conventional metal melt methods 103 to produce covetic materials, solid carbon is added to a metal melt. This conventional metal melt technique is governed by the kinetics of carbide formation and interdiffusion across a solid-liquid (such as carbon-metal) interface under an applied current, which provides additional energy to overcome stacking fault energy between carbon atoms and metal atoms. As such, conventional metal melt techniques for forming covetic processing do not significantly differ from other composite processing methods, such as powder metallurgy and/or hot rolling, which composite processes involve consolidation of a second phase particle into a metal matrix. These conventional composite processing methods face many challenges with dispersion and/or distribution, reactivity, and variability in material properties. Furthermore, conventional covetic processing relies on batch processing, and often yields inconsistent conversion yields as well as wide variations in resultant properties.

As depicted by image 105, when using conventional metal melt methods 103, the resultant material includes substantial carbon aggregates and/or agglomerates, particularly at grain boundaries and/or surfaces of the metal lattice. This, in turn: (1) limits the role of carbon to reinforce the lattice; and (2) limits the tunability of the surface morphology for surface functionalization. For comparison, when using presently disclosed techniques, the resultant material exhibits nearly uniform homogeneity (such as having no, or substantially no aggregates and/or agglomerates, particularly at grain boundaries and/or lattice surfaces), which homogeneity results from uniform dispersion of carbon into the lattice. This is shown in homogeneity image 106.

Covetic materials such as are depicted in homogeneity image 106 can be characterized by many desirable material properties 108 such as uniformity, high carbon loading, low carbon content at surfaces, etc. These are highly desirable material properties that are not exhibited by materials formed using conventional metal melt methods 103. Therefore, what is sought after are improved approaches that overcome shortcomings of the conventional metal melt methods 103.

One such improved approach involves plasma spray torch methods 104. Application of plasma spray torch methods result in a consistent yield of covetic materials, thus overcoming the yield shortcomings of conventional metal melt methods. Furthermore, application of plasma spray torch methods results in covetic materials that possess the aforementioned improved mechanical, improved thermal, and improved electrical properties, thus overcoming resultant material shortcomings of conventional metal melt methods.

Improved Approaches

As shown, the plasma spray torch methods 104 can be configured to use input materials as introduced (referring to provision of a carbon-containing feedstock species in gaseous form, such as methane, and energizing it via application of MW energy directed through the methane gas, etc.). However, by dissociating carbon-containing gas (such as methane or other hydrocarbon sources) at elevated temperatures, a self-limited monolayer of carbon—and in particular, pristine graphene—can be grown onto and/or into a metal (such as copper, gold, zinc, tin, and lead) lattice. The number of monolayers is dependent at least in part on the solubility of carbon in the metal. Growth kinetics, binding, and the final structure of graphene films onto a metal substrate is dependent on the valence electrons and the symmetry (close packed planes) of the metal. Similarly, metals can be grown on carbon, preferentially nucleating and growing at defect sites of the carbon or at selective oxygen- or hydrogen-terminated sites as well. Alternating stacks of single layer carbon and metal can then be fabricated to realize the enhanced properties of a graphene-reinforced metal composite structure.

Using a microwave plasma reactor, pristine 3D few-layer graphene particles can be continuously nucleated and grown from a hydrocarbon gas source. In addition, selective elements can be incorporated into the 3D graphene particle scaffold by adding them to the plasma gas stream. The microwave plasma reactor process provides a unique reaction environment in which gas-solid reactions can be controlled under non-equilibrium conditions (such as chemical reactions can be independently controlled by ionization potentials and momentum along with thermal energy). Reactants can be inserted as solids, liquids, or gases into a plasma reactor zone to independently control nucleation and growth kinetics of unique non-equilibrium structures (such as graphene on metal and metal on graphene).

For example, to create integrated graphene-metal composites at the nanometer scale, fine nanometer-scale metal particles can be introduced into a microwave plasma torch along with a hydrocarbon gas such as methane. Methane dissociates into hydrogen and carbon (such as using the ideal energy of the microwave plasma to form C and $H_2$) which can then nucleate and grow ordered graphene onto the semi-molten surface of the metal particle. Non-equilibrium energy conditions can be created by tuning process conditions to independently control the temperature of the metal with respect to carbon reactivity and delivery to the metal surface. Ionized hydrogen (or other ions) at controlled low energies can be used to impinge/sputter the surface of the growing graphene-metal surface without damaging the structure of the graphene-metal composition. This then promotes further growth of alternating graphene-metal layers. In addition, depending on residence time and the energetics within the plasma reaction zone, metal-graphene structures can be created with specific properties that are retained when the metal-graphene structures are rapidly cooled upon being sprayed onto a substrate at a controlled temperature. The formation of the metal-graphene structures at controlled energies within the plasma as well as control of the temperature of the substrate provides independent control of energetic conditions throughout the entire evolution of these covetic materials.

Graphene can be applied (and/or deposited) onto metal or metal-containing layers of material via "sputtering" (referring to a phenomenon in which microscopic particles of a solid material are ejected from its surface, after the material is itself bombarded by energetic particles of a plasma or gas; the fact that sputtering can be made to act on extremely fine layers of material is often exploited in science and industry—there, it is used to perform precise etching, carry out analytical techniques, and deposit thin film layers in the manufacture of optical coatings, semiconductor devices and nanotechnology products, etc.). Such sputtering, as so described, can be controlled by controlling residence times and energetics within the plasma reaction zone to promote growth of alternating graphene-metal layers when employed with the presently discussed MW plasma reactors. These alternating graphene-metal layers are organized in coherent planes of atoms that are in a regular (such as crystallographic) configuration. This crystallographic configuration is retained when the graphene-metal layers are quick-quenched (in the materials science field, quenching, or quick/rapid quenching, refers to the controlled rapid cooling of a workpiece in water, oil or air to obtain certain material properties; a type of heat treating, quenching prevents or controls undesired low-temperature processes, such as phase transformations, from occurring by reducing the window of time during which these undesired reactions are both thermodynamically favorable and kinetically accessible; for instance, quenching can reduce the crystal grain size of both metallic and plastic materials, increasing their hardness) onto a cooler substrate. Quick quenching, as so described, serves to essentially 'freeze' (referring to retention in a substantially solid state rather than solely on the traditional definition of change in phase from a liquid to a solid) graphene to metal in a desired crystallographic configuration formed within the plasma reactor. The homogeneity within and at the surface of the resultant material is extremely uniform. This extremely uniform homogeneity can be used to distinguish from materials that had been formed using metal melt methods 104. This is because the metal melt methods 104 cannot control ion energies independently from thermal energies. More specifically, because the metal melt methods 104 cannot achieve the desired higher ion energies independently from thermal energies, temperatures in the metal melt reaction chamber can be too high for graphene-metal layers to become organized in coherent planes of atoms that are in the desired crystallographic configuration.

Therefore, when using metal melt methods 104, the desired crystallographic configuration of the graphene-metal never occurs, and thus desired crystallographic configuration cannot be retained when the graphene-metal layers are quenched onto a cooler substrate. Instead, when using metal melt methods 104, undesired carbon precipitation occurs (such as carbon precipitates out of the melt), which in turn leads to unwanted formation of aggregates and/or agglomerates, which in turn leads to non-uniformity in the resultant composition. This non-uniformity in the resultant composition can lead to less-than-ideal chemical and/or physical (mechanical) characteristics in the resultant composition, including but not limited to premature mechanical failure.

Figure 1B:
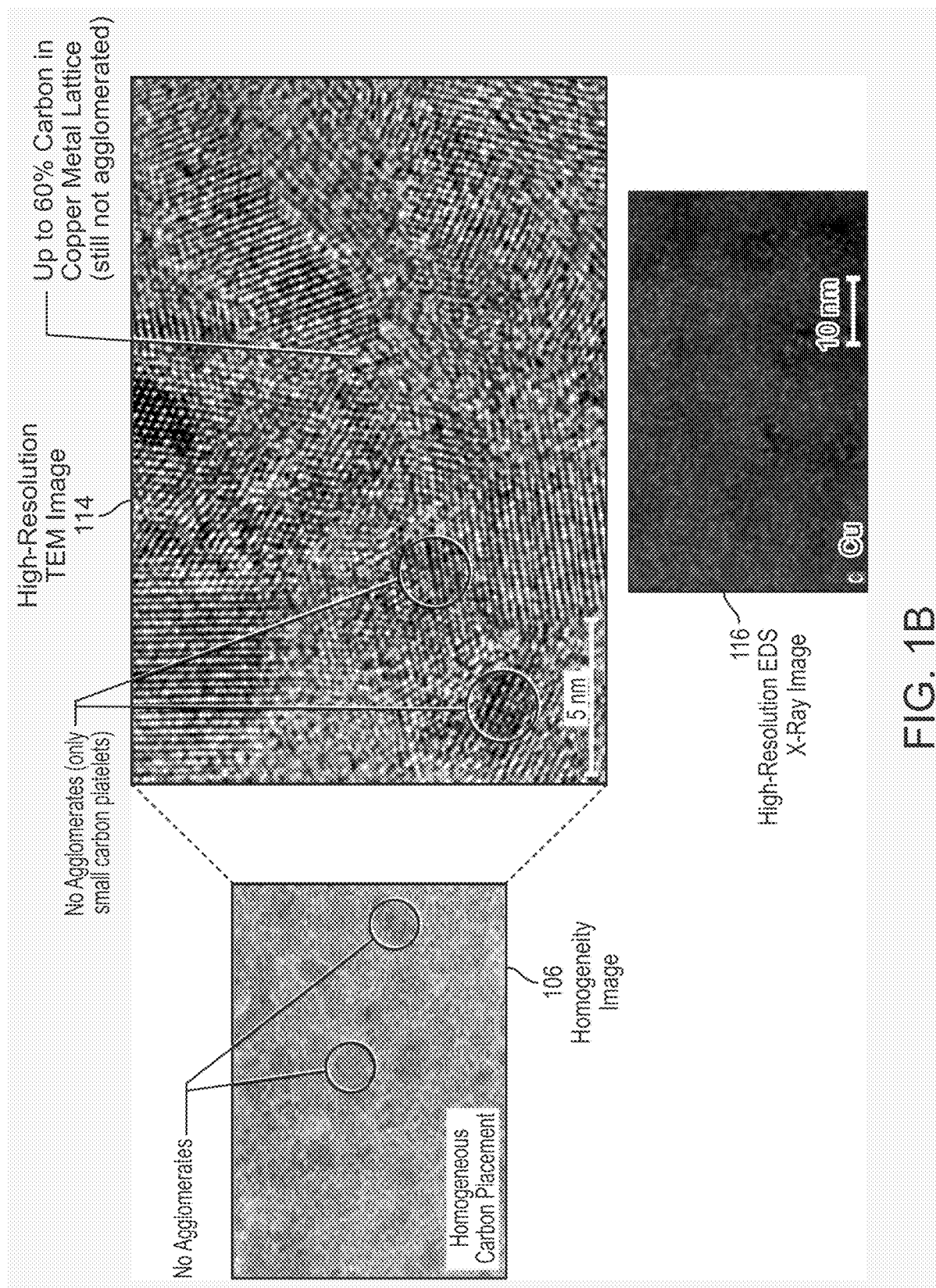
FIG. 1B presents a high-resolution transmission electron microscopy image and a high-resolution energy dispersive spectroscopy x-ray image of materials (e.g., covetic materials) produced according to the inventive techniques described herein, according to some implementations.

FIG. 1B presents a high-resolution transmission electron microscopy image 114 and a high-resolution energy dispersive spectroscopy x-ray image 116. Also shown here for convenience is the homogeneity image 106 of FIG. 1A.

As depicted by this example set of images, the carbon is distributed uniformly throughout the metal lattice. This is emphasized in the high-resolution transmission electron microscopy image 114. Moreover, the extremely high carbon loading in the metal lattice is clearly shown by the high-resolution energy dispersive spectroscopy x-ray image 116. In this example, the carbon loading forms approximately 60% of the overall copper-carbon lattice. This is shown in the high-resolution energy dispersive spectroscopy x-ray image 116. In this particular image, the darker areas are carbon, and the lighter areas (appearing as dots) are copper.

As can be seen the images, and in particular, as can be seen from the pattern of the high-resolution energy dispersive spectroscopy x-ray image 116, the carbon and the parent metal (such as in this case copper), are uniformly dispersed. This uniform lattice-level dispersion is present at the surface, as shown, moreover, this uniform lattice-level dispersion is also present deep into the parent metal. Additional images of covetic materials are given in FIG. 20A1, FIG. 20A2 and FIG. 20B, which figures follow after discussion of (1) materials evolution processes, (2) a plasma spray torch apparatus and (3) various configurations of plasma spray torches.

In one use scenario, the covetic materials of FIG. 1B can be manufactured using a tunable microwave plasma torch that produces integrated graphene-metal composite films at high rates and volumes. One particular manufacturing process during which graphene is grown onto small molten metal particles is now briefly discussed.

Figure 2:
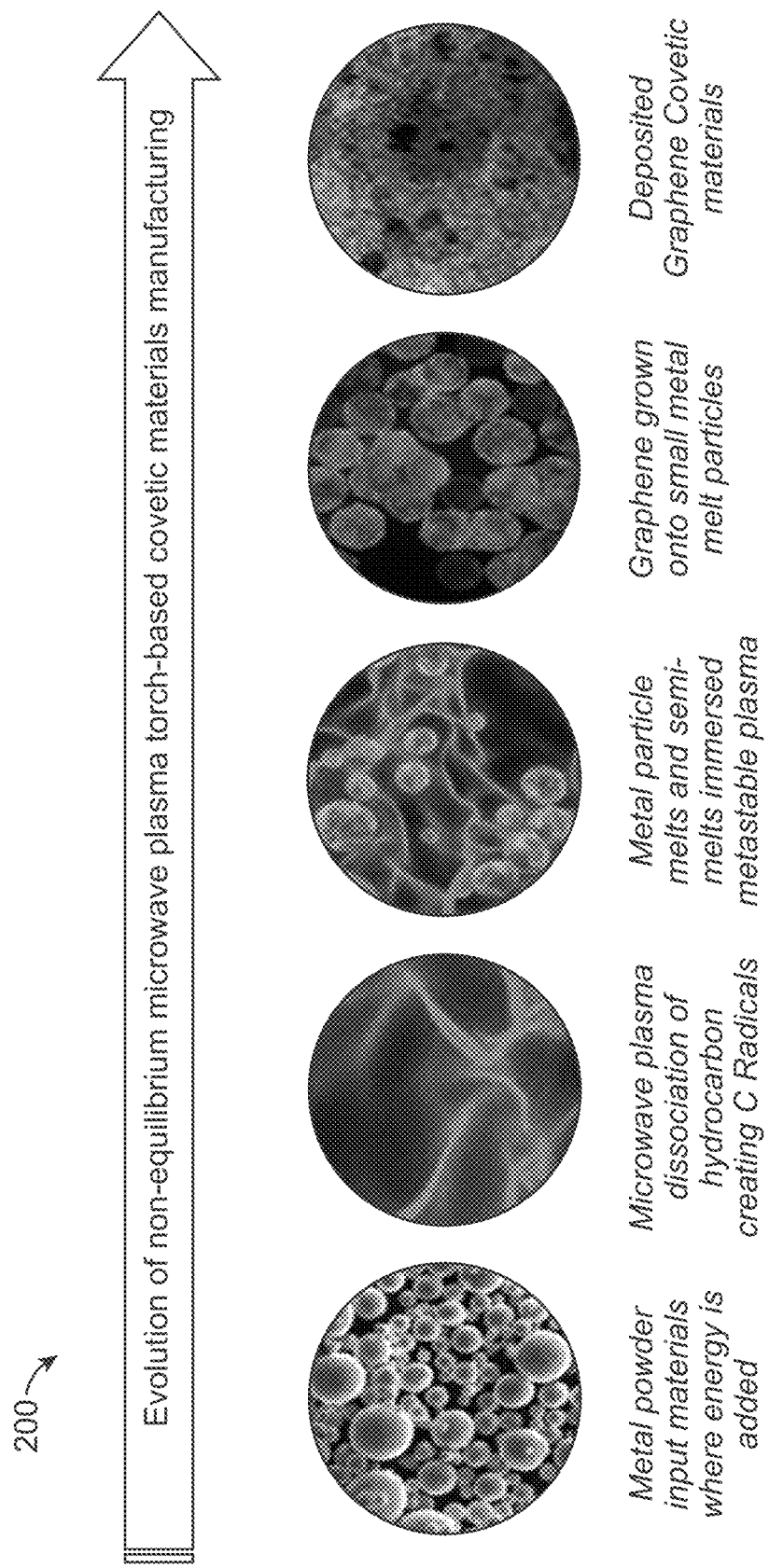
FIG. 2 depicts a manufacturing process for growing graphene onto small molten particles, in accordance with one or more of the disclosed implementations.

FIG. 2 depicts a manufacturing process 200 for growing graphene onto small molten particles. As an option, one or more variations of manufacturing process 200 or any aspect thereof may be implemented in the context of the architecture and functionality of the implementations described herein. The manufacturing process 200 or any aspect thereof may be implemented in any environment.

One possible method is to use a "non-equilibrium energy" microwave plasma torch to provide non-equilibrium control over the temperature of the metal independently from carbon creation. This plasma torch energy is then directed to the molten and/or semi-molten metal particles surfaces. This technique allows time for growth to occur on the melt. Growth on the melt (or semi-melt or core shell materials) created within the torch will flow out through the main plasma plume to the surface of the metal to be grown upon, and then is quickly quenched. This technique provides a means to grow thick films which, upon layering, could be grown into a homogeneous thick ingot and/or grown into or onto component parts to be post machined or remelted into applications.

Additionally, FIG. 2 is being presented to illustrate the effects that independent control of constituent material temperatures and gas-solid reaction chemistries when growing graphene onto small molten particles. FIG. 2 shows the evolution through several processes of covetic materials manufacturing; and presents processes used in the formation of plasma torch-based covetic materials.

As shown, semi-solid particles exiting from the plasma torch can be deposited in an additive, layer-by-layer fashion onto a temperature-controlled substrate. Unlike a standard plasma torch where operational flows, as well as control of power and other configurations are limited, the discussed microwave plasma torch can be operated to independently control constituent material temperatures as well as gas-solid reaction chemistries.

As can be seen from the disclosure above, microwave plasma sources can result in (for example): (1) higher plasma densities; (2) ion energies with a narrower ion energy distribution; and (3) improved coating properties. This is due, at least in part, to the improved power coupling and (electromagnetic energy) absorption at 2.45 GHz. Pressure dependent, typical electron temperatures are of the order of 1 eV to 15 eV yielding plasma densities of $>10^{11}$ cm$^{-3}$. Such low electron temperatures are also advantageous not only in terms of controlling the plasma chemistry, but also in terms of limiting the ion energy with ion energies for Argon-based coaxial microwave plasmas that typically are in the range of 5 eV to 80 eV. As a consequence of the narrow plasma sheath formed using these high-density plasmas, collisional broadening of the ion energy distribution is prevented, thus resulting in a sharp ion energy distribution that supports fine control of certain film deposition processes. Additionally, through the usage of pulsed power into a microwave plasma, non-equilibrium energies can be formed and controlled. During application of microwave energy, power is delivered throughout a volume where plasma is to be formed, thus energy is accumulated in a stepwise collisional energy regime.

The foregoing discussion of FIG. 2 includes techniques for application of microwave energy power, which technique is disclosed in further detail as follows.

Figure 3:
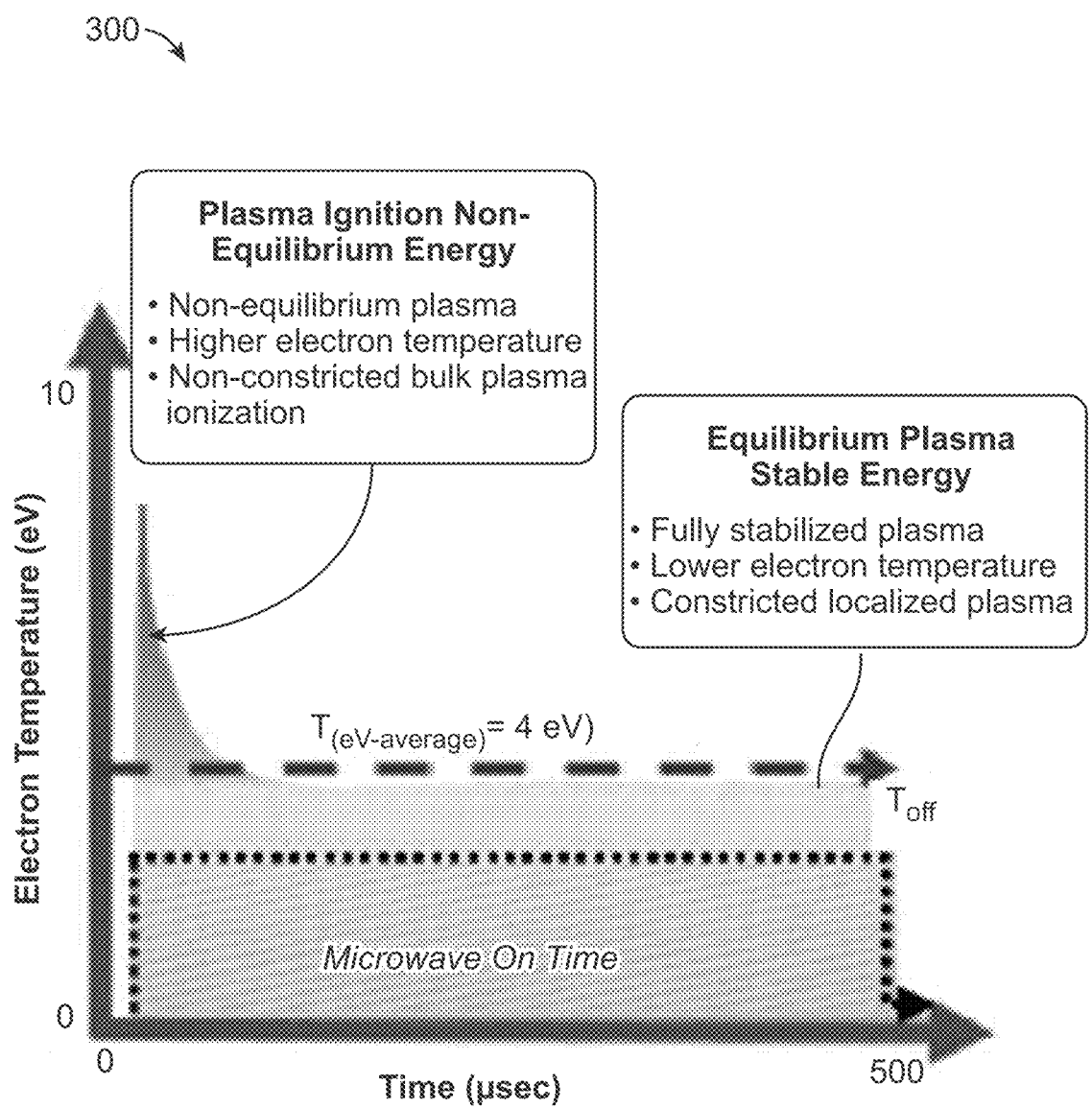
FIG. 3 depicts a plasma energy state chart showing how a pulsed microwave energy source is used for growing graphene onto small molten particles, in accordance with one or more of the disclosed implementations.

FIG. 3 depicts a plasma energy state chart 300 showing how a pulsed microwave energy source is used for growing graphene onto small molten particles.

Microwave plasma sources have the potential to achieve higher plasma densities, ion energies with a narrower ion energy distribution, and improved coating properties as a consequence of improved power coupling and absorption at 2.45 GHz. Pressure-dependent typical electron temperatures are of the order of 1 eV to 15 eV yielding plasma densities of $>10^{11}$ cm$^{-3}$. Such low electron temperatures are also advantageous not only in terms of controlling the plasma chemistry, but also in terms of limiting the ion energy with ion energies for Argon-based coaxial microwave plasmas that typically are in the range of 5 eV to 80 eV. As a consequence of the narrow plasma sheath formed using these high-density plasmas, collisional broadening of the ion energy distribution is prevented resulting in a sharp ion energy distribution, which is necessary for fine control of some film deposition processes. Additionally, through the use of pulsed power being delivered into a microwave reactor, plasma non-equilibrium energies can be formed and controlled. During application of microwave energy, power is delivered thru a volume where plasma is to be formed, thus energy is accumulated in a stepwise collisional energy regime.

Once the initial plasma forms in the vast majority of the volume, the delivery antennae where energy is at a maximum continues to increase in a highly localized fashion. Plasma density nearby decreases slightly until the plasma constricts. Further details regarding general approaches to making and using pulsed microwave energy sources are described in U.S. Pat. No. 10,332,726, issued Jun. 25, 2019, which is hereby incorporated by reference in its entirety.

FIG. 3 shows that the initial energy of the plasma is much higher in the non-equilibrium state until it constricts to a much lower stable temperature. More specifically, the plasma energy state chart depicts a transition from an initial high energy non-equilibrium state to a lower energy stable equilibrium state. Once the initial plasma forms, the delivery antennae, where energy is at a maximum, will continue to increase in a highly localized fashion until the plasma constricts and is lost in the remaining parts of the chamber due to energy shielding.

The pulsed microwave energy source can be controlled so as to optimize electron temperatures for growing graphene onto small molten particles. This is especially effective in the case where pressures are >>20 Torr. To ensure that plasma chemistry dissociation is homogeneous, and that coating of materials is homogeneous as well, the environments of the chamber must be controlled.

As is shown in FIG. 3, the energy profile indicates that the initial energy is high and, after a time, constricts to a lower level where it stays until the power is removed. The plasma extinguishes and, after restarting, follows the energy cycle again. By reducing the time between the initial plasma ignition and where it stabilizes, the plasma remains mainly in the bulk of the system where a more homogeneous dissociation of materials can occur. The reduction of the time between the initial plasma ignition and the time when it stabilizes can be accomplished by controlling the frequency and duty cycle of pulsing.

Figure 4:
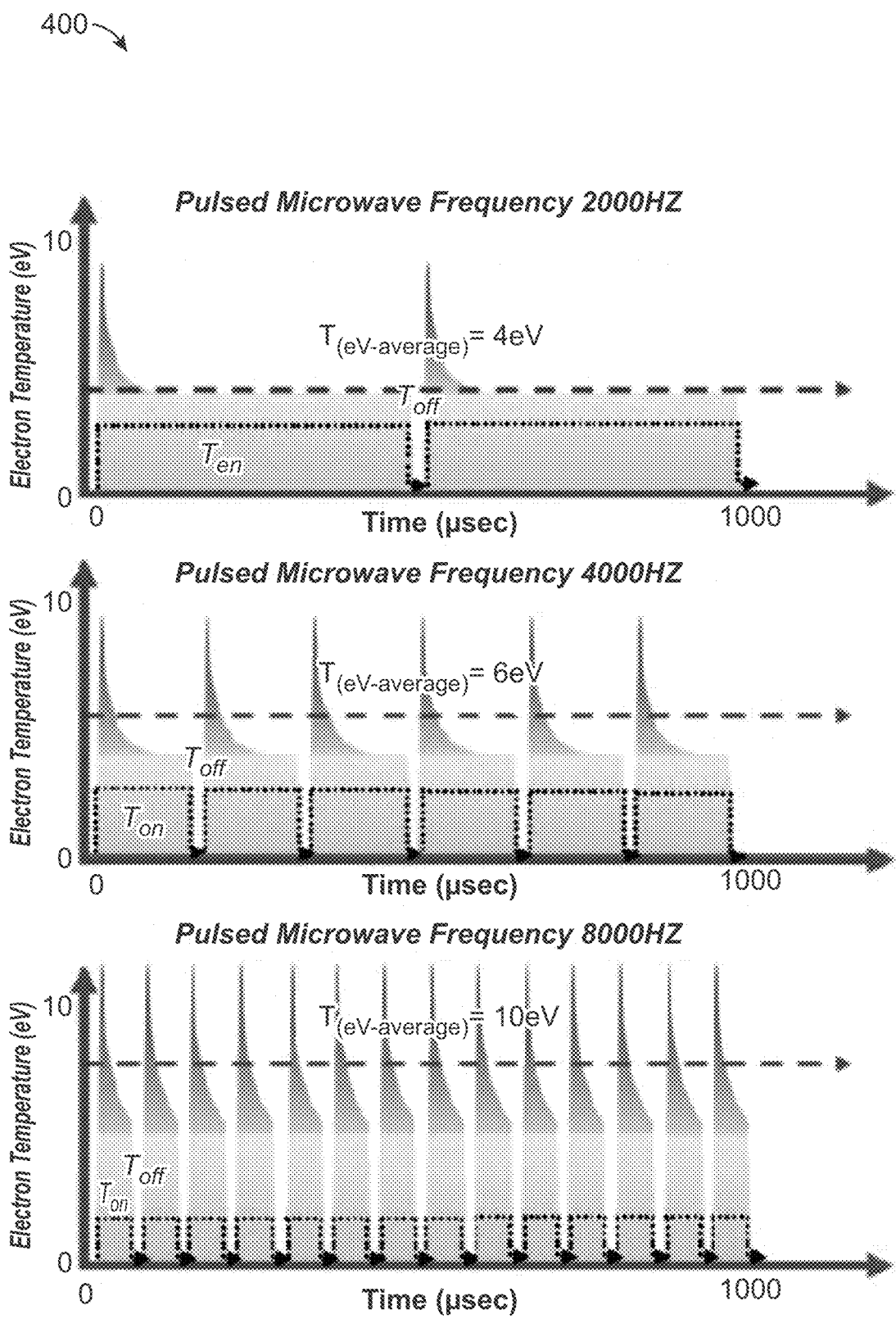
FIG. 4 depicts an electron temperature control technique that is used for growing graphene onto small molten particles, in accordance with one or more of the disclosed implementations.

One technique for controlling electron temperatures in a pulsed microwave reactor is shown and described as pertains to FIG. 4.

FIG. 4 depicts an electron temperature control technique 400 that is used for growing graphene onto small molten particles. As an option, one or more variations of electron temperature control technique 400 or any aspect thereof may be implemented in the context of the architecture and functionality of the implementations described herein. The electron temperature control technique 400 or any aspect thereof may be implemented in any environment.

FIG. 4 illustrates aspects pertaining to growing a few layers of graphene onto molten nanoscale-sized particles rather than mixing carbons into the bulk of a molten slurry. Specifically, the figure is being presented with respect to its contribution to controlling plasma temperature through control of microwave pulsing frequency.

Plasma Temperature Control Via Control of Pulsing Frequency

As depicted in the foregoing FIG. 3, the energy profile indicates that the initial energy is high and, after a time, constricts to a lower level where it stays until the power is removed. The plasma extinguishes and, after restarting, follows the energy cycle again. By reducing the time between the initial plasma ignition and stabilization, the plasma remains mainly in the bulk of the system where a more homogeneous dissociation of materials can occur.

As shown in FIG. 4, the effect depends substantially on the timing of the on/off cycle of the microwave energy source. By controlling the frequency of pulsing, optimal chemical dissociation and uniform coatings can be created. Furthermore, by setting the pulsing frequency, the average temperature of the plasma can be controlled as well.

Plasma Temperature Control in a Microwave Plasma Torch

The herein-discussed integrated microwave plasma torch is used for addressing the formation of integrated, second phase, carbon-metal composite structures with enhanced mechanical, thermal and electrical properties over existing metal alloys and conventional composite processing methods. Furthermore, the microwave plasma torch can be used to form carbon-metal composite coatings and particles directly onto high value asset components. Still further, the aforementioned methods and equipment meet many clean energy goals pertaining to improved electrical distribution and efficient transformer and heat exchanger performance.

Microwave Plasma Torch Practical Applications

Using the integrated microwave plasma torch technology, materials can be economically (such as cost effectively) deposited and/or formed at fast rates and can be applied and in a variety of different configurations. Benefactors of this technology include various energy production industries-especially as pertains to transmission and storage-transportation industries, military equipment industries, as well as many other manufacturing industries. As one specific practical application example, metallic surfaces of an aircraft can be treated by a plasma spray to create covetic material at the metal-air interface. The metallic surfaces thus become impervious to corrosion. Additionally, the carbon atoms near the surface allows for other materials to be chemically bonded to the carbon atoms and/or adhered to the surfaces. The aforementioned other materials that can be chemically bonded to the carbon atoms might be selected on the basis of requirements that arise in various practical applications.

As another specific practical application example, metallic surfaces of an airborne vehicle (such as an airplane, helicopter, drone, projectile, missile, etc.) can be treated by a plasma spray to create a covetic material coating that acts as an infrared obscurant (such as a detection countermeasure).

Figure 5:
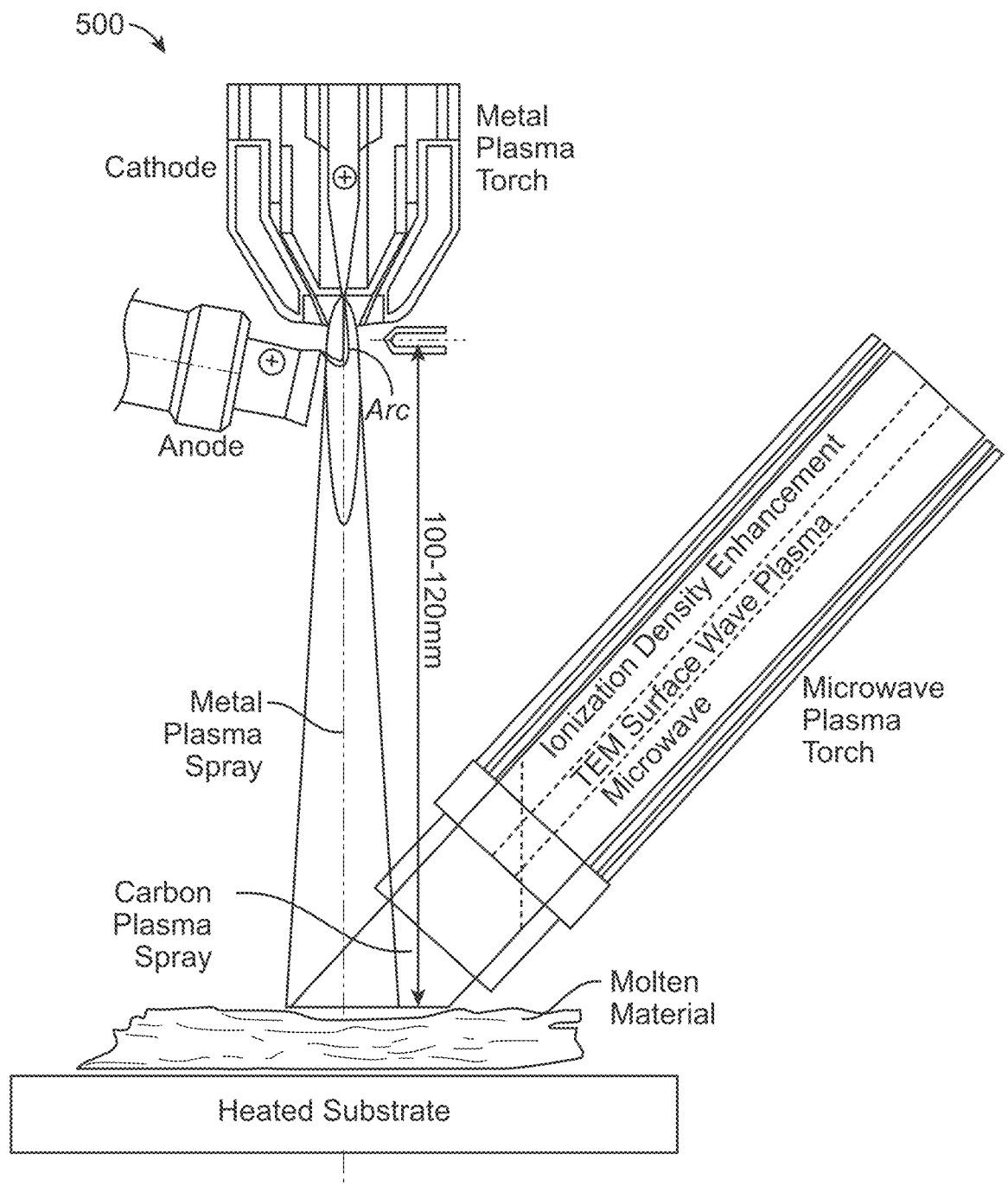
FIG. 5 illustrates a dual plasma torch apparatus that is used for growing graphene onto small molten particles, in accordance with one or more of the disclosed implementations.

FIG. 5 illustrates a dual plasma torch apparatus 500 that is used for growing graphene onto small molten particles. As an option, one or more variations of dual plasma torch apparatus 500 or any aspect thereof may be implemented in the context of the architecture and functionality of the implementations described herein. The dual plasma torch apparatus 500 or any aspect thereof may be implemented in any environment.

The shown equipment setup uses: (1) a metal plasma spray torch to supply molten metals to the surface of the heated substrate (Al, Cu, Ag, etc.), and (2) a microwave plasma torch to deliver ionized carbon and plasma radicals to the molten surface so as to cause the covetics growth onto molten metals.

The system is inserted into an inert gas environment or into an atmospherically controlled chamber to provide better control of materials oxidation. In one implementation, the setup and operation of the torch of FIG. 5 is shown in Table 1, the details of which are discussed infra.

TABLE 1

| Step | Setup & Operation Description |
|---|---|
| 1 | Identify and select reactant materials |
| 2 | Integrate a standard, non-microwave plasma spray torch and a microwave plasma torch into a dual-plasma torch |
| 3 | Define plasma torch processing parameters |
| 4 | Operate the dual plasma torch to produce graphene growth on a semi-molten particle surface |

Step D1: Reactant Material Identification and Selection

Any number of metals can be plasma-sprayed concurrently along with metastable carbon species to form a nano-carbon-metal composite structure. Different metals with high electrical and thermal conductivity can be used when forming 2D graphene at concentrations above the thermodynamic solubility limit. In some cases, two different metals are selected, each having different carbon solubility limits and/or different melting points and/or different densities and/or different crystal structures.

Step D2: Selection, Modification and Validation of Microwave and 'Standard' Plasma Spray Torch(es)

The apparatus of FIG. 5 can be (in certain implementations) substantially composed of a 'standard', off-the-shelf, plasma spray and a microwave plasma torch. Having two torches allows for two different processing steps, namely: (1) incipient melting of the metal, and (2) nucleation/growth of graphene platelets from a hydrocarbon source. Each one of the two torches can be controlled independently from each other.

As shown in FIG. 5, the two torches are collocated for concurrent or sequential operation. Specifically, the microwave plasma with its low electron temperature and high electron density can be used to optimize graphene formation (including nucleation rate at the carbon supersaturation threshold) whereas the standard plasma spray torch can be used to heat metal powder/particles to a molten or semi-molten state and then accelerate the particles (along with nucleated ionized carbon/graphene) towards the substrate. The two independent flow streams can be coordinated so as to accomplish fine-scale graphene growth on a semi-molten particle surface. In some cases, the dual torch configuration comprises a means to maintain an inert atmosphere (such as cover gas) at or near the exit stream of the torches and in and around the impingement region at the surface of the substrate. This arrangement is advantageous to minimize, or preferably prevent, inclusion of atmospheric gases (such as oxygen, nitrogen, water vapor, etc. as would be understood by a person having ordinary skill in the art) in the composition of matter, which can negatively affect bonding between the carbon and metal atoms. Therefore, in certain implementations, the dual torch system is configured to be inserted into a fully controlled inert gas environment (such as a chamber) so as to provide effective control of material oxidation.

Step D3: Rationale and Definition of Plasma Processing Parameters

Reactants (such as hydrocarbons) and inert gases and flows are selected to ensure the stability of plasma and to ensure control of nucleation and growth processes within the plasma (such as supersaturation thresholds for a given gas mixture and flow rate). Acceleration rates and temperatures of the metastable carbon are controlled during excursion from the plasma to the substrate. Correspondingly, process conditions for the standard plasma spray torch are set so as to create a consolidated thin film onto which carbon can impinge and react. Surface temperature and local gas phase environments are controlled so as to promote interaction and growth of the metastable carbon phase.

Step D4: Operate the Dual (Metal and Microwave) Plasma Torch

Various parameters of processing windows of both the metal and microwave plasma torch are configured to be controlled independently or, in some implementations, in conjunction with each other. Before, during and after operation of one or more of the metal and microwave plasma torches (referred to herein as "the dual plasma torch"), processing windows for integrated carbon-metal formation are characterized. Furthermore, one or more parameters or combinations of parameters are selected, deposition of carbon-metal is observed, and using any known-in-the-art techniques, the as-deposited samples can be characterized with respect to various differentiators, including (but not limited to): morphology (such as using a scanning electron microscope (SEM)), structure (such as via x-ray diffraction (XRD) and via Raman spectroscopy), and/or physical and chemical composition.

Figure 6:
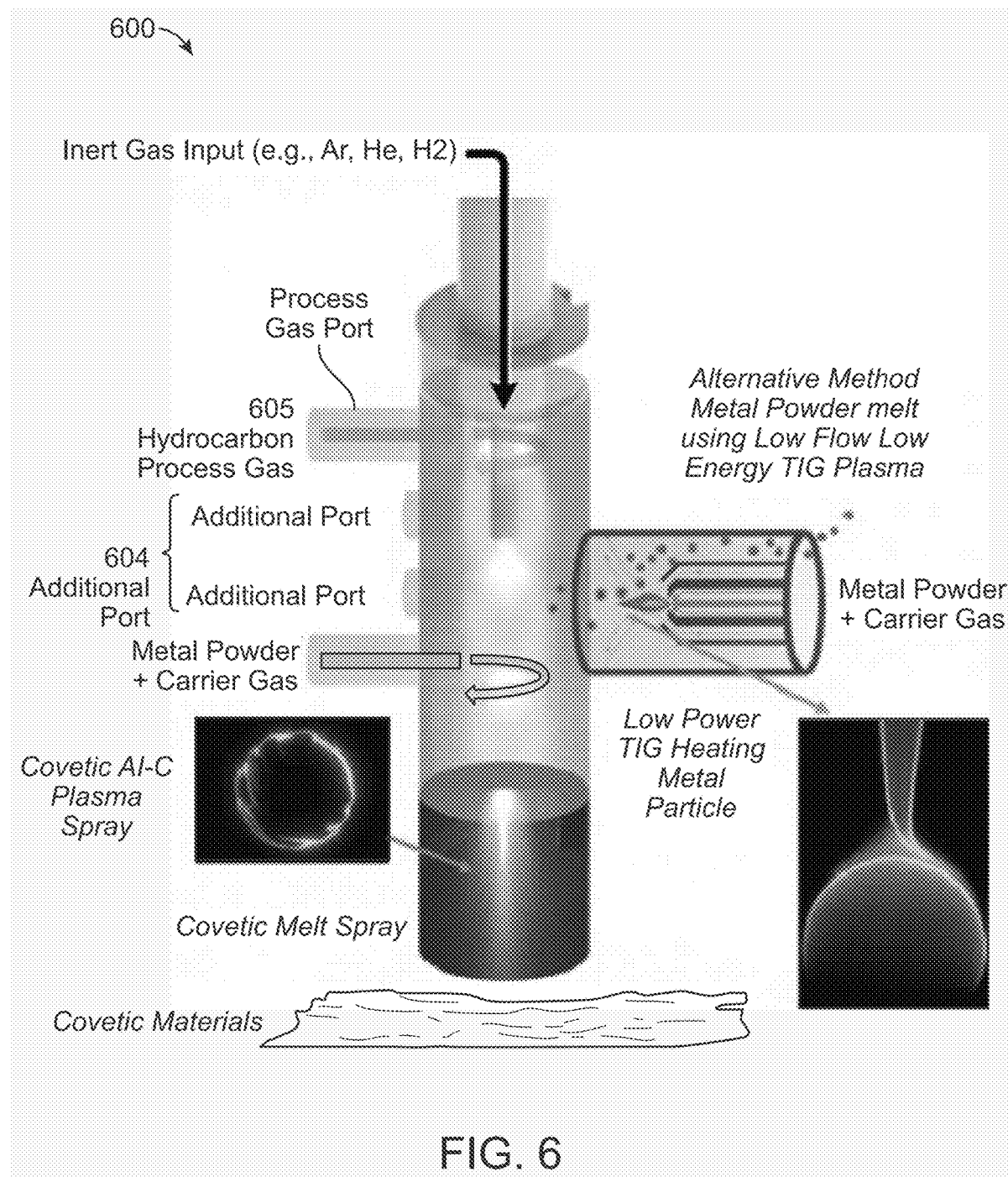
FIG. 6 illustrates a pulsed microwave plasma spray torch apparatus that is tuned for growing graphene onto small molten particles, in accordance with one or more of the disclosed implementations.

FIG. 6 illustrates a pulsed microwave plasma spray torch apparatus 600 that can be tuned for growing graphene onto small molten particles. As an example, one or more variations of pulsed microwave plasma spray torch apparatus 600 (or any aspect thereof) may be implemented in the context of the architecture and functionality of the implementations described herein. The pulsed microwave plasma spray torch apparatus 600 (or any aspect thereof) may be implemented in any environment.

In this configuration, transverse electric (TE) microwave energy power means can be coupled onto (or, in some implementations, also penetrate substantially within) a central dielectric tube to propagate microwave energy into and throughout the central dielectric tube. Gas supplied into the center region (in this example) can be a hydrocarbon gas such as methane that absorbs the microwave radiation. Metal powder is supplied (as carried by a substantially inert carrier gas) to be heated within the body (or primary chamber) of the pulsed microwave plasma spray torch apparatus 600 from the combination of the plasma-derived and applied thermal energy. Upon exposure to such energy, metal powder melts upon reaching a melting temperature to produce a viscous flowable liquid material, or droplets (potentially containing semi-solid materials), or any other conceivable dispersion (largely dependent on attendant melt conditions).

As hydrocarbon gas decomposes into its constituent element species, carbon radicals nucleate on exposed surfaces of the melted metal droplets. The combination of energy tuning settings of the microwave, and thermal plume temperature settings can allow for different temperatures between the melt temperature and the plasma decomposition/ionization temperature in a central region of the pulsed microwave plasma spray torch apparatus 600. Non-equilibrium conditions within the central chamber or region of the plasma spray torch apparatus (referring to temperature, pressure, etc.) can allow (or otherwise facilitate) internal lattice placement of the graphene/carbon, whereas the quick quenching creates conditions conducive to covetic materials growth.

As understood herein, internal lattice placement refers to the positioning of a synthesized lattice structure, e.g., of a carbon material such as graphene, within the lattice structure of input metal(s) such that individual carbon and metal atoms are at least partially aligned. For example, internal lattice placement includes situations in which one or more layers (preferably coherent, planar layers) of graphene, such as single layer graphene (SLG) or few layer graphene (FLG) are juxtaposed interstitially between basal planes of the metal lattice, and/or interlaced interstitially between basal planes of the metal lattice. Internal lattice placement also includes embodiments in which other carbon-based compounds, such as three-dimensional graphenes, carbon nano-onions (CNOs), graphene nanoribbons, carbon nanotubes, graphene superlattices, and equivalents thereof that would be understood by those having ordinary skill in the art, are juxtaposed interstitially between basal planes of the metal lattice, and/or interlaced interstitially between basal planes of the metal lattice. Again, the primary characteristic of internal lattice placement, regardless of the particular synthesized lattice structure of the carbon-based compound, is that individual carbon and metal atoms are at least partially aligned. Diagrams showing internal lattices where the lattice of the carbon and the lattice of a metal are oriented such that carbon and metal atoms are at least partially aligned are presented in FIG. 8A-B, FIG. 12, FIG. 26C, and FIG. 26D and in corresponding written description, infra.

Internal lattice placement thus refers to spatial arrangement of carbon and metal atoms in a lattice, and is to be distinguished from chemical and/or ionic bonding, although according to various implementations the presently described inventive compositions of matter may additionally include characteristics such as non-polar covalent bonding between individual carbon atoms within the composition of matter, and/or non-polar covalent bonding between individual carbon and metal atoms within the composition of matter.

Preferably, compositions exhibiting internal lattice placement are characterized by substantial absence of polar covalent bonding between individual carbon atoms, as well as substantial absence of polar covalent bonding between carbon and metal atoms. Still more preferably, the inventive compositions described herein are characterized by substantial absence of ionic bonding within the metal lattice.

As will be appreciated by those having ordinary skill in the art, polar covalent bonds, non-polar covalent bonds, ionic bonds, and metallic bonds each have unique distinguishing characteristics, and corresponding electronic and chemical properties.

An ionic bond results after a complete transfer of the bonding electrons from one atom to the other. The resulting positively and negatively charged ions are then electrostatically attracted. Importantly, ionic bonds rarely have any particular directionality because they result from electrostatic attraction of each ion to all surrounding ions with opposite charge. Ionic compounds generally have high melting temperature, high boiling temperature, are brittle (low mechanical strength), and can conduct electricity when molten or in aqueous solution.

In metallic bonding, bonding electrons are delocalized over a lattice of atoms. In metals, each atom provides one or more electrons that reside between many atomic centers. The free movement of the delocalized (or "free") electrons results then in important properties of metals such as high electrical and thermal conductivity. Notably, inventive compositions of matter described herein having carbon dispersed throughout a metal lattice, and substantial covalent bonding between the carbon atoms and the metal atoms of the lattice, may be characterized by all or substantially all (e.g., at least 90%, at least 95%, at least 98%, at least 99%, etc.) of the electrons being involved in such covalent bonding, altering the electrical and/or thermal conductivity of the composition.

While polar and non-polar covalent bonding both involve the sharing of electron(s), compounds including polar covalent bond(s) are characterized by unequal sharing of the electron(s) between bonding partners. For example, in hydrogen chloride, the chlorine atom has higher electronegativity than the hydrogen, and exhibits a stronger attraction to the electron. Accordingly, the "shared" electron is more strongly associated with the chlorine atom, resulting in a partial negative charge on the chlorine and a partial positive charge on the hydrogen (thus creating a dipole in the HCl molecule). In water the bonds between each hydrogen and the oxygen atom are similarly characterized due to the greater electronegativity of oxygen. This results in dipole moments between each hydrogen and the oxygen atom, and owing to its bent shape, an overall dipole on the water molecule as a whole. However, not all compounds exhibiting non-polar covalent bonding exhibit an overall dipole. Tetrachloromethane has four chlorine atoms bonded to a central carbon, and equally spaced from one another. Although each carbon-chlorine covalent bond is non-polar, the spatial arrangement of the molecule cancels the overall bond moments, yielding a molecule with zero net polarity. Similarly, the linear shape of carbon dioxide cancels out the dipole moments exhibited between each oxygen atom and the central carbon, yielding a molecular structure with no net dipole moment.

Regardless, in the presence of an electric field, atoms and/or electron clouds involved in polar covalent bonding may be shifted, inducing polarization in alignment with the electric field. This phenomenon can give corresponding compounds energy storage capabilities, and contributes to capacitance of the composition of matter. Compounds exhibiting polar covalent bonding, particularly small molecules or molecules having a large proportion of polar covalent bonds (e.g., at least 10%, at least 20%, at least 25%, at least 50%, etc. in various embodiments) are characterized by melting and boiling temperatures less than compounds exhibiting ionic bonding (again, particularly small compounds and compounds exhibiting a large proportion of ionic bonds), but higher than compounds exhibiting non-polar covalent bonding (yet again, particularly small compounds and compounds exhibiting a large proportion of non-polar covalent bonds). Compounds exhibiting polar covalent bonding may, or may not, exhibit electrical conductivity, although typically less than ionic compounds. In addition, compounds exhibiting polar covalent bonding (still yet again, particularly small compounds and compounds exhibiting a large proportion of polar covalent bonds) are moderately soluble in water (the degree of solubility depending on the overall polarity of the compound) but generally not soluble, or only nominally soluble, in non-polar solvents.

By contrast, non-polar covalent bonding is characterized by equal sharing of the electron between bonding partners, and consequent absence of any dipole moment therebetween. Compounds exhibiting exclusively (or substantially exclusively) non-polar covalent bonding among constituent atoms therefore lack an overall dipole moment, and the corresponding characteristics associated therewith, as described hereinabove and other characteristics that would be understood by a person having ordinary skill in the art upon reading the present disclosure. Exemplary, non-limiting, compounds exclusively (or substantially exclusively) exhibiting non-polar covalent bonding include graphite, single-layer graphenes (SLGs), few-layer graphenes (FLGs), three dimensional graphenes, carbon nano-onions (CNOs), graphene nanoribbons, carbon nanotubes (CNT), both single-walled (SWCNT) and multi-walled (MWCNT), graphene superlattices, etc. as described herein, as well as equivalents thereof that would be understood by those having ordinary skill in the art upon reading the present descriptions.

For instance, compounds exhibiting non-polar covalent bonding, particularly small molecules such as carbon dioxide, molecular hydrogen, methane, etc., and compounds substantially excluding polar covalent bonds and ionic bonds, are generally characterized by low boiling, and melting temperatures, and low electrical conductivity. In most compounds exhibiting non-polar covalent bonding, London dispersion forces control the electronic characteristics of the compound. However, despite consisting essentially of non-polar covalent bonds, graphene (and similar compounds exhibiting $sp^2$ and/or $sp^3$ bonding, and/or substantial coordination between electrons due to physical arrangement of the molecular structure and bonding pattern, as would be known by a skilled artisan upon reading the present disclosure) however, exhibits substantial electrical conductivity. Similarly, compounds exhibiting non-polar covalent bonding are typically insoluble, or only nominally soluble in water (though they are soluble in non-polar solvents).

Referring now to FIG. 6, the single integrated microwave plasma torch of FIG. 6 can be set up and operated as depicted in the following Table 2, the details of which are described infra.

TABLE 2

| Step | Setup/Operation Description |
| --- | --- |
| 1 | Deploy a single integrated microwave plasma torch |
| 2 | Operate the single integrated microwave plasma torch for the formation of graphene-loaded metal composite alloys |
| 3 | Characterize the resultants |

Step S1: Deploy a Single Integrated Microwave Plasma Torch

FIG. 6 depicts a single integrated microwave plasma torch. The torch has the capability to process solid, liquid and vapor reactant feedstock species using (for example) a small inert gas or differentially pumped vacuum for controlling gas flow. The torch can be deployed in any environment (referring to laboratories, research set-ups, or large-scale industrial concerns, etc.).

Step S2: Operate the Single Integrated Microwave Plasma Torch for Formation of Graphene Loaded Metal Composite ("Covetic") Alloys Microwave energy is delivered in a collinear waveguide configuration along with a centralized gas feed system for efficient microwave energy absorption. The microwave energy source is used to heat the metal to a semi-molten state. As the $CH_4$ (or other hydrocarbon source) decomposes (into its constituent species) within an exhaust plume that is directed into a surface wave plasma gas dissociation tube, carbon radicals can nucleate (such as in an organized layer-by-layer manner) on the surface of the metal droplets via being energized by plasma radicals (directed onto the metal droplets). The energy tuning of the microwave thermal plume temperature and plasma allows for independent control of temperatures between the melt and the plasma decomposition/ionization that occurs within the central region of the pulsed microwave plasma spray torch apparatus 600.

Process conditions are measured and optimized. Desired process conditions are controlled by or for the integrated microwave plasma torch to directly form graphene-loaded metal composite material within a single or multi-stage plasma reaction torch. The plasma torch can be modulated within different regions of the surface wave plasma to enhance resonance (modulation) times and to optimize formation of targeted metal-carbon structures.

In addition to the shown process gas port (such as for introduction of a hydrocarbon process gas 605) at the depicted location, additional ports 604 can be provided at different locations. Such additional ports can be used to control how the process gas is introduced into the microwave field, and to introduce other process gasses. As examples, a process gas might be $SiH_4$ or $NH_3$. In some implementations, more than one input port for gas or more than one input port for particles (such as one for carbon and one for metal) may be included, where the location of the input ports can be positioned in different zones of the plasma torch.

The foregoing setup and conditions, as well as other conditions are optimized to result in conditions at the substrate surface that enable impinging particles to be consolidated into a film. The as-deposited films are analyzed and characterized according to methods outlined in Step S3 below.

Step S3: Validate/Characterize the Graphene (Secondary Phase) Metal Properties

Characterization of the as-deposited integrated carbon-metal composite structures are accomplished using several techniques. For example, x-ray photoelectron spectroscopy (XPS) and/or SEM-EDS can be used to determine chemical composition, binding energies (nanoscale carbon detection) and distribution. Also, energy-dispersive x-ray spectroscopy (EDS) and/or SEM, and/or Raman spectroscopy, and/or XRD can be used for determining morphology and/or for measuring grain size and structural aspects. Electrical and thermal properties as well as the tensile strength and modulus of the composite material can be evaluated using any known techniques.

Results

The foregoing techniques use a microwave plasma torch to continuously fabricate metal matrix composites. The processing entails material nucleation and formation of a growth zone within the plasma followed by an acceleration and impaction zone for consolidation of the materials onto a substrate. Each zone provides for unique control of dissimilar materials synthesis/formulation and integration; namely, selective, and unique formulation of alloy particles within the plasma, which then, through control of momentum (primarily kinetic) and thermal energetics during impact onto a substrate, enable a unique additive process for controlling consolidation parameters such as porosity, defect density, residual stress, chemical and thermal gradients, phase transformations, and anisotropy.

Various materials are selected for use across a wide range of growth dynamics within the plasma operation environment. In particular, different hydrocarbon gas sources with specific ratios of carbon to oxygen and hydrogen, and solid metal (or metal alloy) particle sources with different carbon solubilities, melting points, and crystal structures can be processed through the pulsed energy plasma torch processing system. As such, specific plasma processing parameters can be identified for concomitant incipient surface melting of the particle along with nucleation/growth and incorporation of 2D graphene and re-sputtered metal at the metal surface.

Upon incorporation of graphene into the metal from the microwave plasma torch, as-deposited materials/films are characterized with respect to "covetic-like" properties. As examples, these covetic-like properties can be characterized as (for example): (1) chemical composition (such as to detect impurities and to detect forms of carbon); (2) distributions of carbon (such as interstitial—referring to positions of carbon atoms or species within a metal matrix or lattice, intragranular and intergranular); (3) electrical conductivity; and (4) mechanical strength of the materials. The characterizations may include comparisons between graphene loaded versus un-alloyed parent metals. Further, and strictly as examples, using the microwave plasma torch, the as-deposited materials may exhibit a ratio of carbon to metal throughout the range (inclusive) of about 3% to 90%. In some situations, the ratio of carbon to metal is throughout the range (inclusive) of about 10% to about 40%. In some situations, the ratio of carbon to metal is throughout the range (inclusive) of about 40% to about 80%. In some situations, the ratio of carbon to metal is throughout the range (inclusive) of about 80% to about 90%. In some situations, the ratio of carbon to metal (inclusive) is greater than 90%. The carbon to metal ratio can be affected (or further affected) by parameters or specifications (such as temperatures, thicknesses, homogeneity, etc.) that define the coating process.

Accordingly, carbon may be present in amounts not capable of being achieved using conventional techniques, e.g., the resulting materials may include more than about 6 wt % carbon, more than about 15 wt % carbon, more than about 40 wt % carbon, more than about 60 wt % carbon, or up to about 90 wt % carbon, according to various embodiments. In various embodiments, the carbon may be included in the metal lattice in the foregoing amounts, such that all or substantially all of the carbon is incorporated into the metal (or other material) lattice, and grain boundaries/lattice surfaces are substantially or entirely devoid of carbon aggregates and/or agglomerates. Further still, the carbon is preferably present/located at interstitial sites of the lattice.

Figure 7:
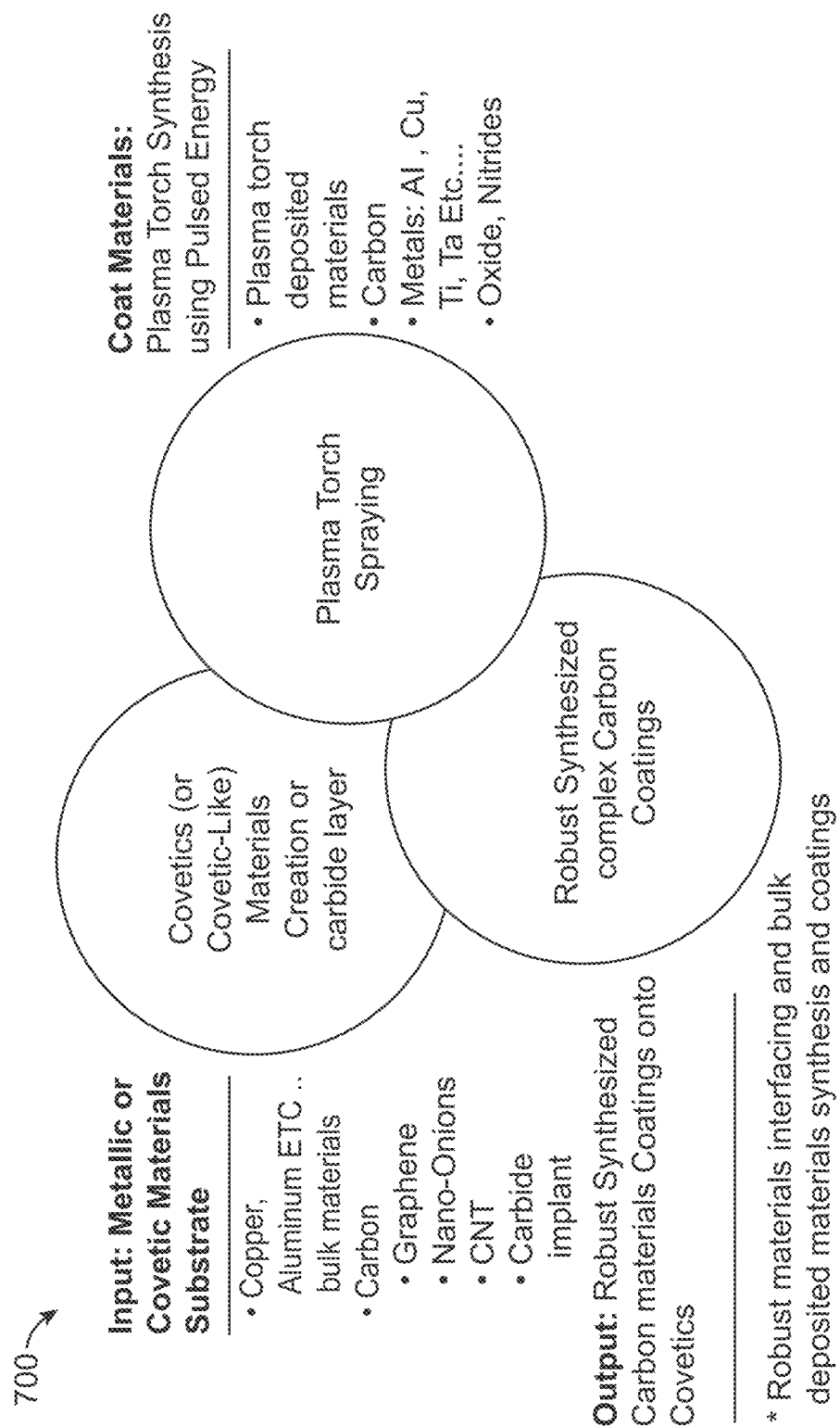
FIG. 7 is a diagram depicting the intersection of common subject matter areas associated with covetics (or related materials), plasma torch spraying, and/or robust synthesized complex carbon coatings, in accordance with one or more of the disclosed implementations.

FIG. 7 is a diagram 700 depicting a coating process. The figure refers to a metallic substrate, which substrate is subjected to plasma torch spraying of covetic materials, which in turn results in synthesized complex carbon coatings. The metallic substrate might comprise any one or more of aluminum, copper, iron, nickel, titanium, tantalum, tungsten, chromium, molybdenum, cobalt, manganese, niobium, and alloys thereof (e.g., various alloys of Inconel as described hereinabove, or other bulk metallic materials. The covetic materials might comprise one or more of carbons, graphene, Nano-onions, carbon nanotubes (CNTs), carbide implanted materials, etc.

The plasma torch spraying serves to coat the input materials with deposited materials, and can be operated using pulsed energy. As shown, the deposited (such as by layer-on-layer sputtering) materials may be any one or more of carbon, metals (such as listed above), and/or oxides or nitrides.

Several advantages emerge from use of the foregoing torches. Chiefly among them are the advantages of scalability and versatility of processes to formulate unique stable metal-carbon composites in a variety of configurations/architectures. These configurations/architectures range from fully dense thin film coatings to thick strips or particles for subsequent re-melting and casting/forming into engineered metal alloy components. Each of these species throughout the aforementioned range exhibit unexpectedly favorable (and desirable) enhanced mechanical, thermal and electrical properties when compared to existing parent metal alloy formulations. Additionally, the tunability of the concentration and distribution of covalently-bound 2D graphene in a metal alloy matrix above the thermodynamic solubility threshold, and the layer-by layer formation in a non-equilibrium plasma environment, enables a new class of composite materials that can be engineered to correspond to a specific application and/or to correspond to specific property requirements. Moreover, this can be done at a significantly reduced cost as compared with other techniques.

The enhanced mechanical, thermal and electrical properties can apply to a large number of applications that use copper and aluminum alloys. As examples, such applications include (but are not limited to): wire conductors and high voltage power transmission cables, microelectronic thermal management and heat exchangers, and numerous applications that use thin film electrical conductors such as batteries, fuel cells, and photovoltaics. In particular, the combination of the microwave plasma torch process and enabling carbon-metal alloy production provides significant energy savings in manufacturing as well as increased thermal efficiency and reduced electrical losses in end-application performance.

The foregoing plasma spray techniques depict merely one genre of methods for making covetic materials. Another genre involves spraying carbon particles onto small molten metal particles. Such a genre and various species of that genre are shown and discussed as pertains to FIGS. 8A-B, FIG. 9, FIG. 10, FIG. 11, FIG. 12, FIG. 13, and FIG. 14., as well as in the discussions of the figures herein.

Figure 8A:
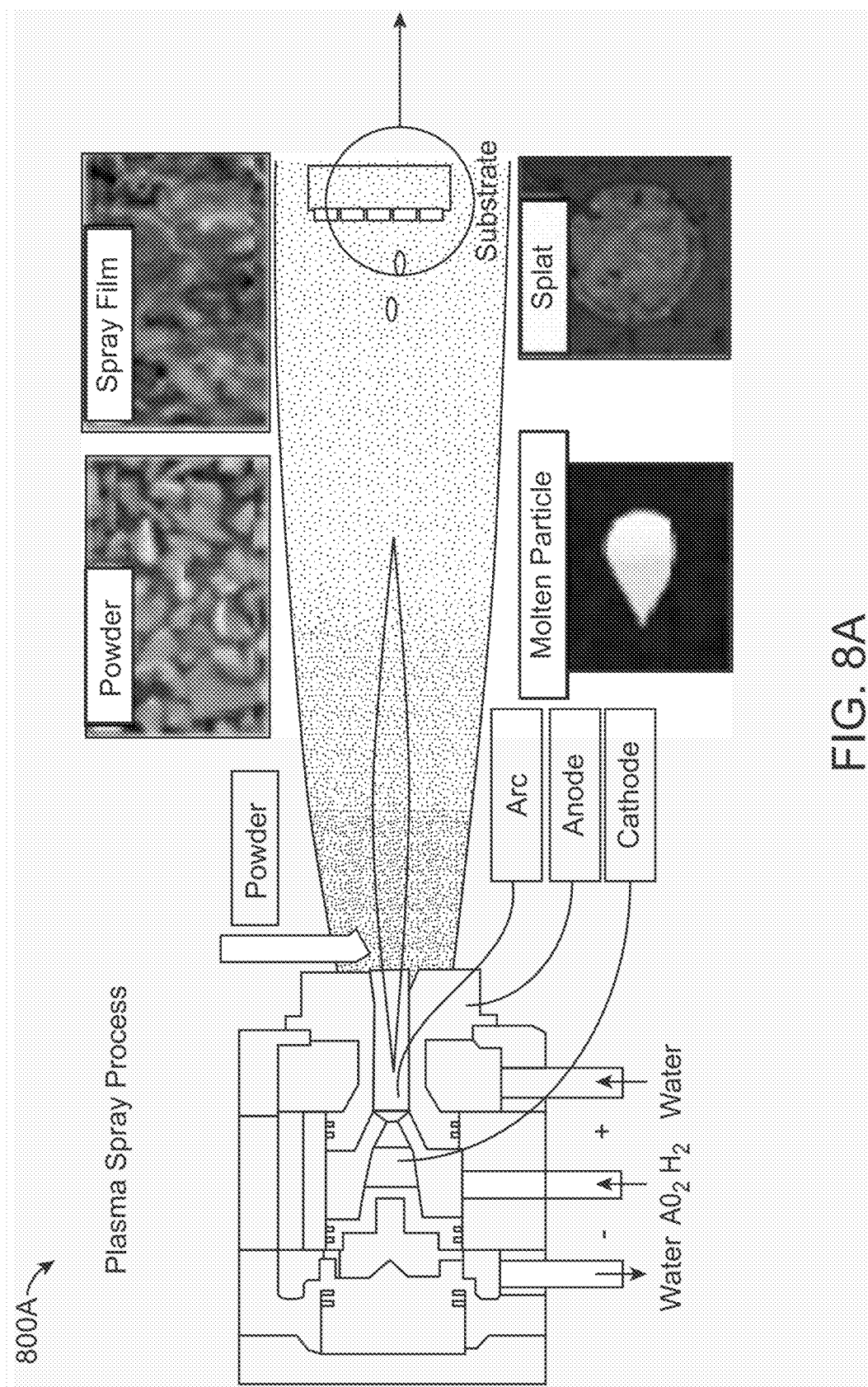
FIGS. 8A-B are schematics depicting plasma spray processes that are used for spraying carbon particles onto small molten particles, in accordance with one or more of the disclosed implementations.
Figure 8B:
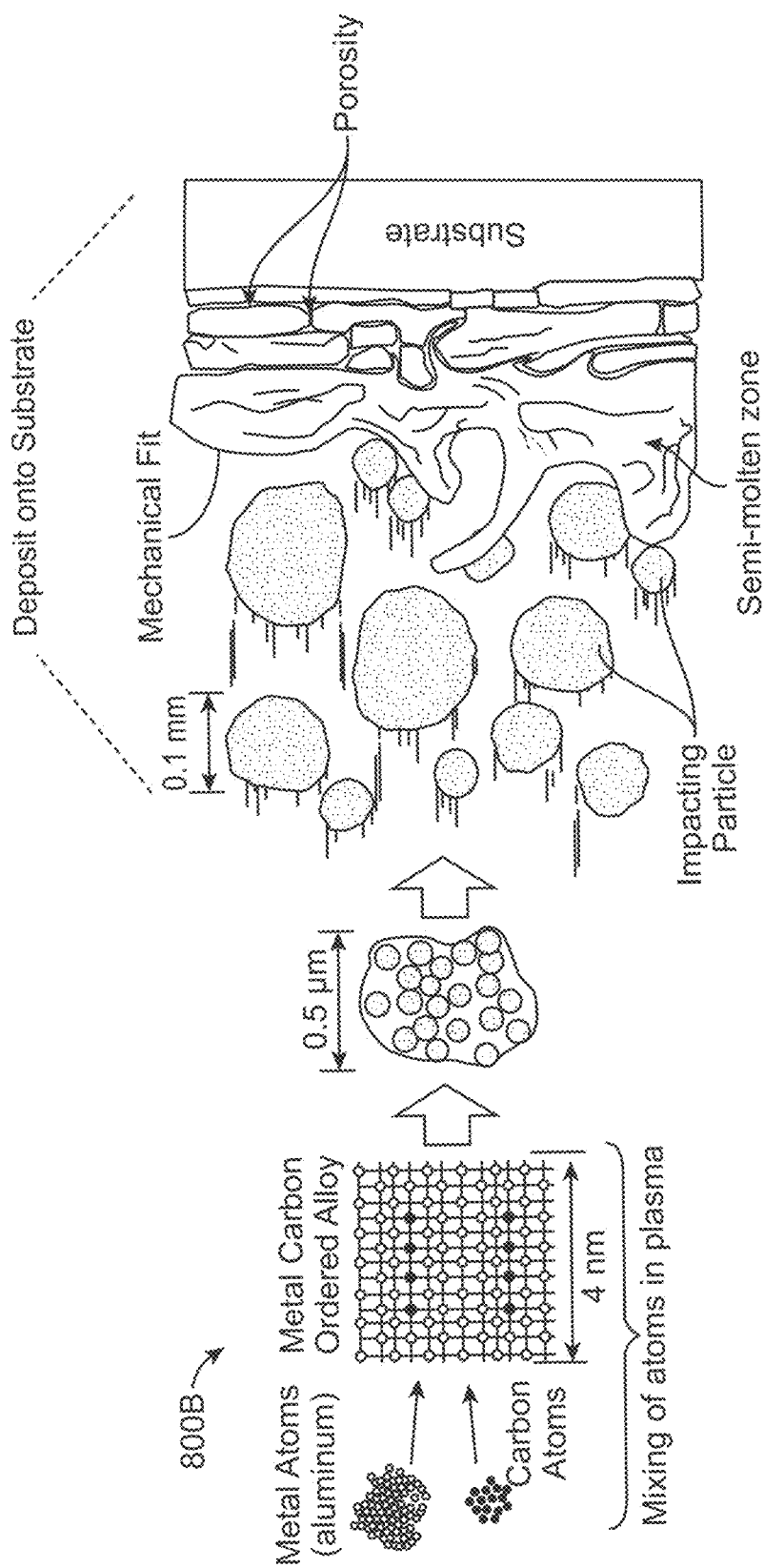

FIGS. 8A-B are schematics depicting a plasma spray process 800 that is used for spraying carbon particles onto small molten particles. As an option, one or more variations of the plasma spray process 800 (or any aspect thereof) may be implemented in the context of the architecture and functionality of the implementations described herein. The plasma spray process 800 or any aspect thereof may be implemented in any environment.

The shown plasma spraying techniques are used in various coating processes wherein heated materials are sprayed onto a surface. The feedstock (such as the coating precursor) is heated by electrical means (such as plasma or arc) and/or chemical means (such as via a combustion flame). Use of such plasma spraying techniques can provide coatings having a thickness in the range of about 20 μm to about 3 mm, depending on the process and feedstock. The coating can be applied over a large area and at a high deposition rate. Using the foregoing techniques, the deposition rate is much higher than can be achieved by conventional coating processes such as electroplating or physical and chemical vapor deposition.

In addition (or in alternative) to the example materials above, the types of coating materials available for plasma spraying include metals, alloys, ceramics, plastics, and composites. They are fed into the spray torch in powder form or in wire form, then heated to a molten or semi-molten state and accelerated towards substrates in the form of micrometer-size particles. Combustion or electrical arc discharge can be used as the source of energy for plasma spraying. Resultant coatings are made by the accumulation of numerous layers of sprayed particles. In many applications, the surface of the substrate does not heat up significantly, thus facilitating coating of many substances, including most flammable substances.

Figure 9:
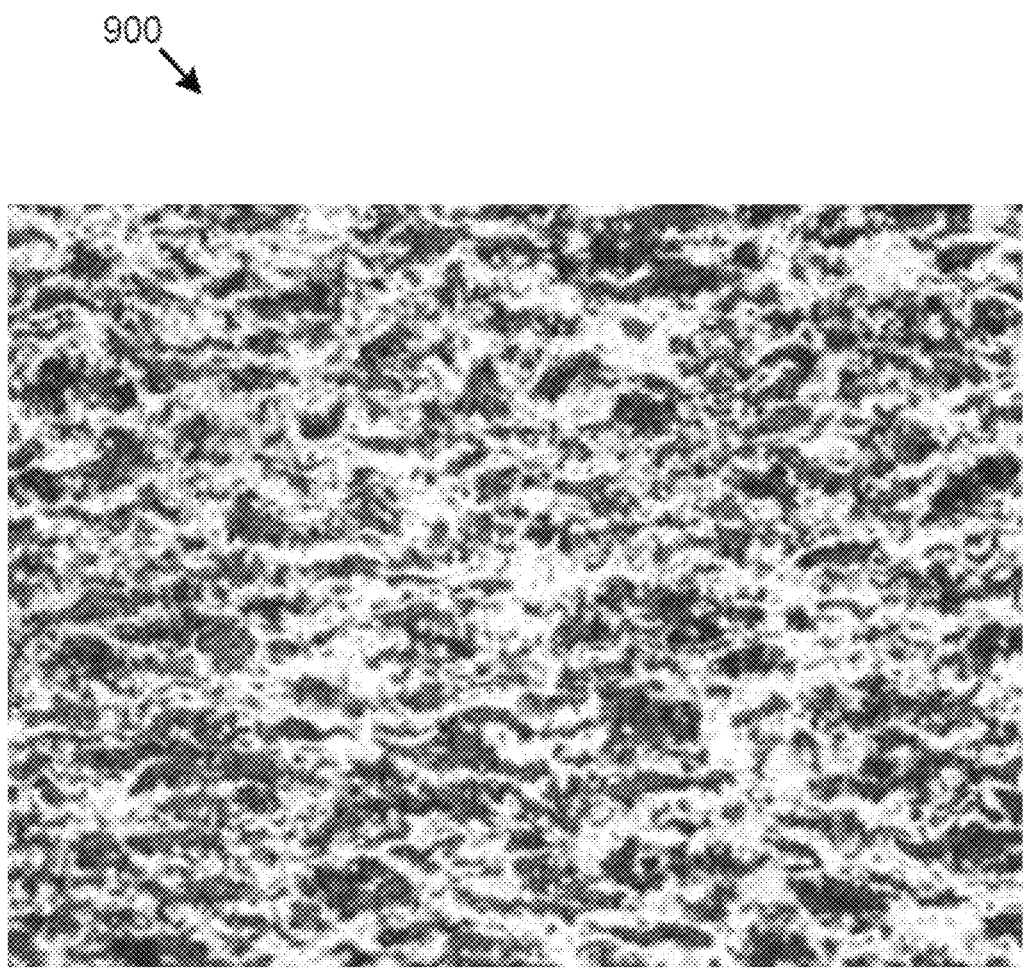
FIG. 9 is a scanning electron microscope image showing the effect of spraying carbon particles onto small molten particles, in accordance with one or more of the disclosed implementations.

FIG. 9 is a scanning electron microscope image 900 showing the effect of spraying carbon particles (such as with particles sizes from 20 nm to 40 μm) onto small molten metal particles. The carbon particles sprayed onto small molten metal particles can be used in various specialized applications. For example, a plasma aluminum-graphite composite can be specially designed to provide coatings for turbine engines. Alternatives include use of aluminum and titanium alloys. The rate of growth of this plasma spray coating material is parabolic. The plasma spray coating material precipitates over short periods of time, which precipitation is largely independent of temperature. For preparation of the material surface, certain processes include preheating of the materials. In some implementations, blasting by grit is performed as well for preparation of the material surface. In some implementations, some portion of the particles that are sprayed onto the surface are still hot enough to form covetic bonds at the surface of the substrate. In other cases, small molten particles are at a temperature to form metal-to-metal bonds.

Use of the herein-disclosed microwave plasma torch techniques enables the creation of improved materials as compared to use of conventional torches. Specifically, power control limitations and other configuration constraints inherent to conventional plasma torches limit the ability of a conventional plasma torch to independently control input materials and other conditions needed to produce carbons that are effective in the creation of covetic materials that exhibit sufficiently high quality and homogeneity.

FIG. 10 shows a chart depicting a graphene growth temperature profile 1000 and a binary phase diagram. As an option, one or more variations of graphene growth temperature profile 1000 or any aspect thereof may be implemented in the context of the architecture and functionality of the implementations described herein. The graphene growth temperature profile 1000 or any aspect thereof may be implemented in any environment. The figure also shows a binary phase diagram, where the x-axis is the carbon concentration in a selected metal (such as copper, as shown) as expressed in atomic percent. The temperatures in the temperature profile in the figure as also shown in the phase diagram. Various metals can be used (such as silver, tin, etc.). In some cases, alloys are formed.

A general idea behind the growth of single layer graphene (SLG) or few layer graphene (FLG) on molten metal is to dissolve carbon atoms inside a transition metal melt at a certain temperature, and then allow the dissolved carbon to precipitate (referring to the creation of a solid from a solution) out at lower temperatures.

The schematic depicts graphene growth from molten nickel by (for example): (1) melting nickel while in contact with graphite (as carbon source), (2) dissolving the carbon inside the melt at high temperatures, and (3) reducing the temperature for growth of graphene.

As depicted, keeping the melt in contact with a carbon source at a given temperature will give rise to dissolution and saturation of carbon atoms in the melt based on the binary phase transition of metal-carbon. Upon lowering the temperature, solubility of the carbon in the molten metal will decrease and the excess amount of carbon will precipitate on top of the melt.

Figure 11:
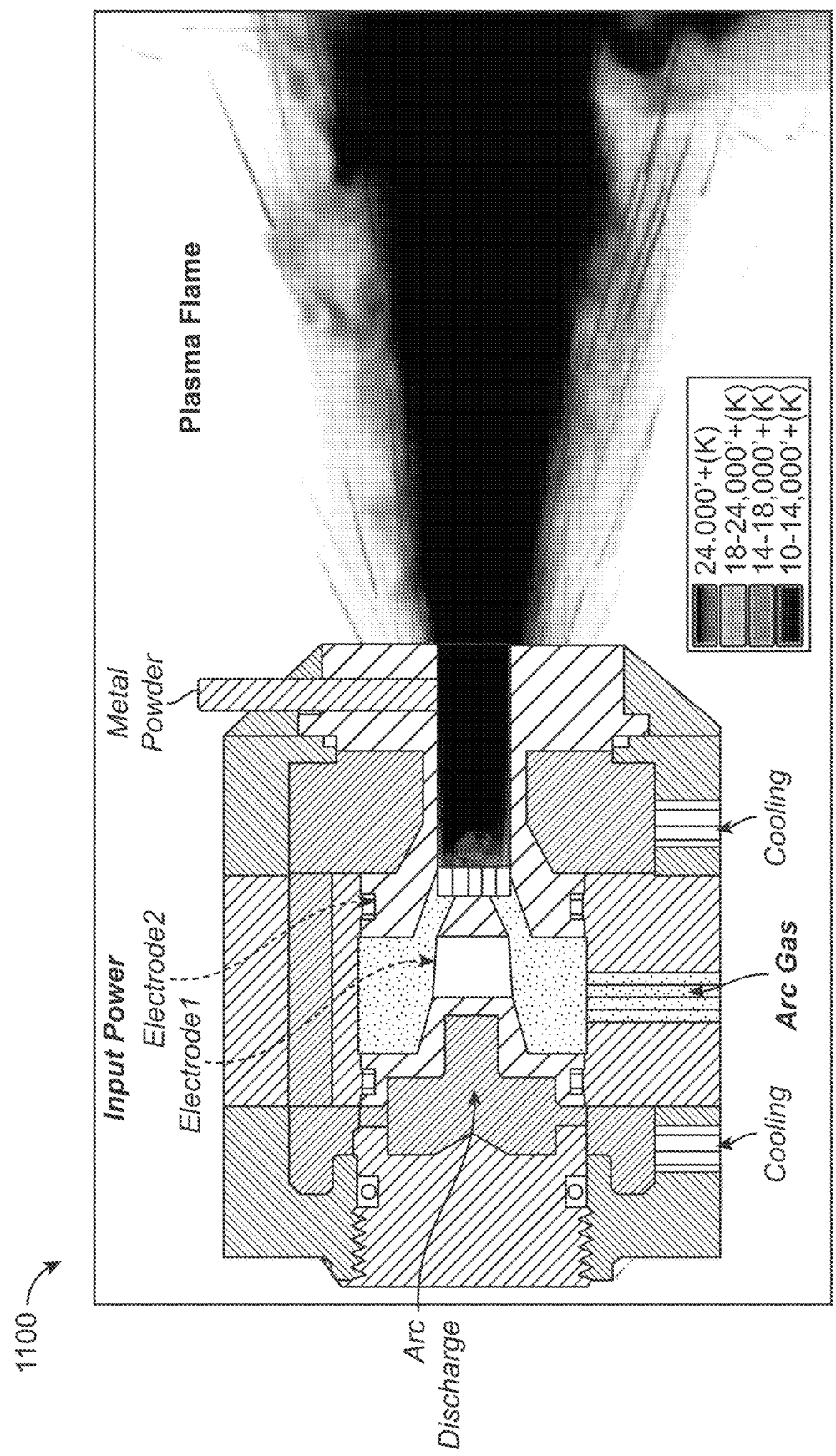
FIG. 11 is a cross-section view of a conventional plasma flame apparatus.

FIG. 11 is a cross-section view of a (conventional) plasma flame apparatus 1100. The figure is being presented to distinguish uses of a legacy plasma flame apparatus as compared to uses of the herein-disclosed microwave plasma torch. Specifically, although use of a legacy plasma flame apparatus can produce diamond, or diamond-like materials on the surface of metals, the process requires significant time for material dissolution of carbon and diffusion so that the final materials precipitate out onto the surface of the metal. During the creation of metal-carbon composite materials as disclosed herein with the presently disclosed implementations, graphene is desired to be interstitially grown and locked between layers (or within lattice or matrix sites) of metals or metal-containing composite materials. However, to do so, the temperatures must be modulated at a high rate. Unfortunately, legacy plasma torches do not offer sufficient control over the temperature and other conditions that are needed to reduce the size of interstitial carbon structures to the nanometer scale (as may be desirable in connection to achieving the covetic materials as desired herein).

Figure 12:
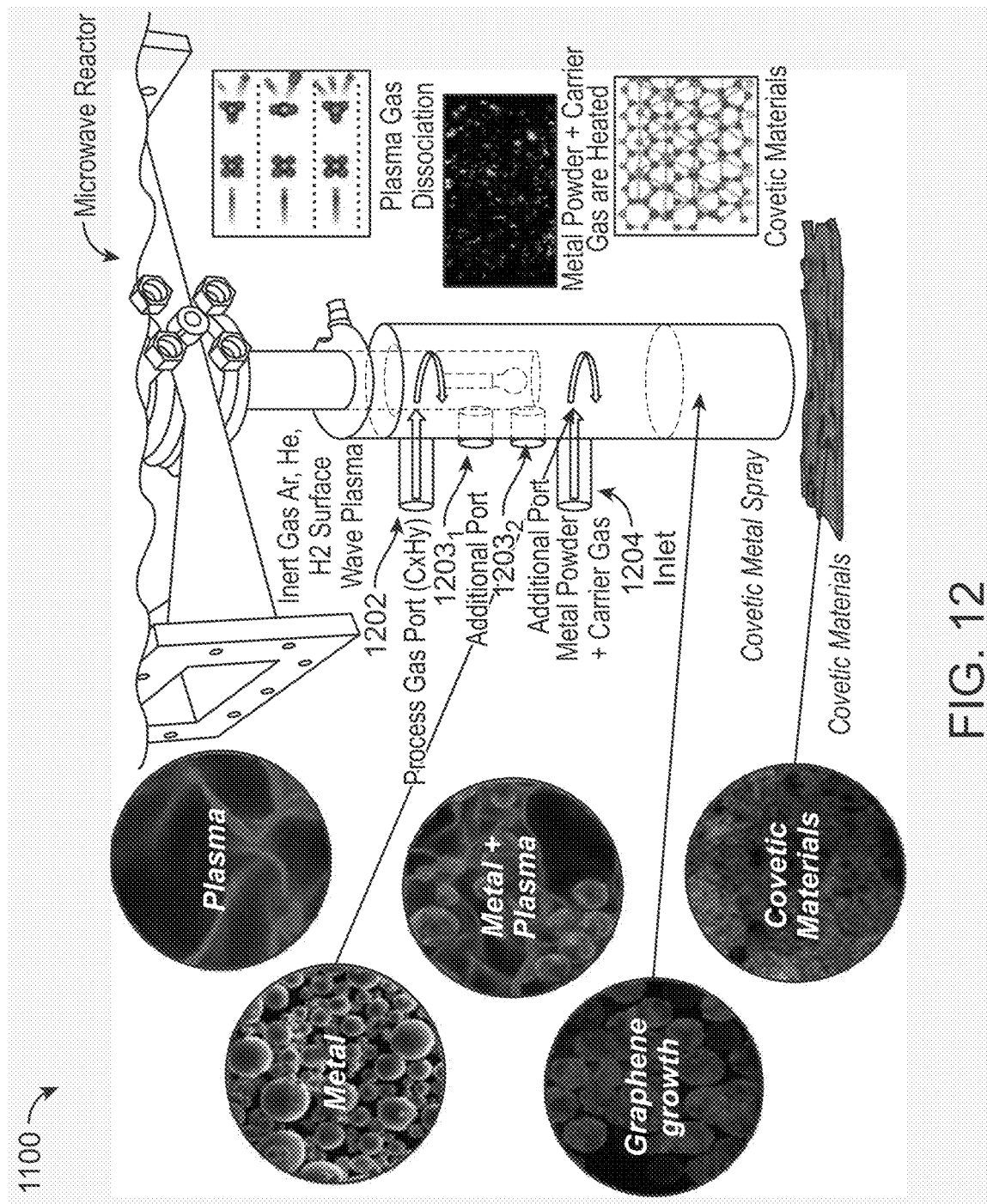
FIG. 12 depicts a pulsed microwave process flow that is used when growing graphene onto small molten particles, in accordance with one or more of the disclosed implementations.

In contrast, a pulsed microwave reactor (as relevant to the presently disclosed implementations as introduced earlier) and corresponding processes are shown and described in FIG. 12 to offer sufficient detailed control over the temperature and other conditions that are needed to reduce the size of interstitial carbon structures to the nanometer scale.

FIG. 12 depicts a pulsed microwave process flow 1200 that is used when "growing" graphene, referring to the layer-by-layer systematic deposition or application of graphene on substantially flat exposed surfaces of molten metal particles. As an option, one or more variations of pulsed microwave process flow 1200 or any aspect thereof may be implemented in the context of the architecture and functionality of the implementations described herein. The pulsed microwave process flow 1200 or any aspect thereof may be implemented in any environment.

When using the shown pulsed microwave process flow 1200, graphene is grown onto small molten particles. This is accomplished by interactions within the pulsed microwave reactor that occur around inlet 1204 (such as where the metal powder and carrier gas are inlet into the reactor chamber). In addition to inlet 1204, a process gas port 1202 and additional ports (such as additional port 12031 and additional port 12032) are provided at different heights on the side of the reactor apparatus. A waveguide traverses at least the distance from the position of the process gas port 1202 on the side of the reactor to the position of the inlet 1204 on the side of the reactor. Details of how to make and use ports for introduction and continued supply of material into such a reactor for growing graphene onto small molten particles are further disclosed below. More specifically, certain components of the reactor of FIG. 12 are shown and described as pertains to FIG. 13.

Figure 13:
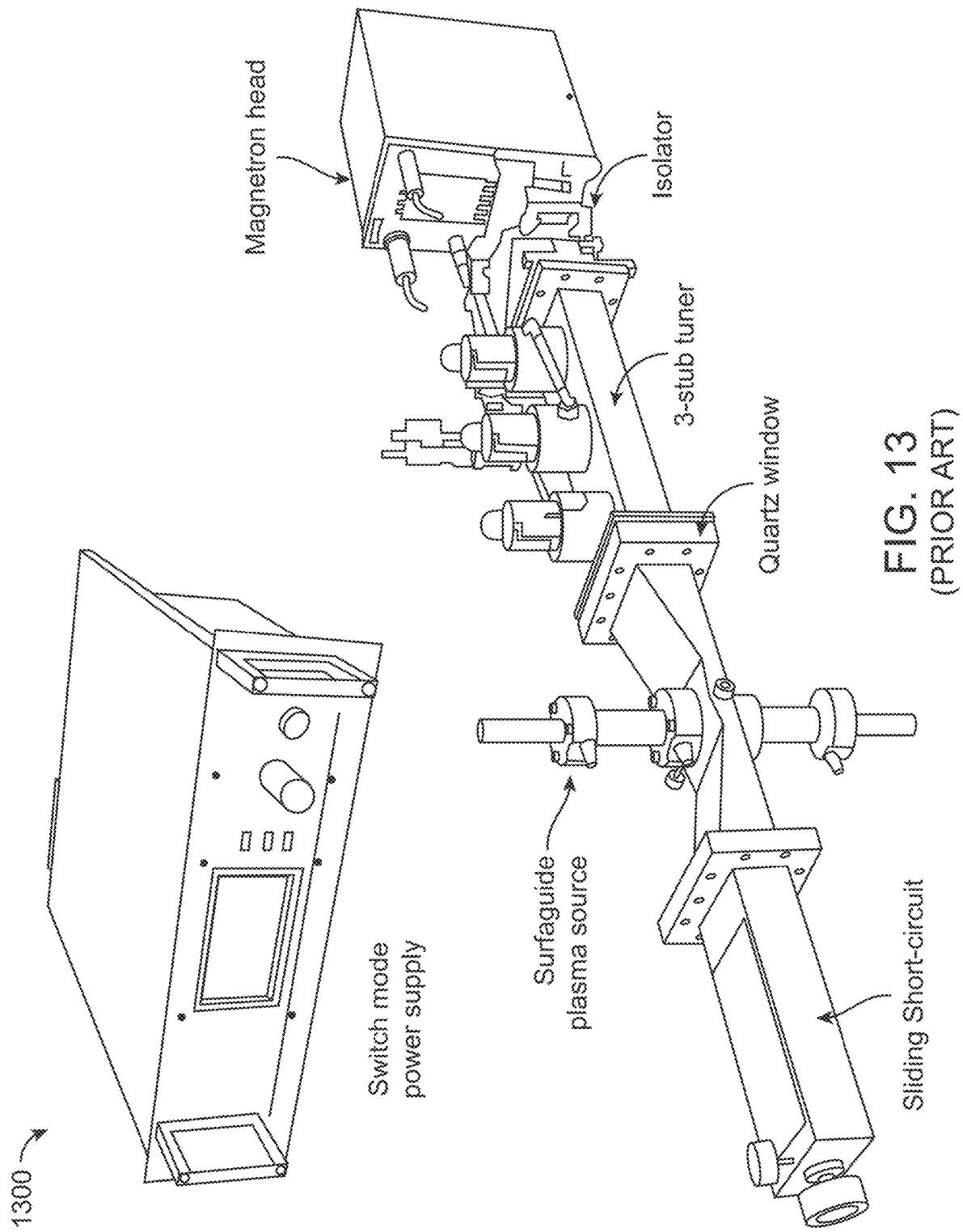
FIG. 13 is a perspective view of conventional a pulsed microwave plasma spray waveguide apparatus that is used for growing graphene onto small molten particles.

FIG. 13 is a perspective view of a conventional pulsed microwave plasma spray waveguide apparatus 1300 that is used for growing graphene onto small molten particles. As an option, one or more variations of pulsed microwave plasma spray waveguide apparatus 1300 or any aspect thereof may be implemented in the context of the architecture and functionality of the implementations described herein. The pulsed microwave plasma spray waveguide apparatus 1300 or any aspect thereof may be implemented in any environment.

In this implementation, microwave delivery components and a pulsing power supply are integrated to form a "surfaguide" (or the like) gas reactor. As shown, a combination of these components is configured to facilitate growing graphene onto small molten particles using a microwave plasma torch.

An alternative approach is to perform micro-welding using a tungsten inert gas (TIG) plasma source to partially or entirely melt the metal. Such a micro-welding technique is shown and described as pertains to FIG. 14.

Figure 14:
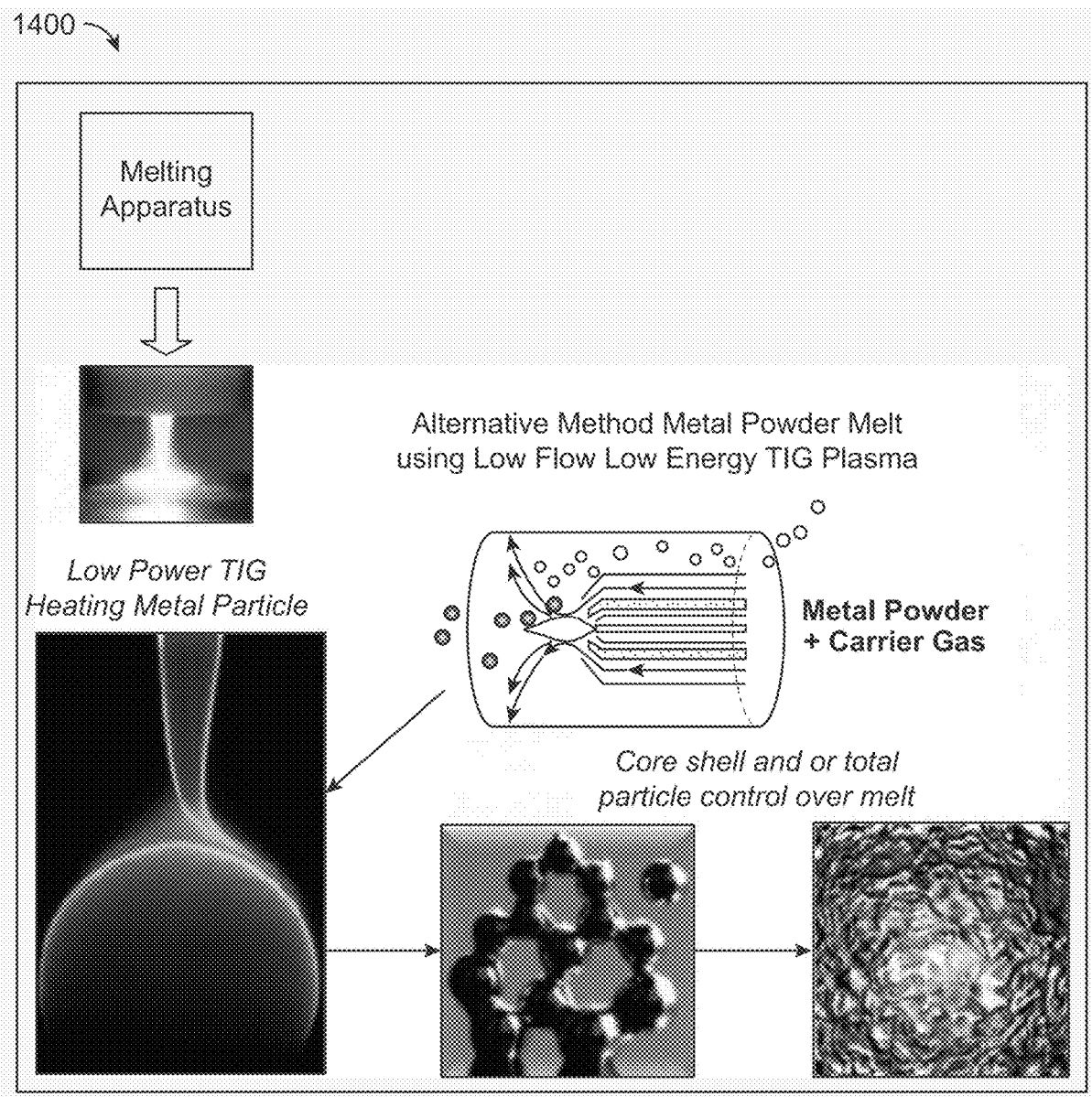
FIG. 14 is a schematic depiction of a micro-welding technique that is used for growing graphene onto small molten particles, in accordance with one or more of the disclosed implementations.

FIG. 14 is a schematic depiction of a micro-welding technique 1400 that is used for growing graphene onto small molten particles. As an option, one or more variations of micro-welding technique 1400 or any aspect thereof may be implemented in the context of the architecture and functionality of the implementations described herein. The micro-welding technique 1400 or any aspect thereof may be implemented in any environment.

A low power, low flow TIG welder power supply and control unit with a custom plasma containment section can be effectively used to heat metal particles of all types. As shown, the exhaust plume, when inserted into the surface wave plasma gas dissociation tube, allows temperatures to remain high enough for the growth of graphene. This mode of growth involving control of plasma radicals composed of hydrocarbons and other added gases formed under non-equilibrium conditions provides many tuning opportunities that can be exploited by many different configurations of a microwave plasma spray apparatus. FIG. 15, FIG. 18A1, FIG. 18A2, FIG. 18B, FIG. 18C, and FIG. 18D, as well as other figures and corresponding written description disclose example configurations of plasma spray apparatus.

Figure 15:
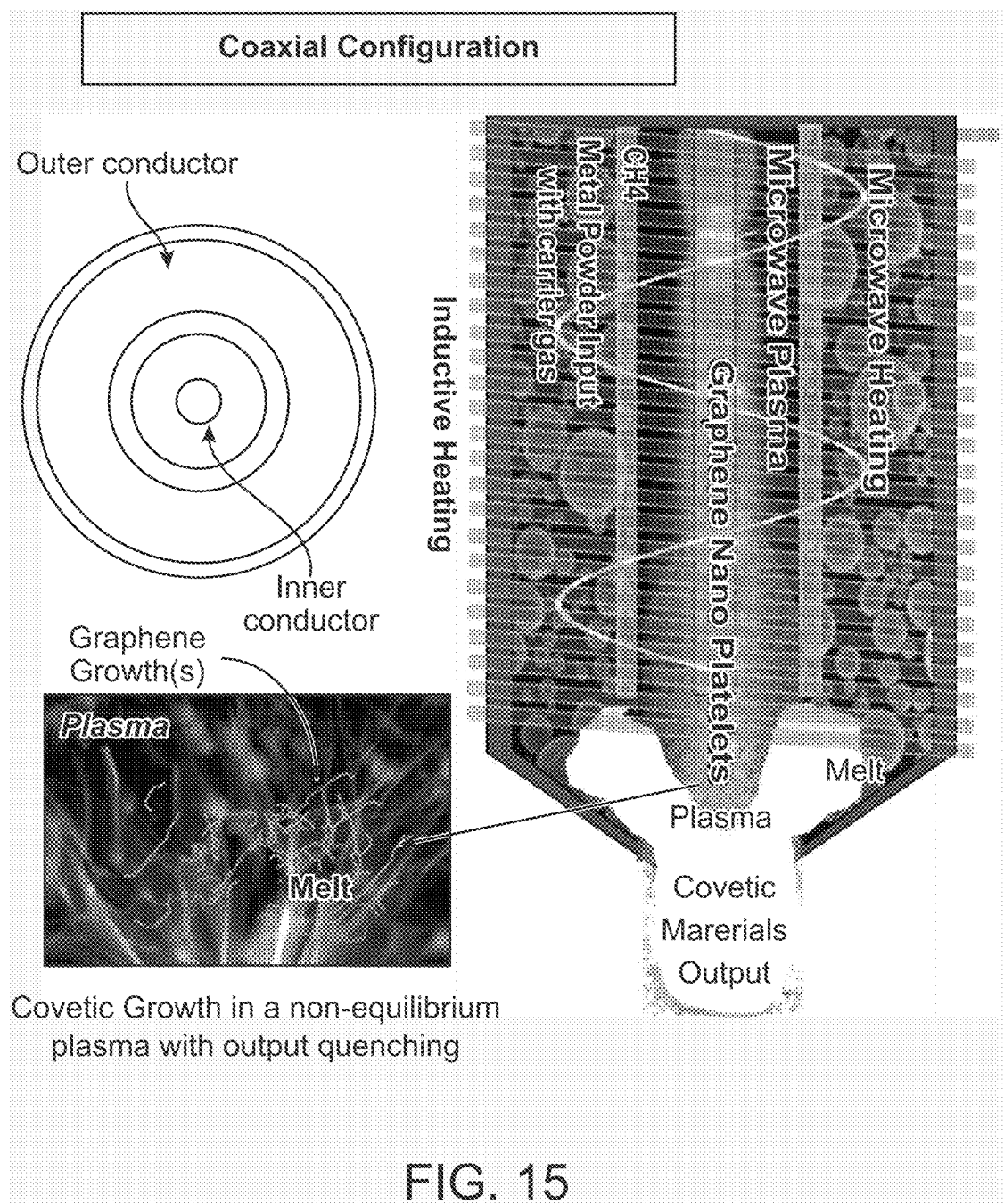
FIG. 15 is a schematic depiction of a plasma spray apparatus in a coaxial configuration, in accordance with one or more of the disclosed implementations.

FIG. 15 is a schematic depiction of a plasma spray apparatus in a coaxial configuration 1500. As an option, one or more variations of coaxial configuration 1500 or any aspect thereof may be implemented in the context of the architecture and functionality of the implementations described herein. The coaxial configuration 1500 or any aspect thereof may be implemented in any environment.

In a coaxial style implementation, microwave energy delivery is achieved via TEM waves fed into an antenna with the outer portion of the coaxial member being a quartz tube outside of which are flowed powdered metallic particles. The gas that is fed into the center region in this example is a hydrocarbon gas such as methane, where it absorbs the microwave radiation. The powder is heated by microwave energy that escapes the central region and by external inductive heating, which causes metal powder (in particulate form) to melt near the inclined portion, or tip, of the displayed reaction chamber. As the $CH_4$ decomposes (into its constituent species, carbon, hydrogen, and/or derivatives thereof), carbon radicals nucleate on the surface of the melted metal droplets via the energy of the plasma radicals. Tuning of the microwave duty cycle, as well as tuning of the inductive heating, as well as tuning of the plasma characteristics, facilitates maintenance of different temperatures between the melt and the plasma decomposition/ionization region. Moreover, the non-equilibrium temperature allows for (facilitates) internal lattice placement of the graphene/carbon, and quick quenching creates conditions conducive to further covetic materials growth.

Figure 16:
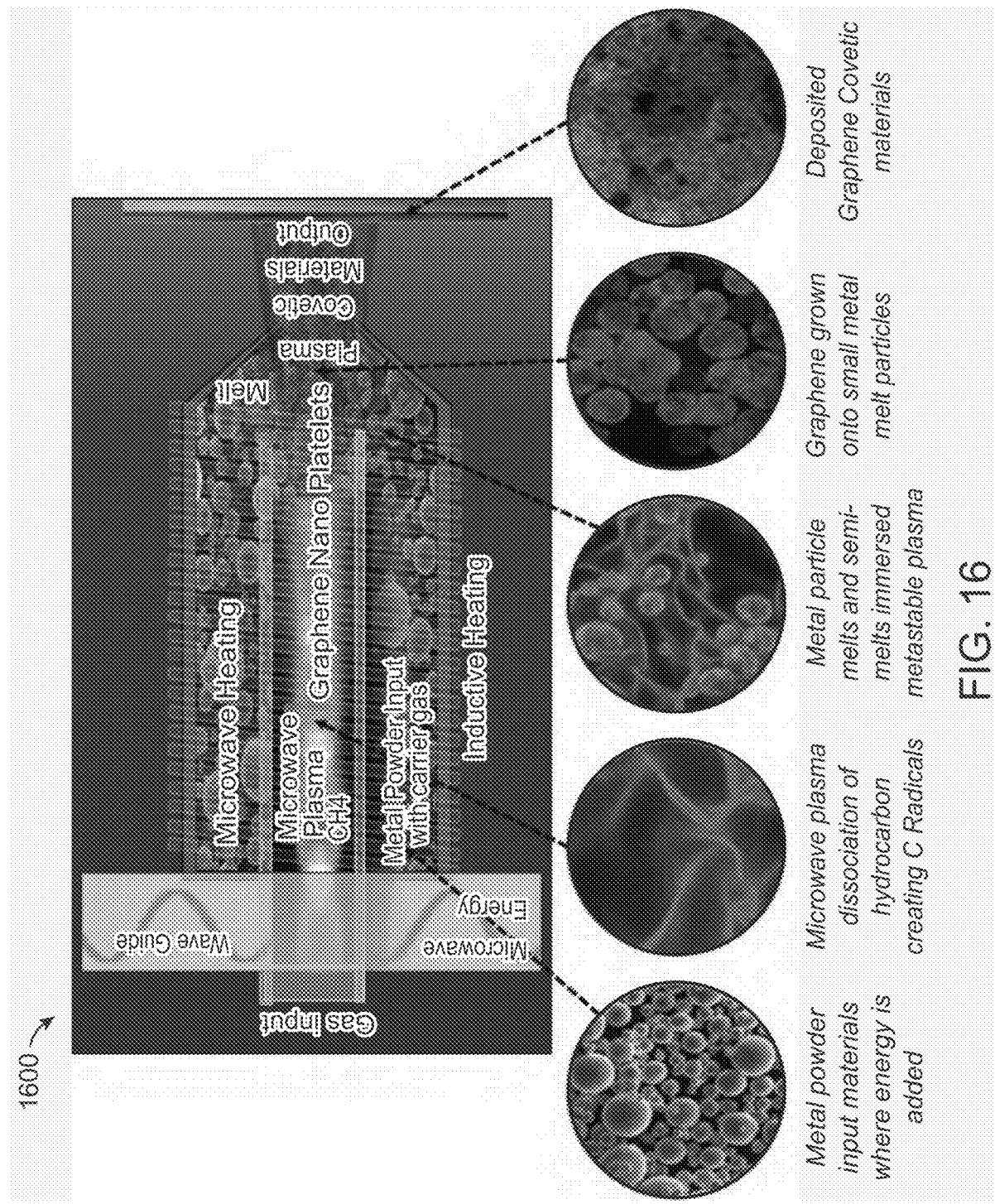
FIG. 16 is a schematic depiction of a plasma spray apparatus showing the evolution of materials by processing through a series of non-equilibrium energy conditions, in accordance with one or more of the disclosed implementations.

FIG. 16 is a schematic depiction of a plasma spray apparatus 1600 showing the evolution of materials by processing through a series of non-equilibrium energy conditions. As an option, one or more variations of the plasma spray apparatus 1600 (or any aspect thereof) may be implemented in the context of the architecture and functionality of the implementations described herein. The plasma spray apparatus 1600 or any aspect thereof may be implemented in any environment.

The figure depicts evolution of materials as they pass through the apparatus. Specifically, the figure depicts the regions where different evolutionary changes occur such that in the region near the tip, graphene is grown onto the small metal melt particles. This material is deposited onto a substrate.

Figure 17:
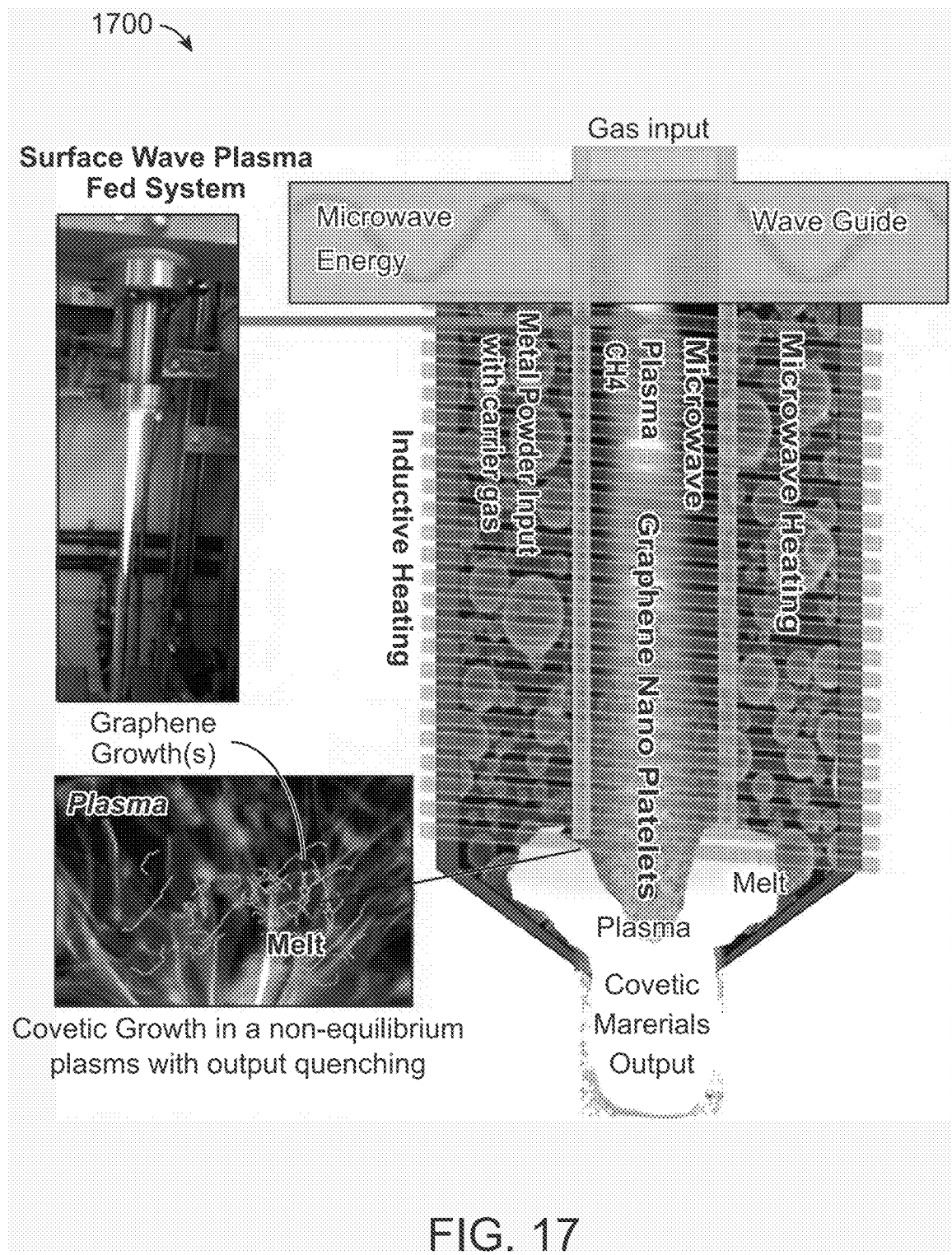
FIG. 17 depicts a surface wave plasma system for growing graphene onto molten particles, in accordance with one or more of the disclosed implementations.

FIG. 17 depicts a surface wave plasma system 1700 for growing graphene onto molten particles. As an option, one or more variations of the surface wave plasma system 1700 or any aspect thereof may be implemented in the context of the architecture and functionality of the implementations described herein. The surface wave plasma system 1700 or any aspect thereof may be implemented in any environment.

In the shown configuration, the supply gas is fed into the center region of the apparatus. In this example a hydrocarbon gas such as methane is used. The hydrocarbon gas absorbs the microwave radiation, which provides a heat source to heat metal powder. Thus, the metal powder is heated from both: (1) the microwave energy that escapes the central region; and (2) the external inductive heating, to melt and become molten near the tip. As the hydrocarbon gas decomposes, carbon radicals nucleate on the surface of the melted metal droplets via the energy of the plasma radicals.

FIG. 18A1 depicts an axial field configuration 1810 of a plasma spray torch. The formation of covetic materials has been discussed using several different apparatuses and corresponding processes. Any of the foregoing apparatuses and corresponding processes can be tuned to achieve particular conditions for formation of covetic materials. In the specific axial field configuration shown, the processes include generating an electric field 1804 between the electrodes to create current flow through a melt of metallic and carbon materials. Specifically, and as shown, a specially configured plasma torch has an externally controlled field where the melted particles form a plasma, which in turn becomes a meta electrode. The electrode on the other side of the field is formed by the shown growth plate 1803. The covetic materials are accelerated through an acceleration zone 1821 and then deposited onto a surface. The created alloy and covetic materials continue to be deposited onto the growth plate and/or onto previously deposited materials in the impaction zone 1823. This technique for deposition results in a material where the carbon loading is homogeneous and in high concentration.

Input materials can be selected and varied so as to achieve particular properties exhibited materials. For example, and as shown, inputs to the plasma spray torch may include various input gasses 1812 as well as input metallics and/or carbon particles 1818. The foregoing inputs can be introduced into one or more input ports 1862. In some cases, the input metallics and or carbon particles are entrained within a flow of input gasses 1812. Furthermore, the growth plate can change its dimension and composition during ongoing deposition. For example, and as shown, the growth plate 1803 can initially be a substrate 1816, on top of which is deposited hot covetic materials in a torch stream that at least partially melts the substrate as the covetic materials are deposited. The deposited hot covetic materials cool from a molten or partially molten state to form quenched layers.

In this manner, any number of layers can be formed. The temperatures at the substrate and/or at or near the topmost layer can be controlled such that when a next layer of materials lands on the molten metal of the just formerly-deposited layer, the newly-deposited layer grows in a lateral way to produce single-layer graphene on the surface of this molten metal. This mechanism is distinguished from other techniques at least in that, in contrast to conventional metal melt methods 103, where carbon precipitates out of a molten metal slurry, application of the herein-disclosed plasma spray torch methods 104 results in quenching in a short time period such that there is insufficient time for the carbon to precipitate out of the matrix. Thus, covetic bonds remain intact throughout the layer. A few moments later, after the quenching has formed a solid of metal and well dispersed carbon, another layer is sprayed on top of that, and so on, thereby forming layers of single-layer graphene that was grown, captivated and quick-quenched to produce a true covetic material with extremely high carbon loading within the matrix. As one example, when using conventional metal melt methods 103 (see FIG. 1A), carbon loading might achieve 6% carbon metal. In contrast, when using plasma spray torch methods 104 (see FIG. 1A), 60% carbon loading is readily achieved. In some cases, tight control of inputs and process parameters of the plasma spray torch and its environment allow carbon loading to approach as much as 90% carbon in the resulting material.

Experimental results using plasma spray torches have shown that highly loaded, highly uniform covetic layers can be formed by at least two quick-quench (such as 'splat') methods. A first method brings in carbon particles to cover metal particles (such as in the plasma) and the resulting hot mixture is sprayed onto a much cooler substrate. A second method creates graphene in the plasma and then brings in molten metal that covers the graphene. In both cases, true covetic (referring to a combination of covalent and metallic chemical) bonding occurs while in the plasma plume, and the quick quenching of the spray serves to captivate the mixture into an organo-metallic lattice.

As shown in FIG. 18A2, the depth or thickness of the quenched layers 1824 can be caused to be thicker or thinner by controlling distances between the plasma flame 1814 and the substrate and/or by controlling the temperatures at the substrate 1816 (such as either higher or lower than ambient) and/or by controlling the pressures in and around the reactor.

Figure 18B:
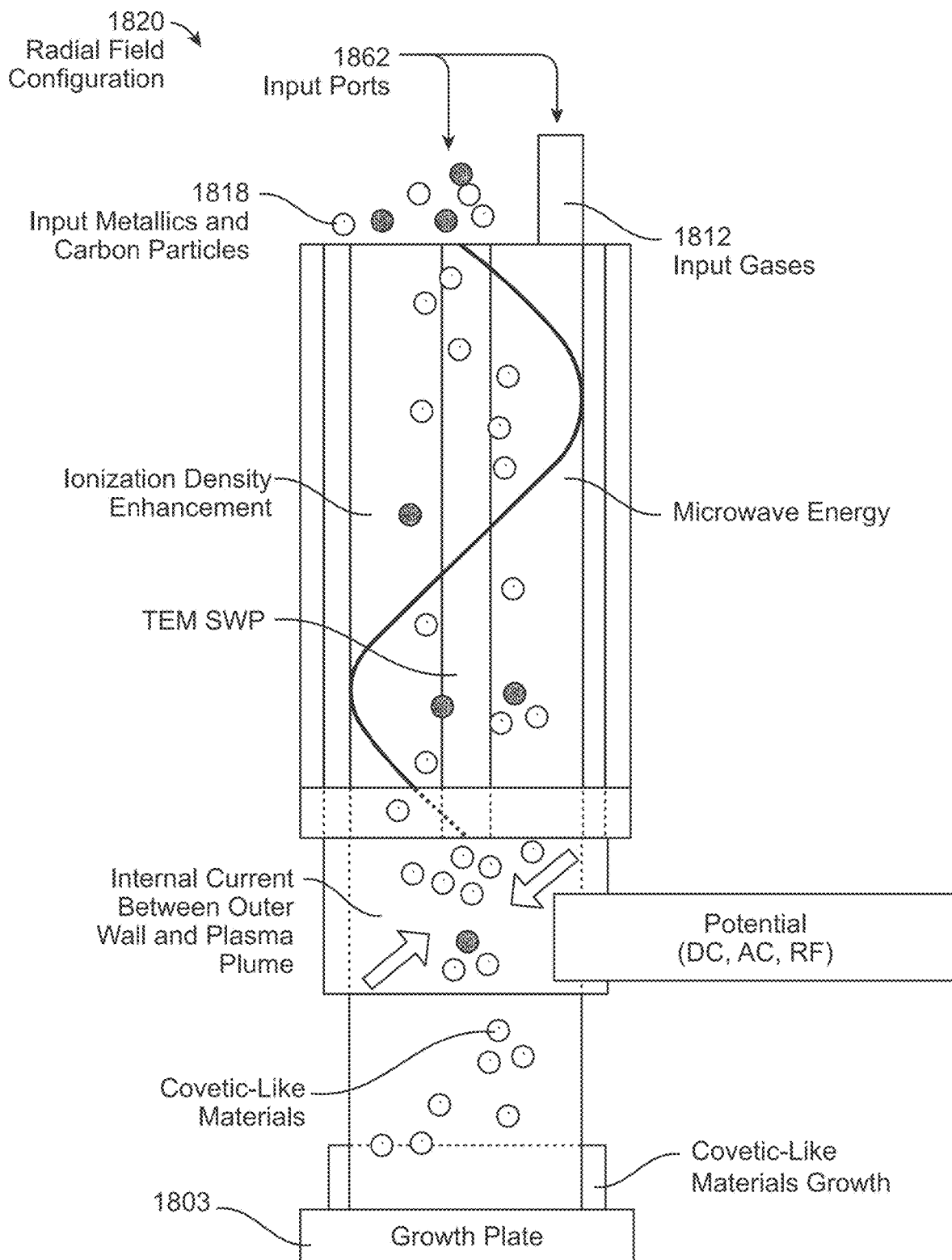

FIG. 18B depicts a radial field configuration 1820 of a plasma spray torch. In this configuration, the melted particles form a plasma within the torch, which plasma becomes a meta electrode. The other electrode is formed by the side of the internal wall.

The foregoing configurations of FIG. 18A1, FIG. 18A2, and FIG. 18B are merely examples. Other configurations involving different input materials and different input port configurations are possible without departing from the generality of the plasma spray torch disclosed herein. Moreover, different configurations involving different input materials and different input port configurations can achieve the same intended results. For example, two different configurations that are tuned to achieve the same resultant material are shown and described as pertains to FIG. 18C and FIG. 18D. Specifically, the example configurations of FIG. 18C and FIG. 18D can be used for plasma spray torch deposition of ceramic film materials onto carbon-containing particles (such as graphene-containing particles).

Indeed, thin film deposition of carbon-containing materials (such as via atmospheric pressure chemical vapor deposition (APECVD) and/or other variations of chemical vapor deposition (CVD)) have made their way into many areas of materials processing. Various composites and coatings involving such carbon-containing materials may exhibit improved physical properties (such as strength, imperviousness to corrosion, etc.). The morphological characteristics of various 2D and 3D carbons inure these improved physical properties to the composites and coatings by virtue of molecular-level configurations within the carbon-containing materials. In some cases, use of 2D and 3D carbons in composites and coatings greatly increases the resultant carbon-containing material's imperviousness to high temperatures; however, in some cases, these high temperatures rise above ~2100° C., which is high enough to burn the 2D and 3D carbons themselves. Unfortunately, destroying the 2D carbons and 3D carbons in turn destroys the benefit originally garnered by the carbons in the composite or coating. Therefore, deposition techniques (such as plasma spray torch configurations) are needed to create composites or coatings that are impervious to temperatures even higher than the combustion temperature of carbon.

Figure 18C:
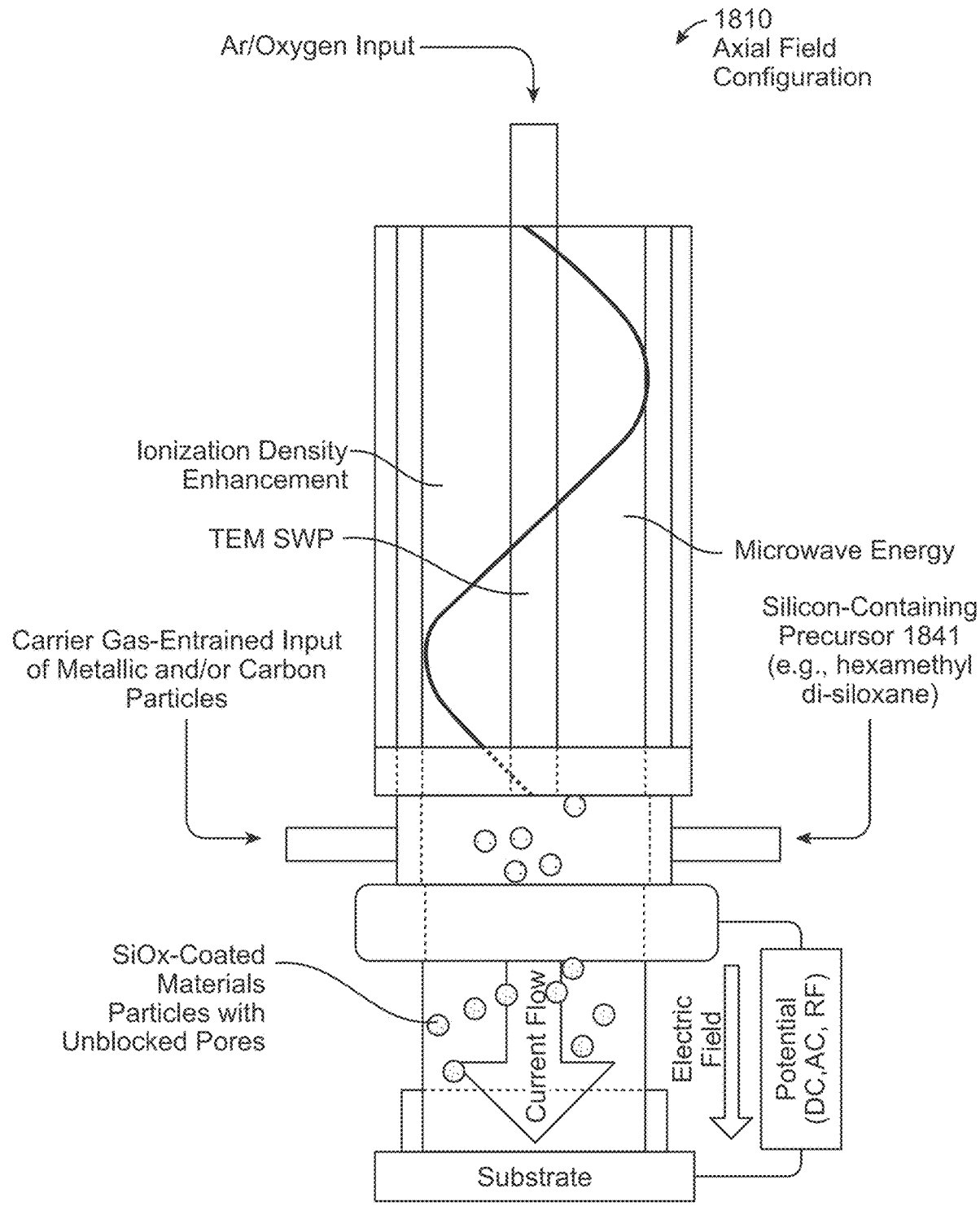

FIG. 18C depicts such a configuration, strictly as a non-limiting example. By tuning the inputs and various in-reactor conditions, graphene-containing materials can be coated with a heat-absorbing layer of organically modified silicon (ORMOSIL). The deposition of ORMOSIL ceramic materials onto graphene-containing materials can be achieved via several methods including through the process of atmospheric, reactive plasma-enhanced chemical vapor deposition using a silicon-containing precursor 1841 (such as hexamethyl di-siloxane) and a reactive gas such as oxygen. This particular mixture of the silicon-containing precursor and oxygen is made reactive within the plasma. The molecular dissociation that occurs within the plasma flame leads to deposition of silicon oxide onto surfaces such as the foregoing growth plate 1803. To accomplish this, in-reactor conditions are controlled such that an organically modified silicon ceramic is deposited onto surfaces of carbon-containing particles as they form in the reactor. Control of in-reactor growth and in-reactor deposition (such as by controlling APECVD processes) leads to a thin quartz coating around the carbon-containing particles, which are in turn deposited onto a substrate. The thin quartz coating acts as a flame-retardant layer to protect the carbon-containing particles from burning at elevated temperatures.

Figure 18D:
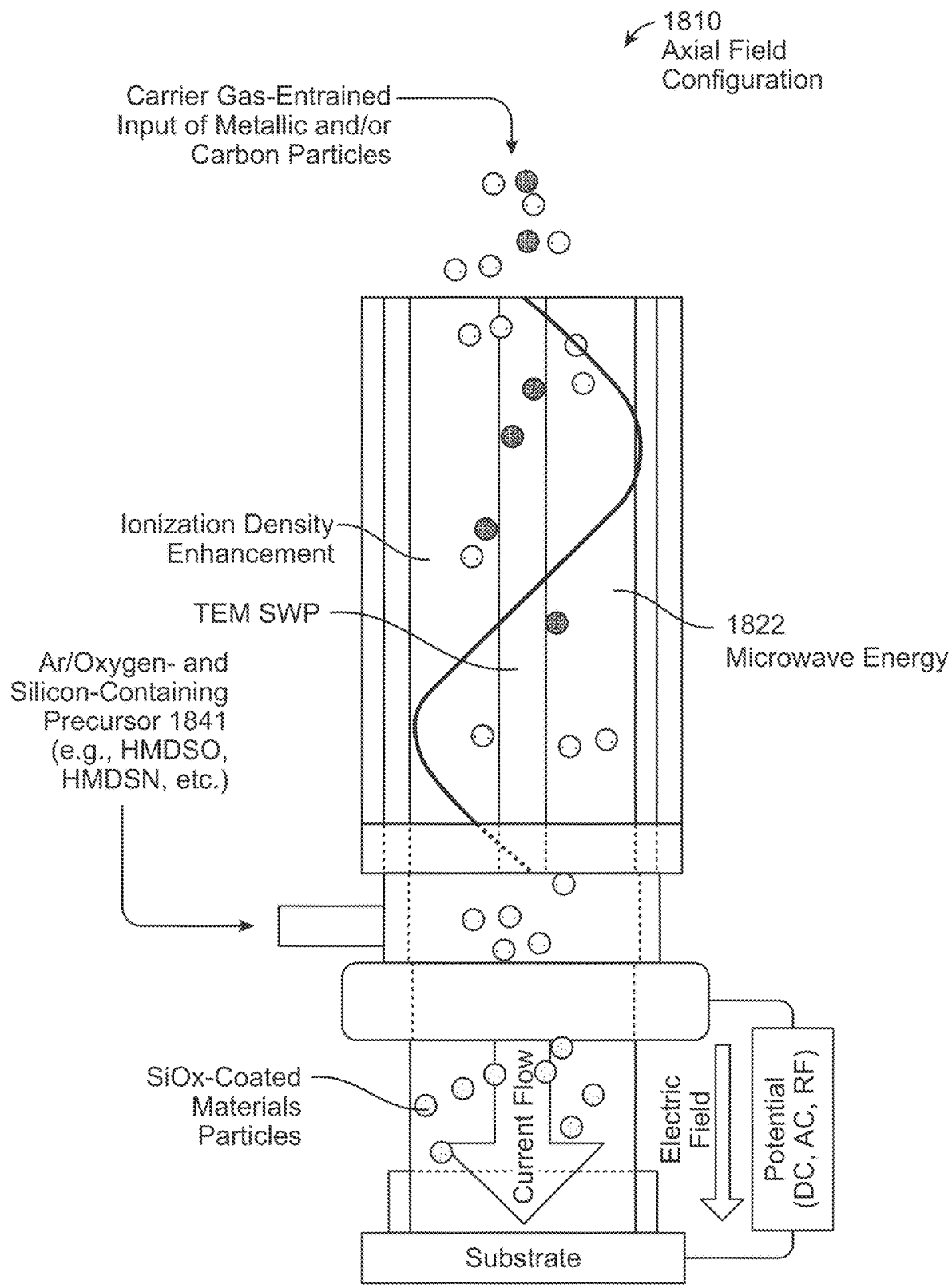

FIG. 18D depicts an alternative configuration, strictly as a non-limiting example. As shown, metallic and/or carbon-containing materials are input into the reactor. Microwave energy 1822 is controlled to achieve at least the temperature to dissociate the carbon-containing materials (such as T(c-dis) of FIG. 10). A silicon-containing precursor 1841 (such as HMDSO, HMDSN, etc.) is introduced into the plasma flame and the temperature is lowered in the plasma afterglow. As the temperature is lowered, carbon particles begin to form, becoming coated with the silicon oxide. The carbon particles coated with the silicon oxide are then deposited onto a substrate.

In one implementation, a thin layer of perhaps 10 nm thick of these 3D materials can be deposited onto a substrate, which won't burn or catch fire even at 1200° C. This is because pristine carbon (such as graphene) is crystallized, such as it's not an amorphous material. Rather, it has been reduced to a state where it simply won't burn anymore.

On one use case, the foregoing plasma spray torch techniques can be used to produce new types of solder that is non-eutectic. Or, as another use case, the plasma spray torch can spray a coating of material directly onto a substrate to prevent the underlying material from oxidizing.

In addition to forming materials that do not combust even at 1200° C. in atmospheric pressures, putting quartz around materials often yields huge advantages in applications.

Besides organically modified silicon, other organic substances can be used to coat the carbon particles or the carbon layers. Characteristics of the coating can be controlled. As one example, the pores of the surface of the sprayed-on materials can be tuned to be hydraulically smooth.

A plasma spray torch can be used to form a heat-absorbing, glass-coated, non-flammable graphene composed of graphene and silicon, where the silicon coats the graphene such that the graphene is able to withstand temperatures higher than 1600° C. Such a heat-absorbing, glass-coated, non-flammable graphene absorbs infrared energy.

One specific method for producing organically-modified silicon coatings comprises steps of (for example): (1) introducing a silicon-containing precursor into a plasma spray torch apparatus, (2) combining the silicon-containing precursor with a carrier gas having carbon particles that are entrained in the precursor gas, and (3) coating the carbon particles with silicon.

The characteristics of the flame-retardant and infrared obscurant materials that result from the plasma spray torch configuration of FIG. 18C and/or FIG. 18D can be tuned, at least in part, by controlling the time-temperature paths though the reactor. More generally, the characteristics of materials that result from the plasma spray torch configuration of FIG. 18A1, FIG. 18A2, FIG. 18B, FIG. 18C or FIG. 18D can be tuned, at least in part, by controlling (such as pulsing) the microwave energy within the reactor.

Figure 19:
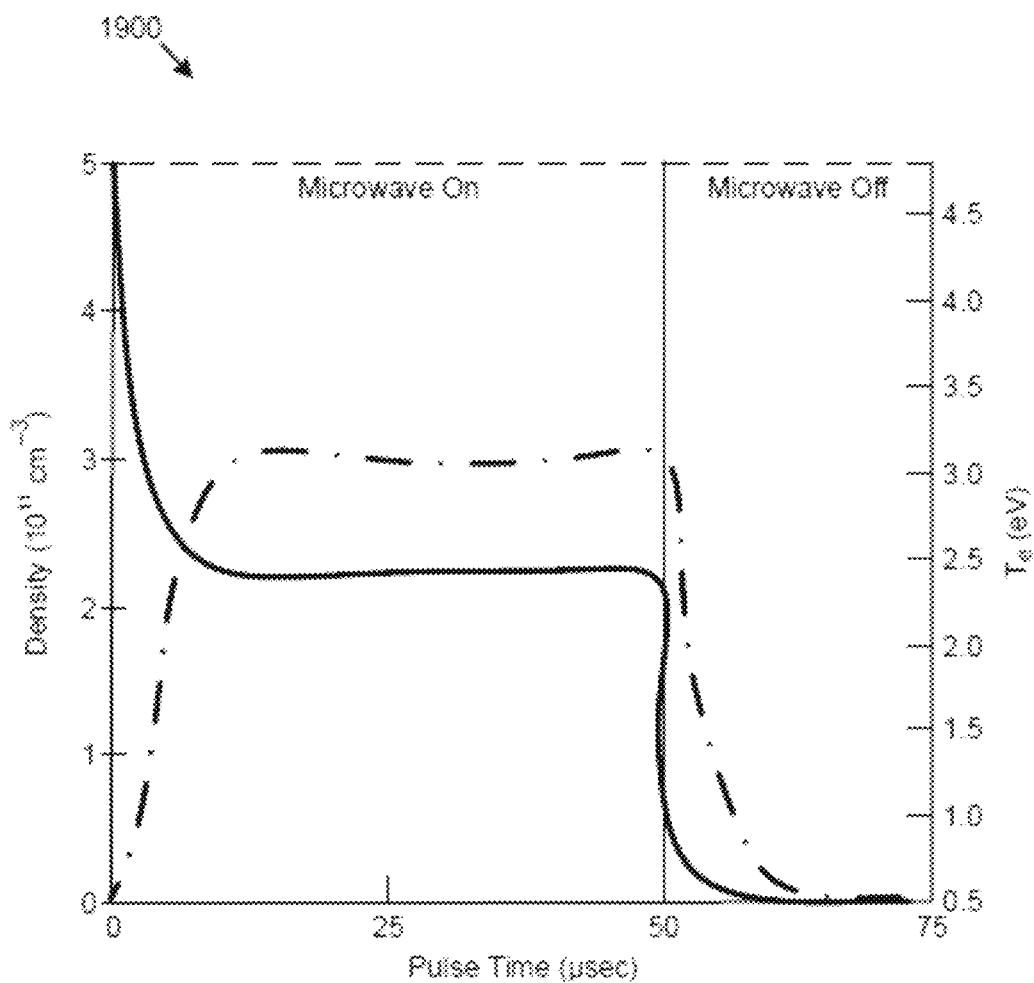
FIG. 19 is a chart that depicts energy versus time during pulse on and pulse off, in accordance with one or more of the disclosed implementations.

FIG. 19 is a chart 1900 that depicts energy versus time during pulse on and pulse off. More specifically, the chart shows one complete time cycle, from time T=0 through 50 microseconds with the microwave being continuously turned on, and then the remaining portion of the shown cycle depicts a time with the microwave being turned off. The plotted curves depict (1) changing density, and (2) changing temperature over the cycle. At time T=0, the temperature is at a minimum point (such as depicted at the origin of the chart). The temperature rises rapidly, then decreases, during which time the plasma density reaches a relatively stable value. When the microwave is turned off at time T=50 microseconds, both the plasma density and the temporal electron temperature decrease rapidly. The pulse time and duty cycle can be controlled so as to achieve a particular density and temperature at any point in time.

FIG. 20A1 depicts images that show organo-metallic bonding that occurs when combining carbon and copper using a plasma spray torch. As shown, carbon 2052 is deeply embedded within copper 2054. As commonly understood and as referred to herein, organometallic chemistry implies the study of organometallic compounds, chemical compounds containing at least one chemical bond between a carbon atom of an organic molecule and a metal, including alkaline, alkaline earth, and transition metals, and sometimes broadened to include metalloids like boron, silicon, and tin, as well. Aside from bonds to organyl fragments or molecules, bonds to 'inorganic' carbon, like carbon monoxide (metal carbonyls), cyanide, or carbide, are generally considered to be organometallic as well. Related compounds such as transition metal hydrides and metal phosphine complexes may be included in discussions of organometallic compounds, though strictly speaking, they are not necessarily organometallic.

Within organometallic chemistry, organocopper compounds contain carbon to copper chemical bonds, and may possess unique physical properties, synthesis, and reactions. Organocopper compounds may be diverse in structure and reactivity but remain somewhat limited in oxidation states to copper(I), such as denoted $Cu^+$. As a $d^{10}$ metal center, it is related to Ni(0), but owing to its higher oxidation state, it engages in less pi-backbonding. Organic derivatives of Cu(II) and Cu(III) may be invoked as intermediates but are rarely isolated or even observed. In terms of geometry, copper(I) adopts symmetrical structures, in keeping with its spherical electronic shell. Typically, one of three coordination geometries may be adopted: linear 2-coordinate, trigonal 3-coordinate, and tetrahedral 4-coordinate. Organocopper compounds form complexes with a variety of soft ligands such as alkyl phosphines ($R_3P$), thioethers ($R_2S$), and cyanide ($CN^-$).

By any one or more of the aforementioned techniques, the carbon depicted in FIG. 20A1 and FIG. 20A2 is chemically bonded to copper as opposed to merely being juxtaposed to copper to adhere thereto via van der Waals forces (such as referring to a distance-dependent interaction between atoms or molecules). Unlike ionic or covalent bonds, van der Waals attractions do not result from a chemical electronic bond; they are comparatively weak and therefore more susceptible to disturbance. Moreover, the van der Waals forces quickly vanish at longer distances between interacting molecules. Instead, what is desired is organo-metallic bonding between a metal and carbon.

FIG. 20A2 depicts images that are a graded composition of matter applied into a substrate material and showing three material property zones. The bulk metal zone 2066 is a first material property zone of these three material property zones. As shown, the first material property zone comprises a metal in a first crystallographic formation, the first crystallographic formation having substantially metallic bonds between metal atoms present in the first material property zone. This first material property zone is substantially adjacent to a second material property zone that at least partially overlaps the first material property zone. The covetic material zone 2064 comprises at least some carbon atoms in a second crystallographic formation, wherein the second crystallographic formation has at least some non-polar covalent bonds between some of the carbon atoms that are present in the second material property zone and the metal atoms that are present in the first material property zone. The top surface zone 2062 is a third material property zone that at least partially overlaps the second material property zone. This top surface zone comprises further carbon atoms that are oriented in a third crystallographic formation. The third crystallographic formation is characterized as having at least some non-polar covalent bonds between individual ones of the further carbon atoms that are present in the third material property zone. In various implementations, there may be some metal atoms in any of the zones, and there may be some carbon atoms in any of the zones. However, this implementation is characterized by a higher metal content zone 2074 that is adjoining to the bulk metal zone 2066. In various implementations, here may be some carbon atoms in any of the zones, and there may be some metal atoms in any of the zones. However, this implementation is characterized by a higher carbon content zone 2072 that is adjoining to the top surface zone 2062.

Figure 20B:
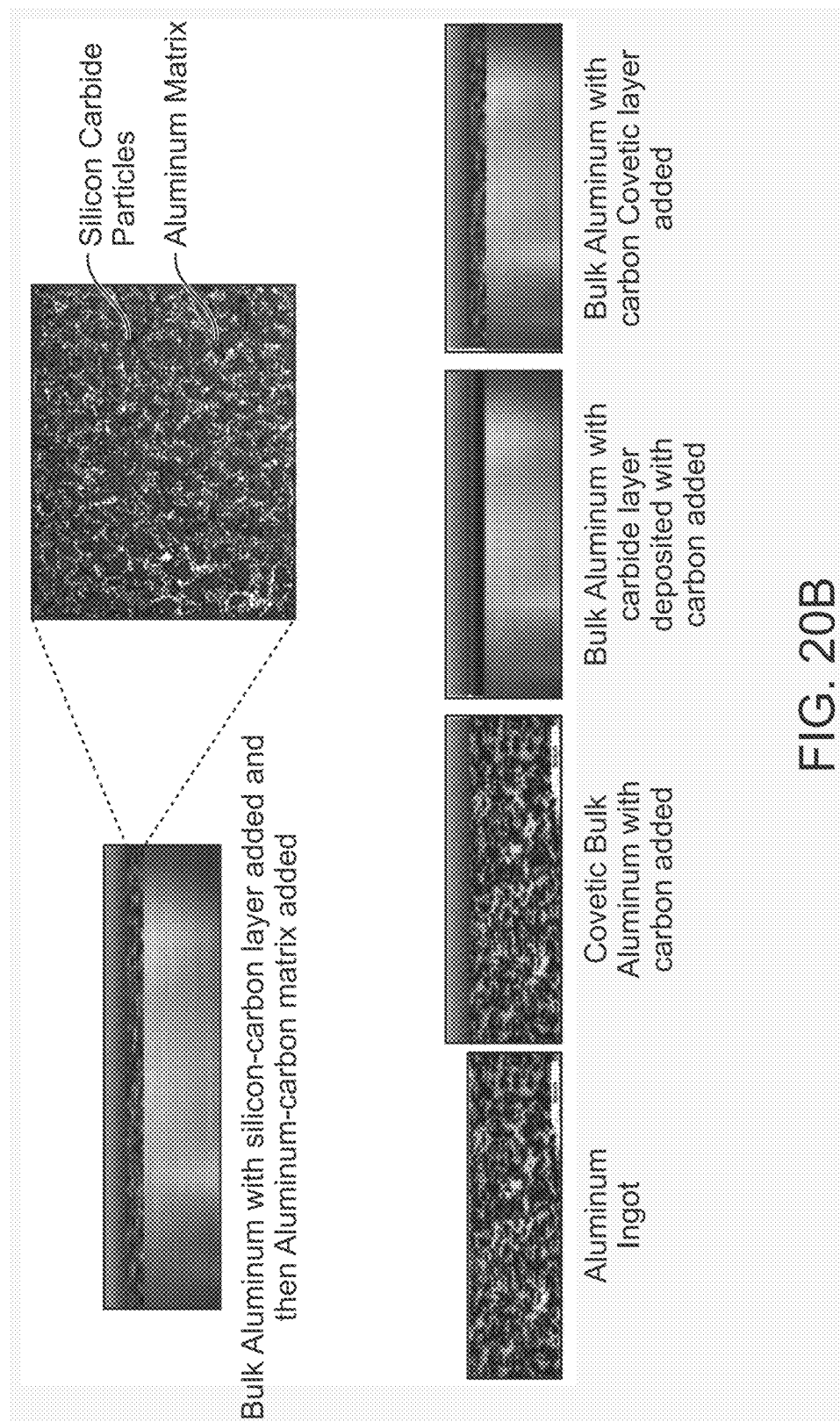
FIG. 20B is a materials evolution chart depicting several layered configurations that occur when adding carbon to bulk aluminum, in accordance with one or more of the disclosed implementations.

FIG. 20B is a materials evolution chart 20B00 depicting several layered configurations that occur when adding carbon to bulk aluminum. In these implementations, materials are sprayed onto an existing, carbon rich covetic substrate or carbide layer to create a carbon to carbon bond through carbon sintering and/or metal melt encapsulation, which in turn creates attachments to form a composite film. The materials evolution chart 20B00 is merely one example of a combinational material (silicon carbide) that is sprayed onto an aluminum bulk material. The process can be tuned to create a covetic or covetic-like film that is deposited onto bulk materials. The resulting materials then can be coated to create a functionalized top layer. One possible configuration of an apparatus for spraying combinational material onto substrate is given in FIG. 21A.

Figure 21A:
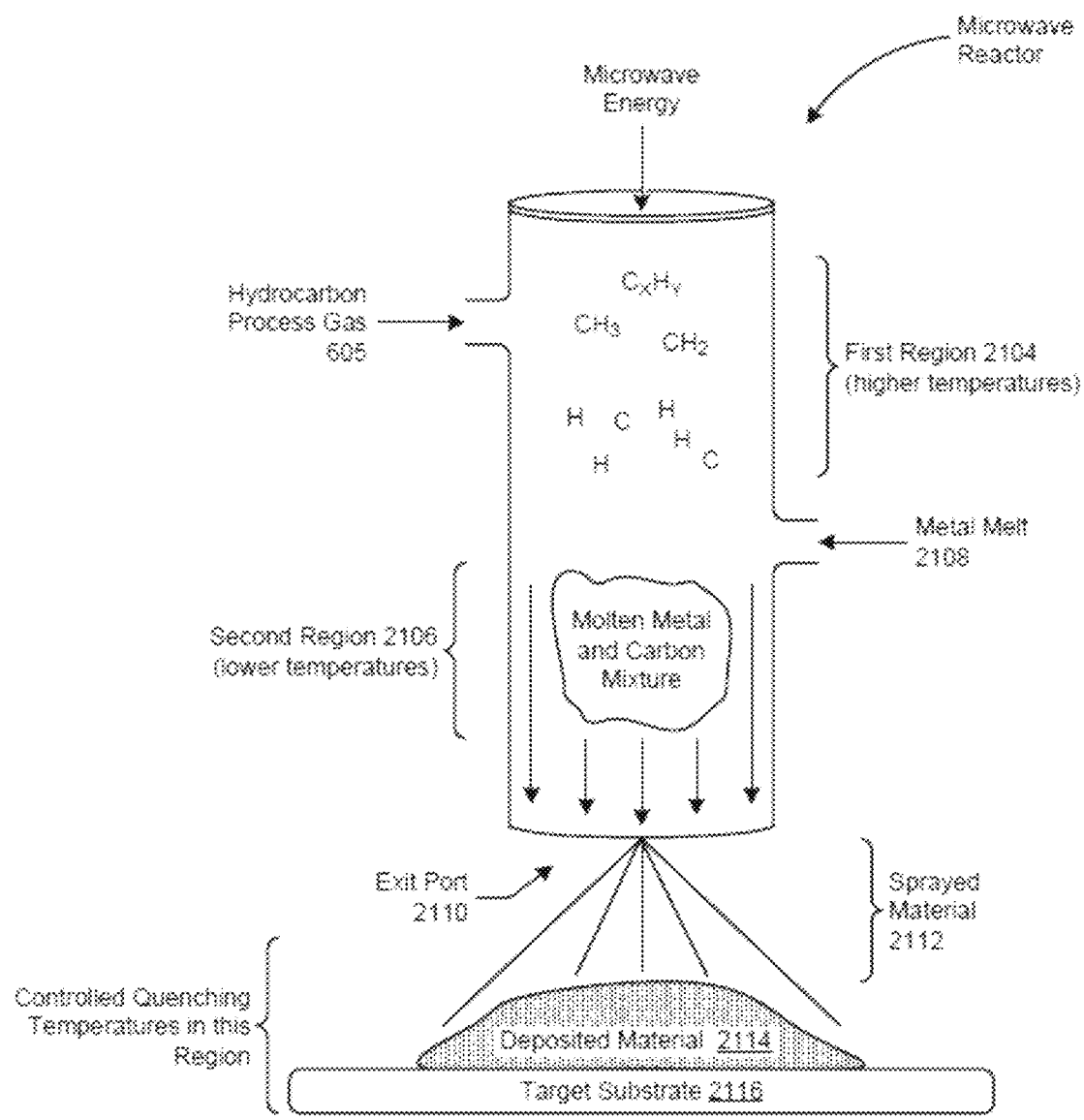
FIG. 21A depicts an apparatus for spraying a molten mixture of materials into a substrate, according to an implementation.
Figure 21C:
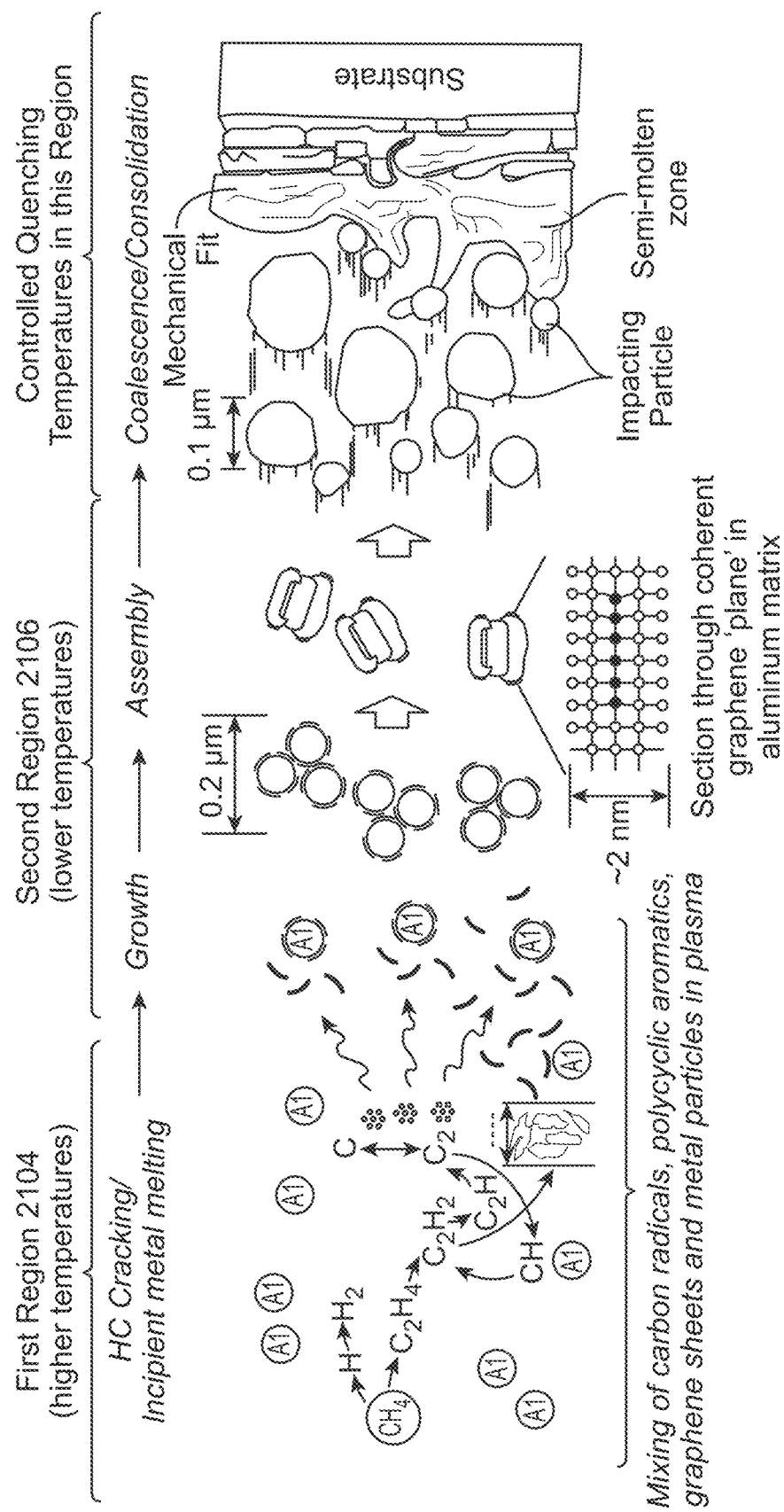
FIG. 21C is a schematic depicting a plasma spray process that is used for spraying a film, in accordance with one or more of the disclosed implementations.

FIG. 21A depicts an apparatus for spraying a molten mixture of materials onto a substrate. The figure depicts a microwave reactor that comprises multiple regions inside a containment vessel. Pulsed microwave energy is delivered into the containment vessel. A hydrocarbon process gas 605 is provided through an inlet port. The microwave energy heats the process gas to a high enough temperature to form plasma. The expansion of materials within the containment vessel creates a plasma plume. The continuous addition of materials into the containment vessel in combination with the aforementioned expansion results in a torch effect in and around the plume. Resulting from the high temperatures within and around the plasma plume, the carbon dissociates from the hydrogen, thus forming several different hydrocarbon species (such as $CH_3$, $CH_2$). As the temperature continues to increase (such as in the first region 2104, as shown), all or nearly all of the carbon atoms become dissociated from the hydrogen. Using any known technique (such as using a gas-solid separator), the hydrogen-only species are separated from the solid carbon species.

At the interface between the first region 2104 of the containment vessel and the second region 2106 of the containment vessel, molten metal or molten metal composite, or molten ceramic-metal, or metal matrix, or metal mixture of any sort is introduced through a second inlet into the containment vessel (as shown). The location of the second inlet is selected based on the dimensions of the plasma plume, and/or the temperature of the molten metal at the point of inlet into the containment vessel. More specifically, the metal melt 2108 is introduced into the reactor at a location where the molten metal mixes with the carbon species. As the mixture flows (such as at a high rate of velocity) through the containment vessel, the mixture cools to a lower temperature. The flowing mixture exits the containment at a high rate of velocity such that the mixture of carbon and molten metal is sprayed out of the exit port 2110. The mixture is deposited (such as via spraying sprayed material 2112) onto a target substrate 2116. Various mechanisms for controlling the uniformity of the sprayed material 2112 and/or the resulting deposited material 2114 are shown and discussed as pertains to FIG. 23A through FIG. 23D.

The temperatures in the second region are low enough that at least some of the carbon precipitates out of the mixture. However, most of the dissociated carbon remains in mixture with the molten metal. When the molten metal mixed with the carbon reaches the target substrate 2116, it cools into a solid. During the transition from a molten mixture to a solid deposit, carbon is trapped between layers of metal and carbon. At certain temperatures the carbon forms non-polar covalent bonds with the metal, thus resulting in covetic material. This covetic material exhibits a range of mechanical, thermal, electrical and tribological properties due to increased cohesion forces (such as non-polar covalent bonds) between the metal matrix and carbon.

Such covetic materials are a result of use of the pulsed microwave energy to control the energy distribution of the constituents of the materials in the first region and second region of the reactor. More specifically, the energy distribution of the constituents of the materials in the first region and second region of the reactor can be controlled in part by pulsing the microwave and in part by pre-melting the metal particles in an environment external to the chamber of the reactor (such as so as to introduce fully-melted or partially melted metal into the reactor chamber). Any known techniques can be used, singly or in combination to melt the metal particles. As such the degree and/or mixture of fully melted or partially melted particles can be controlled.

FIG. 21B depicts a method for spraying covetic materials onto a substrate. The method can be used in conjunction with the apparatus of FIG. 21A. As shown, the method is performed using a microwave reactor having an inlet for a process gas, an inlet for a metal melt, and an exit port. Prior to operation, the microwave reactor is configured with an inlet for hydrocarbon process gas, an inlet for a metal melt, and an exit port (operation 21B02). At operation 21B10, the inlet serves to introduce a hydrocarbon process gas into a first region of the reactor. Using the microwave energy, the temperature in the first region of the reactor is elevated such that the hydrocarbon process gas dissociates into carbon and hydrogen species before reaching the metal melt. A different inlet serves to introduce a metal melt into a second region of the reactor (operation 21B20). The elevated temperature in the second region is maintained until the dissociated carbon mixes with the metal melt (operation 21B30). The effect of the aforementioned plume operates to move the mixture into a third region of the reactor (operation 21B40). Movement away from the microwave energy source has the effect of reducing the temperature of the mixture until at least some of the carbon condenses out of the mixture (operation 21B50). However, even though the temperatures are reduced, the plasma torch effect serves to move the mixture through the exit port at a high rate of velocity (operation 21B60). As such, the molten mixture is sprayed onto a substrate (operation 21B70).

FIG. 21C is a schematic depicting a plasma spray process that is used for spraying a film. As shown, carbon radicals, polycyclic aromatics, graphene sheets, and metal particles are mixed at high temperatures in a plasma reactor (such as referring to the shown first region 2104). Nucleation occurs at these high temperatures, and as temperatures inside the reactor decrease (such as referring to the shown second region 2106), growth and assembly begins. One possible growth mechanism is depicted by the sub-micrometer sized aluminum particles being coated by few layer graphene. These sub-micrometer sized aluminum particles are held together with a combination of metallic bonds, non-polar covalent bonds, and covetic bonds. More specifically, and as shown at the 2 nm scale, carbon atoms are bonded to aluminum atoms. The carbon atoms are organized into a coherent graphene plane that is situated in the aluminum matrix, preferably interlaced between basal planes of the aluminum matrix. The foregoing discussion involving aluminum is merely an example. Other metals can be used. In fact, a coherent graphene plane can be situated (again, preferably between basal planes) not only in a face-centered cubic (FCC) metal lattice, but also in a body-centered cubic (BCC) metal lattice, or in a hexagonal close packed (HCC) metal lattice.

The foregoing coated particles are then sintered to form particles that have diameters on the order of 100 μm. These semi-molten particles are then accelerated through the reactor and impacted onto a substrate (such as in a first pass), or onto a previously deposited layer of impacted particles (such as in a second or Nth pass).

Figure 22A:
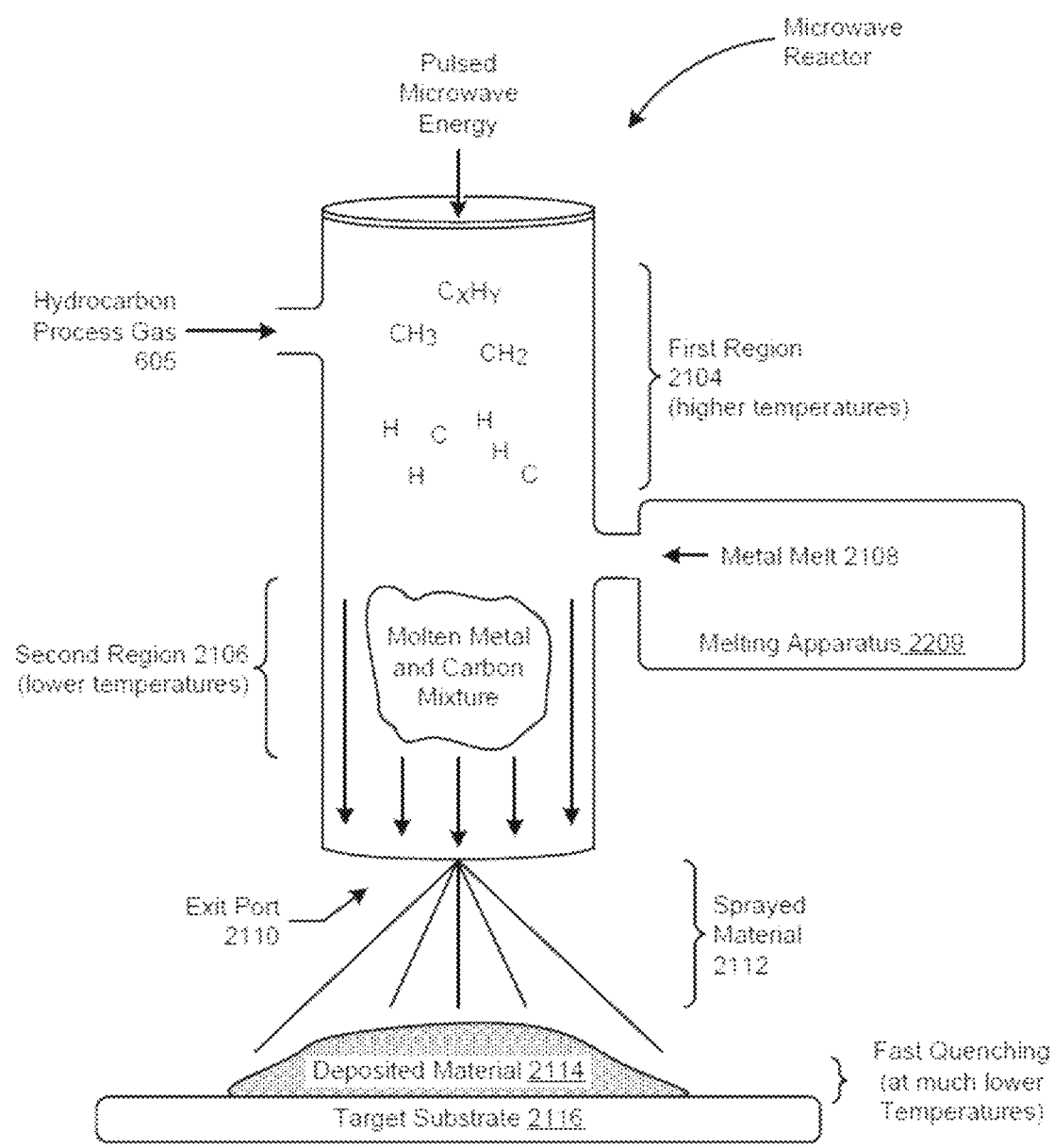
FIG. 22A depicts an apparatus for wrapping carbon particles with a molten material, e.g., a metal, in accordance with one or more of the disclosed implementations.

FIG. 22A depicts an apparatus for wrapping carbon particles with a molten metal. The configuration of the apparatus of FIG. 22A differs from the configuration of the apparatus of FIG. 21A at least in that the introduction of the molten metal is controlled using the melting apparatus 2209. The metal melt is controlled so as produce molten metal that wraps around carbon particles when the molten metal is introduced into the reactor.

Figure 22B:
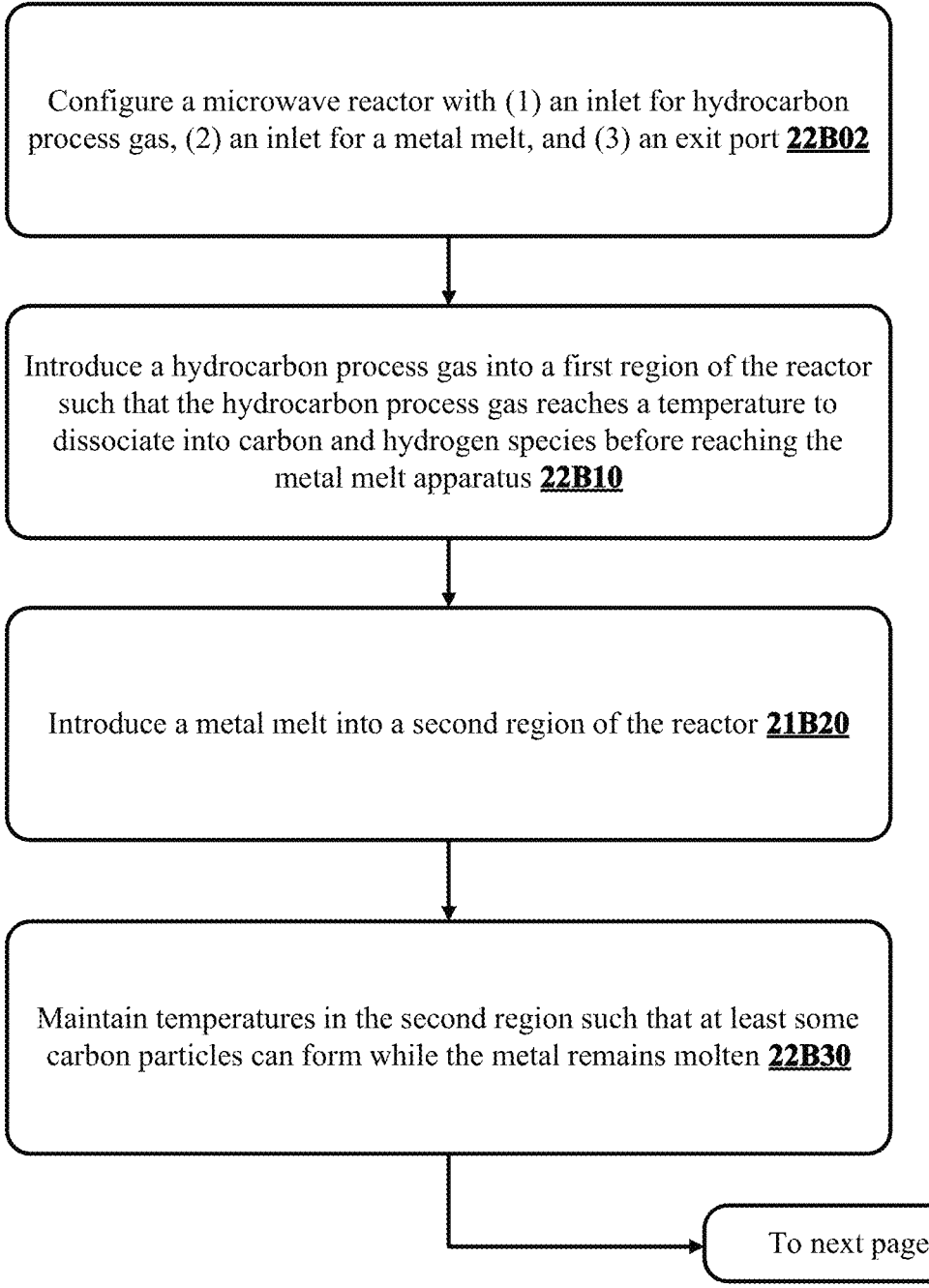
FIG. 22B depicts a method for wrapping carbon particles with a molten material, e.g., a metal, in accordance with one or more of the disclosed implementations.

FIG. 22B depicts a method for wrapping carbon particles with a molten metal. Prior to operation, the microwave reactor is configured with an inlet for hydrocarbon process gas, an inlet for a metal melt, and an exit port (operation 22B02). At operation 22B10, the inlet serves to introduce a hydrocarbon process gas into a first region of the reactor. The method differs from the method of FIG. 21B at least in that, in operation 22B30, the temperatures in the different regions of the reactors are maintained such that some carbon particle species form from the dissociated carbons. The effect of the aforementioned plume operates to move the mixture into a third region of the reactor (operation 22B40).

In operation 22B50, at least some of those carbon particles become wrapped by the molten metal. Some bonds are formed between constituent atoms of the carbon particles and atoms of the metal melt. In operation 21B60, the metal-wrapped carbon particles moved through the exit port, further reducing the temperature. When the metal-wrapped particles are deposited onto the substrate (operation 21B70) further bonds are formed between the metal-wrapped carbon and the metal of the substrate.

FIG. 23A, FIG. 23B, FIG. 23C, and FIG. 23D depict example deposition techniques, according to some implementations.

Figure 23A:
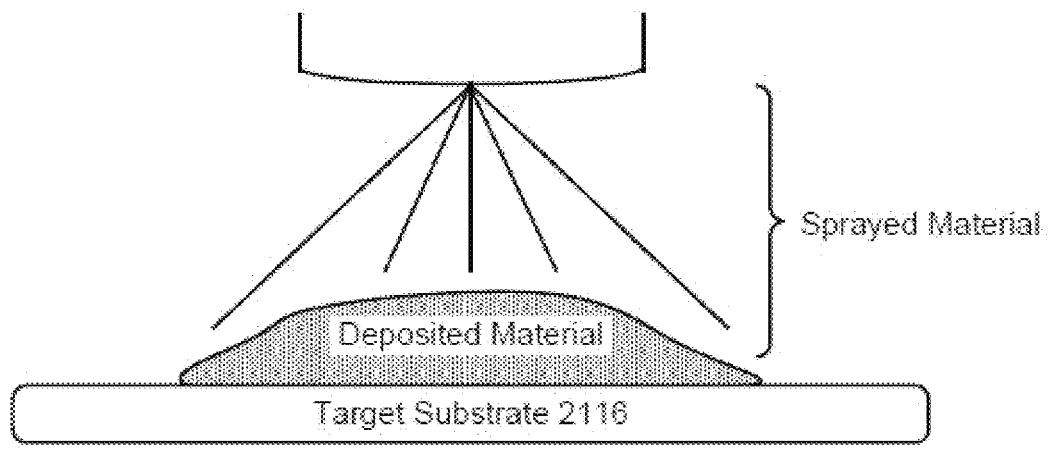
FIG. 23A, FIG. 23B, FIG. 23C, and FIG. 23D, depict example deposition techniques, in accordance with one or more of the disclosed implementations.
Figure 23B:
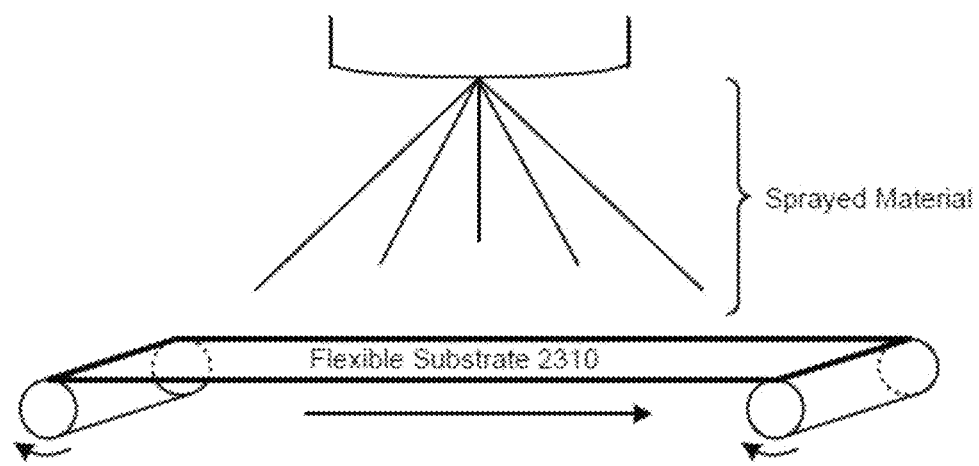
Figure 23C:
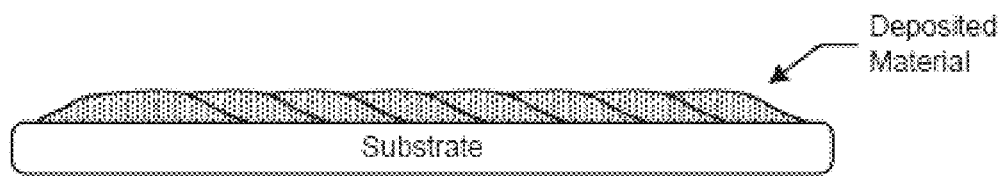

As shown in FIG. 23A, the deposited material has a curved shape that is characterized by a middle region of a higher height and end regions of a lower height. In some cases, this is a desired shape for a spot of deposited material. In other cases, it is desirable to spray deposited materials over larger areas. This can be accomplished by moving the substrate with respect to the spray, or by moving the spray with respect to the substrate. FIG. 23B depicts a flexible substrate 2310 that is dispositioned onto a supply reel. The flexible substrate can be drawn onto and around a take-up reel. As such, and in the configuration of FIG. 23B, the spray deposits covetic materials uniformly onto the moving substrate. When the relative movement between the sprayed material 2112 and the substrate is controlled, the resulting deposited materials are of uniform thickness.

Figure 23D:
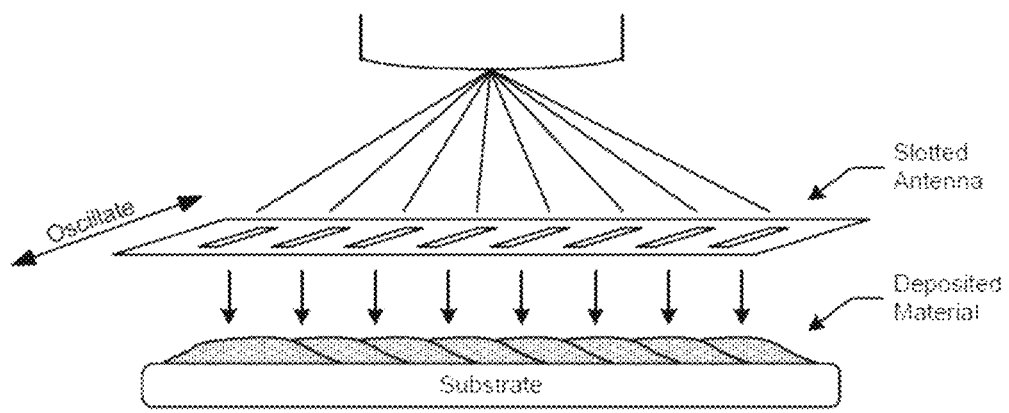

In some situations, it is desired to have a non-flat, but uniform patterning at the surface of the deposited materials. In such a situation, the movement of the substrate can be stepped through a series of discrete positions, thus resulting in the patterning of FIG. 23C. Additionally, or alternatively, a slotted antenna can be disposed between the sprayed material 2112 and the substrate. The slotted antenna functions by distributing the spray evenly across the lateral distance of the slotted antenna. Using such a slotted antenna, a single spot of sprayed material 2112 can have thickness and surface uniformity substantially as shown in FIG. 23D.

Figure 24A:
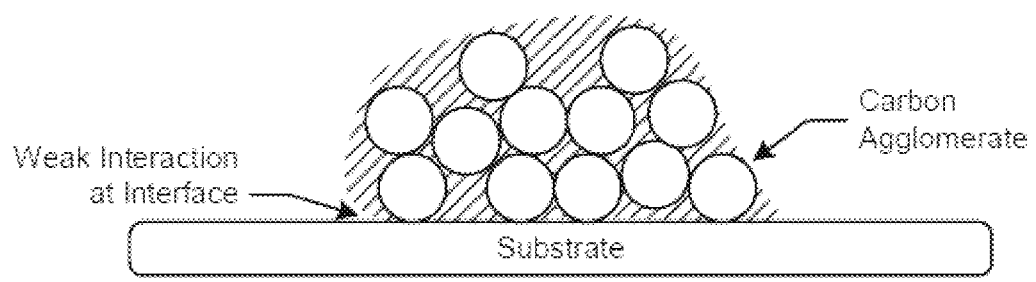
FIG. 24A and FIG. 24B depict simplified schematics of materials formed via conventional deposition techniques for placing said materials onto a substrate, in accordance with one or more of the disclosed implementations.
Figure 24B:
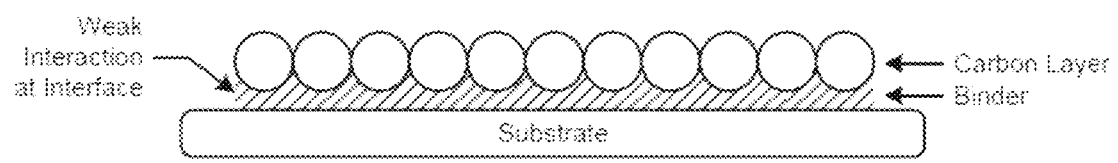

FIG. 24A and FIG. 24B depict conventional techniques for deposition of materials onto a substrate. As shown in FIG. 24A, a carbon agglomerate is held together through use of a binder (such as polymerics). This results in weak binding at the interface between the carbon agglomerate and the substrate. FIG. 24B depicts a coating of carbon materials onto a substrate using a binder. Conventional deposition using binders suffers from peeling. Moreover, even when the surface of the substrate is mechanically pretreated and/or pretreated with deposition of binder material, the interactions between the substrate and the carbon agglomerate are weak.

As heretofore described, coatings based on deposition of materials onto a substrate using binders and/or using coating techniques (such as such as are shown and described as pertains to FIG. 24A and FIG. 24B) suffer from peeling, low strength properties and other undesirable mechanical properties. Improvements based on plasma spray techniques are shown and discussed in FIG. 25A and FIG. 25B.

Figure 25A:
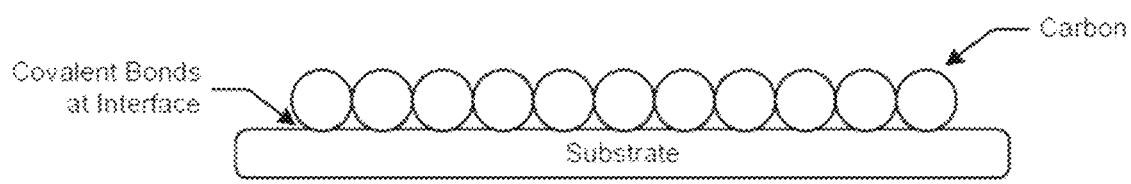
FIG. 25A and FIG. 25B depict simplified schematics of materials formed using inventive deposition techniques that result in non-polar covalent bonding at the surface of a substrate, in accordance with one or more of the disclosed implementations.
Figure 25B:
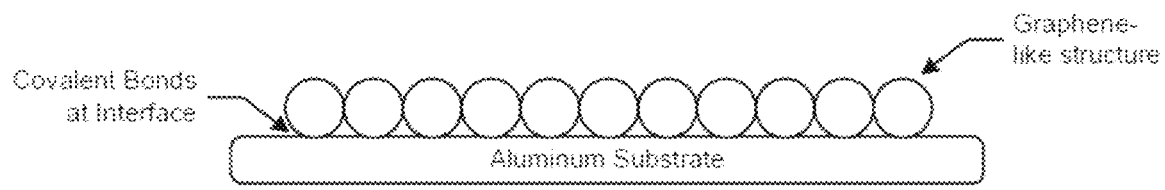

FIG. 25A and FIG. 25B depict example deposition techniques that result in non-polar covalent bonding at the surface of a substrate, according to some implementations. Specifically, and as shown, when the herein-disclosed techniques are used, covetic materials are formed by non-polar covalent bonds between the carbon and the substrate. As such, no binder is needed or used. Furthermore, many of the non-polar bonds formed at the interface between the substrate and the covetic material are strong covalent bonds. In one specific case, where the substrate is aluminum, non-polar covalent bonds are formed between atoms that are in the face-centered cubic structure of aluminum and atoms of carbon that are in a hexagonal structure. A schematic of interfacial bonding is depicted in FIG. 25B.

FIG. 26A, FIG. 26B, FIG. 26C, and FIG. 26D present schematic diagrams that depict how non-polar covalent bonds are formed between sites in the square shapes of a face-centered cubic structure of aluminum and sites in the hexagonal shapes that occur in certain crystallographic structures of carbons.

Figure 26B:
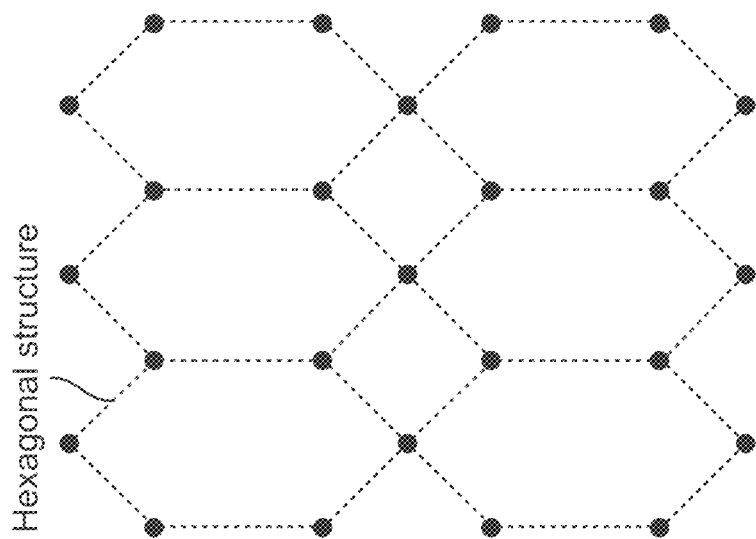
FIG. 26A, FIG. 26B, FIG. 26C, FIG. 26D, and FIG. 26E depict schematic diagrams that illustrate how non-polar covalent bonds are formed between sites in the square shapes of a face-centered cubic (FCC) structure of aluminum and sites in the hexagonal shapes that occur in certain crystallographic structures of carbons.
Figure 26A:
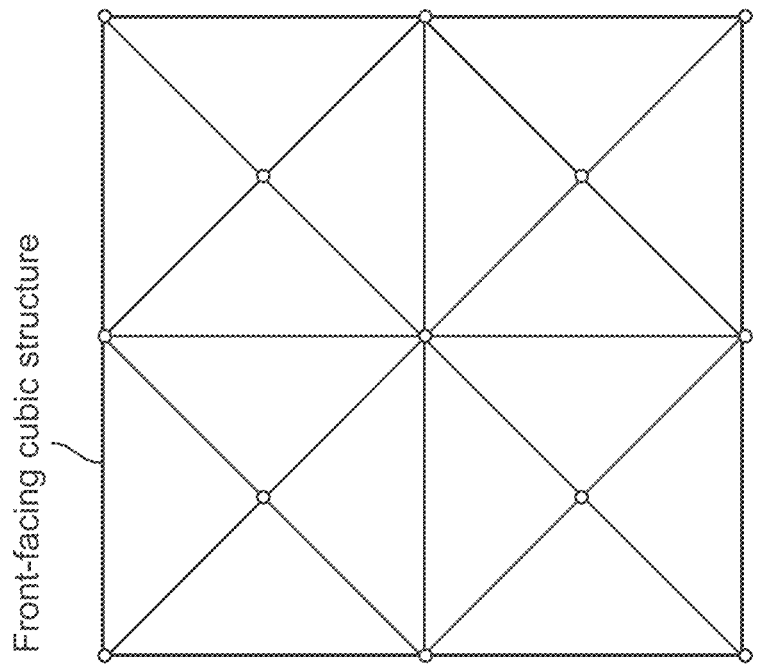

FIG. 26A is an orthogonal view showing the square shapes of face-centered cubic structure of aluminum. FIG. 26B is an orthogonal view showing the hexagonal shapes that occur in certain crystallographic structures of aluminum.

Figure 26D:
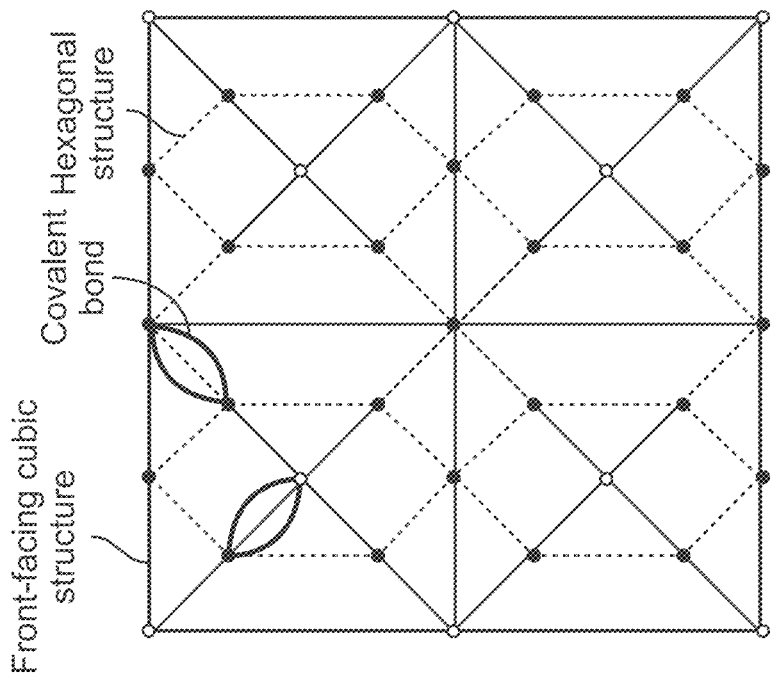
Figure 26C:
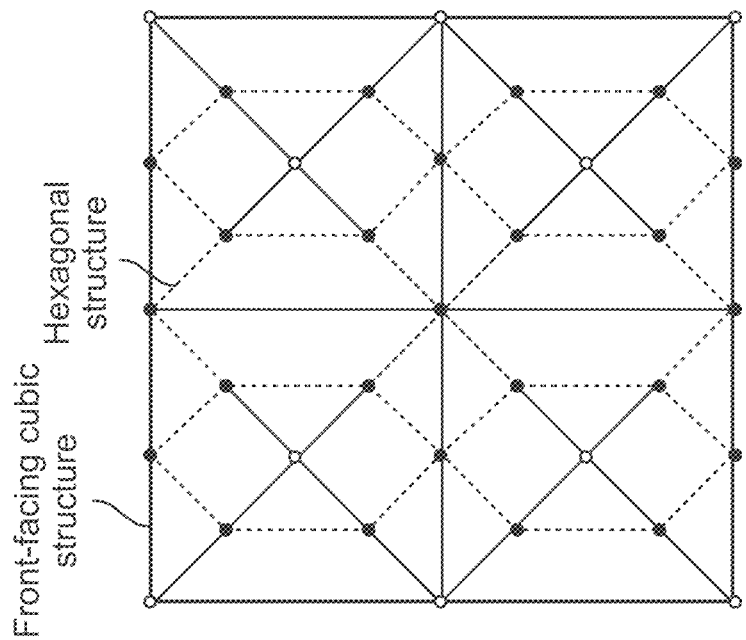

FIG. 26C depicts one possible superposition of the hexagonal shapes that occur in certain crystallographic structures of carbons on top of the square shapes of face-centered cubic structure of aluminum. FIG. 26D depicts non-polar covalent bonds that are formed at certain sites. The example of the face-centered cubic structure of aluminum is merely one example. Other metals having other crystallographic structures are possible. Unexpected properties exhibited by some embodiments are postulated to be caused by non-polar covalent bonding between carbon and metal atoms being sufficient/effective to "trap" all or substantially all (e.g., at least 90%, at least 95%, at least 98%, at least 99%, etc.) of the "free" electrons typically present in compounds exhibiting metallic bonding, thus altering the properties typically associated with presence of "free" electrons in metals and metal-containing compounds. For instance, certain implementations may be characterized by surfaces of the inventive compositions of matter having effectively no "free" electrons, and thus exhibiting reduced thermal and/or electrical conductivity. Moreover, for implementations having effectively no "free" electrons, the surfaces of the inventive compositions do not oxidize when exposed to ambient air.

Figure 26E:
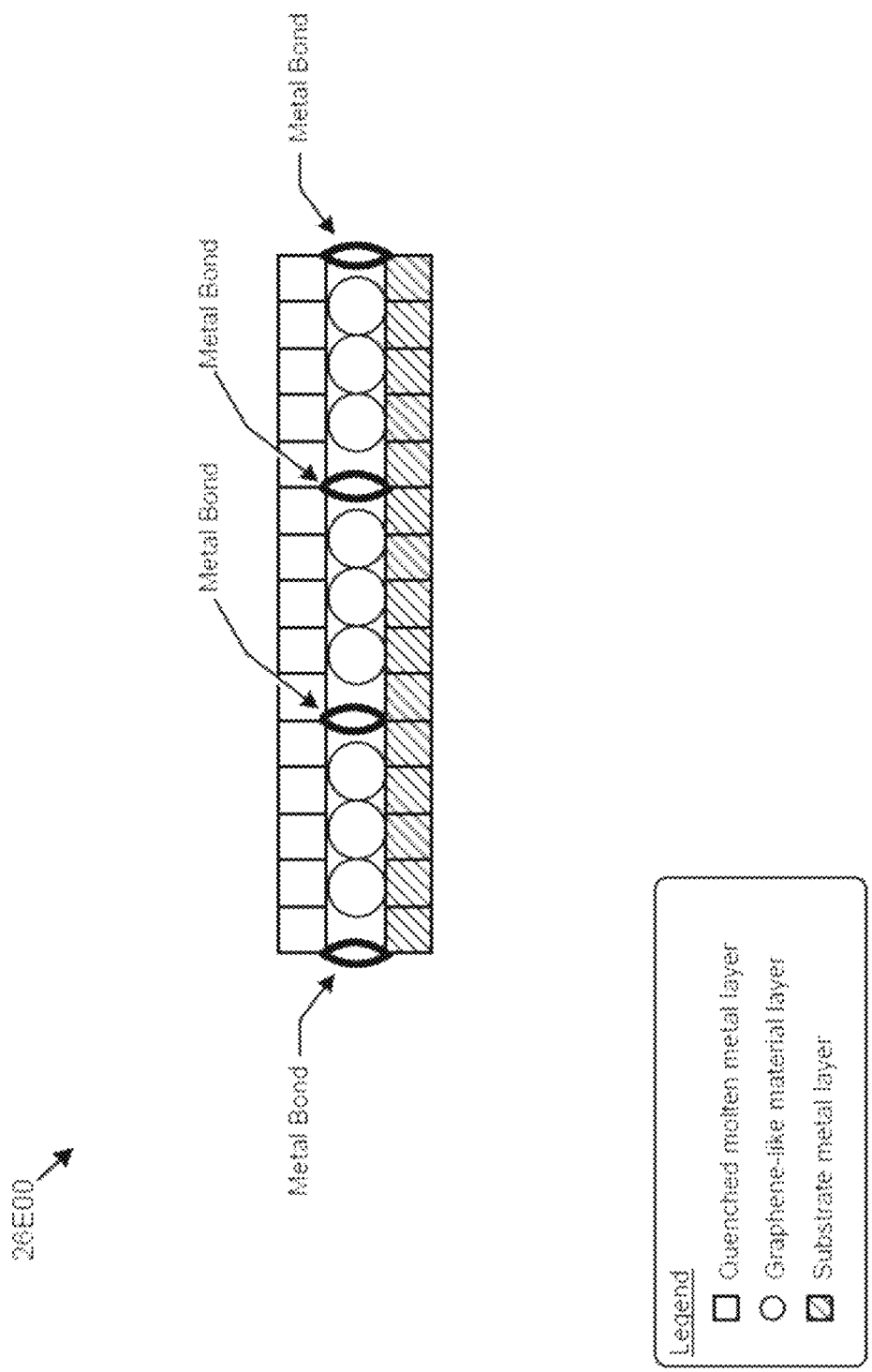

FIG. 26E is an example of a layered covetic material 26E00, where a graphene-like structure is sandwiched between layers of metal material. The lower layer of metal material is a layer of substrate. The top layer of metal material is formed of quenched material that was formerly molten while in the reactor. The graphene-like structure that is sandwiched between layers of metal material is captured between the two layers of metal due to the formation of metal-to-metal bonds between the two metal layers. In addition to the metal bonds, other bods are formed that serve to encase the graphene-like material between the metal layers. In some locations, there are defects in the carbon lattice. Various types of bonds are formed between or near such defects.

Any or all of the foregoing techniques for forming covetic materials can be used in many applications involving many different types of substrates. Moreover, the relative movement between the spray and the substrate can be controlled so as to result in deposits of any thickness. Any known techniques can be used to control the relative movement. For example, the exit port can be moved over a stationary substrate. This can be accomplished using a hand-held device or a robotically controlled device that is moved relative to the stationary substrate. In some cases, the substrate can be subjected to a bias voltage such that at least some of the material that is sprayed out of the exit port is electrostatically attracted to the surface of the substrate. This has applicability in applications where the substrate is not uniformly flat. As examples, applications where the substrate is not uniformly flat may include: (1) shaped components that are used in machinery that is subjected to corrosively harsh conditions, (2) turbine blades, (3) heat exchanger components, etc., many of which applications are further discussed infra.

In other situations, characteristics (such as thickness, lateral uniformity, etc.) of the deposition can be enhanced through use of and/or combinations of various chemical vapor deposition techniques. Strictly as one example, aspects or parameters pertaining to known-in-the-art plasma enhanced chemical vapor deposition techniques can be controlled so as to optimize characteristics of the deposited layers of covetic materials. As another example, rather than depositing covetic materials onto a surface to form a film or coating, covetic materials can be formed into particles (such as by spraying into a lower temperature environment) and collecting the particles as a powder. Various techniques involving production and use of powered covetic materials are briefly discussed hereunder.

Powdered Covetic Materials

In some situations, rather than forming covetic materials as a film or coating on or in a substrate, covetic materials can be delivered as a covetic material powder. Such a powdered covetic material can be collected as it exits the reactor, cooled to a temperature below the melting point of the covetic material and collected as a powder. The powder in turn can be handled (such as stored and shipped, poured, mixed, etc.) at room temperatures. The powder can then be remelted and pressed into a form or remelted and re-sprayed. As examples, components for use in highly corrosive environments can be formed from such powdered covetic materials using injection molding or extrusion. Many apparatuses can be used, singly or in combination to form and transport covetic material powders. Example apparatus are shown and described as pertains to FIG. 27A, FIGS. 27B1 and 27B2.

Figure 27A:
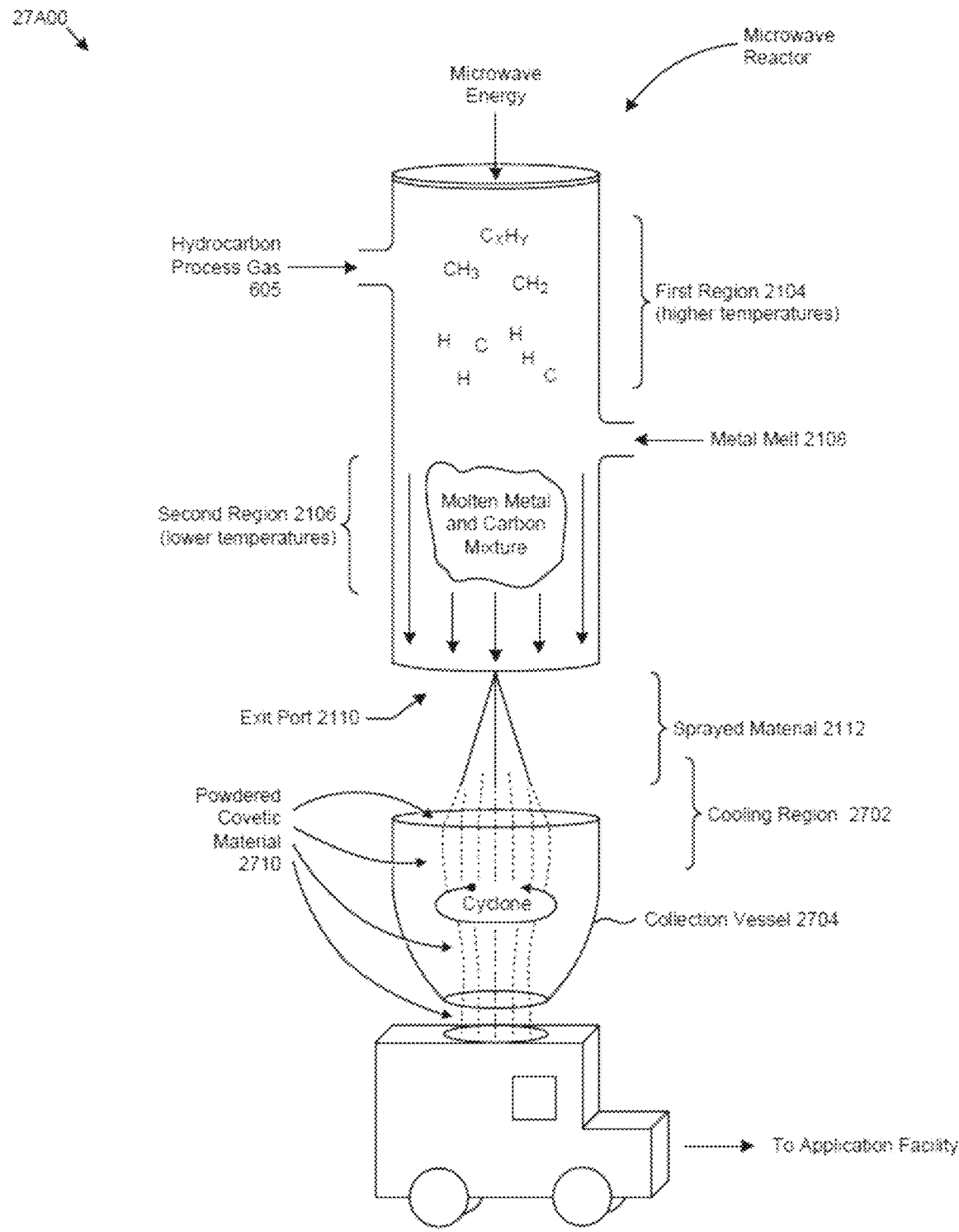
FIG. 27A depicts an example apparatus for producing a material, e.g., a covetic material, in a powdered form, in accordance with one or more of the disclosed implementations.
Figure 27C:
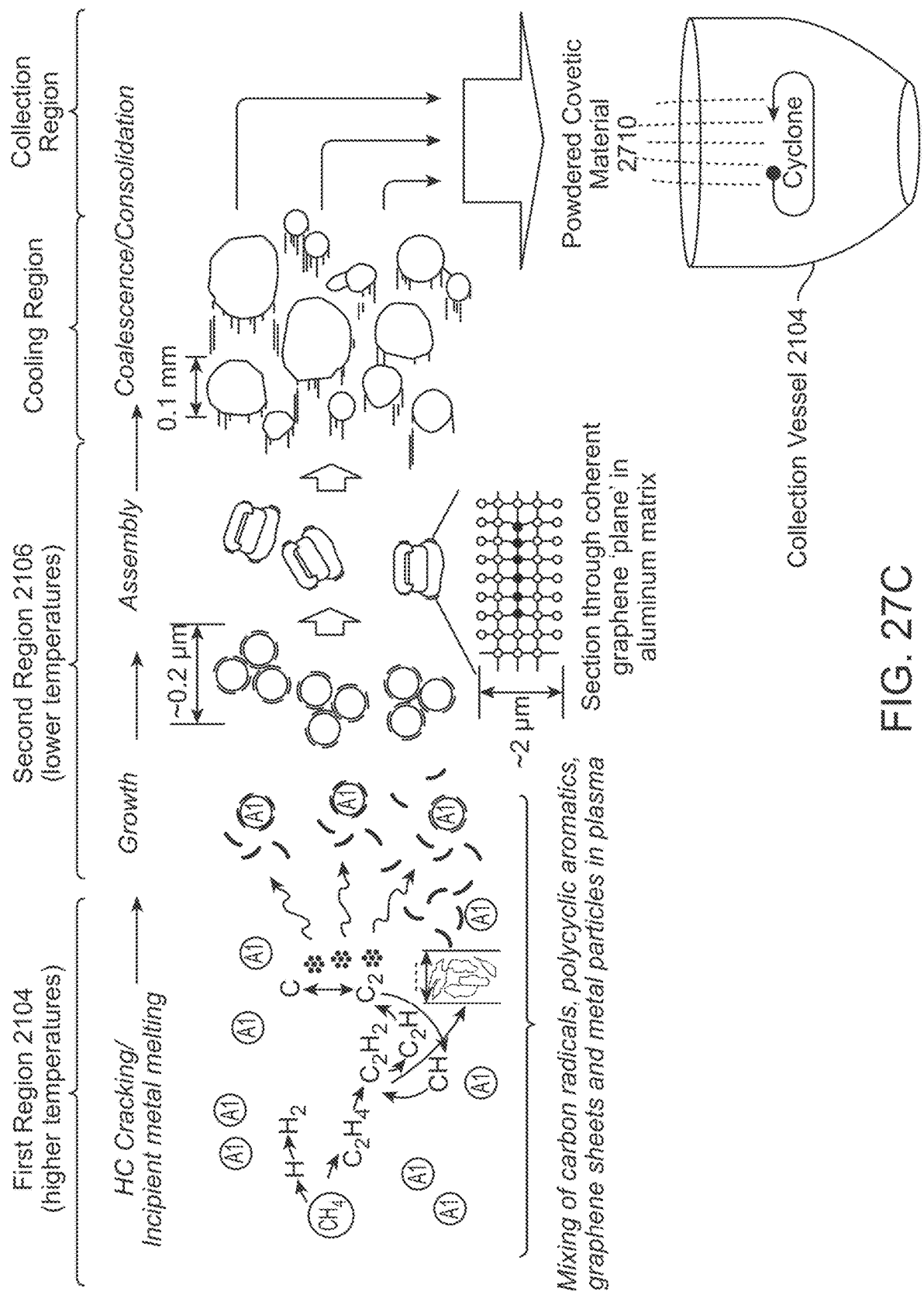
FIG. 27C is a schematic depicting a plasma spray process that is used for production of a powdered material, e.g., powdered covetic material, in accordance with one or more of the disclosed implementations.

FIG. 27A depicts an example apparatus 27A00 for producing powdered covetic material 2710 using a cooling region 2702 to cool the sprayed material 2112 when the spray is forced through an exit port 2110 of a microwave reactor. Any one or more cooling techniques in any combination can be used to lower the temperature of the covetic material in cooling region 2702 to a temperature that is lower than the melting point of the covetic material. The cooling region 2702 might host one or more apparatuses to cause the cooling. For example, and as shown, a collection vessel 2704 might be fitted with one or more apparatuses to cause a cyclone effect in the collection vessel, thereby increasing the time for lowering the temperature of the covetic material. In some cases, the time for cooling the covetic material is controlled (such as by increasing or decreasing the time) so as to allow the covetic material to anneal with highly regular bonding. In some cases, controlling the time during which the covetic material is cooled allows for the covetic material to crystalize into highly regular crystalline structures, while still remaining in powered form. In some implementations, a mechanical tumbler-agitator can be fitted between the exit port 2110 of the microwave reactor and collection vessel 2704. The tumbler-agitator can be cleaned or replaced periodically.

Alternatively, or additionally, and in situations where it is convenient and/or necessary to contain and/or transport powdered covetic material in a fluid, a fluidized bed apparatus can be used. For example, to avoid formation of aggregates and/or agglomerates of particles of the powder, the powdered covetic material can be held (e.g., suspended) in a liquid. In some implementations, a fluidized bed apparatus can be fitted between the exit port 2110 of the microwave reactor and collection vessel 2704. One implementation of such a fluidized bed apparatus is shown and described as pertains to FIG. 27B1 and FIG. 27B2.

FIG. 27B1 and FIG. 27B2 depict an example fluidized bed apparatus 27B00 for cooling and handling powdered covetic materials in a fluid.

As shown, the molten metal and carbon mixture is forced through the exit port of the reactor and into the top of a fluidized bed 2750. As the molten metal and carbon mixture is forced out of the exit port, it is cooled in a manner that form particles. The particles are acted on by a downward force of gravity (such as in a downward direction, as shown) while at the same time a process fluid 2754 is forced from the bottom of the fluidized bed to create an upward force. As such, the particles accelerate toward the bottom of the fluidized bed at an acceleration rate slower than that of the local gravity. The flow dynamics can be partially modulated by the geometry of the fluidized bed. For example, and as shown, a length of the fluidized bed can form a tapered body 2762 where a first end of the tapered body has a first dimension D1 and where a second end of the tapered body has a second dimension D2, and wherein D1>D2. The temperature within various portions of the fluidized bed can be controlled in part by power source 2752 that powers a coil (as shown) and/or by a heat source 2760 that heats process fluid 2754 before the process fluid enters the bottom of the fluidized bed.

The pressures and flow rates and other conditions in the fluidized bed and at the environmental interfaces of the fluidized bed serve to cause the powder and fluid mixture to behave together as a fluid. The mixture exhibits many properties and characteristics of fluids, such as the ability to free flow under gravity, and/or to be pumped using fluid handling technologies.

In the implementation of FIG. 27B1 and FIG. 27B2, the fluidized bed has multiple ports that are positioned at different heights of the tapered body. This is so that a first powder in fluid $2756_1$ flows out at a particular temperature/pressure, whereas a second powder in fluid $2756_2$ flows out at a second, different particular temperature/pressure. The flows through the multiple ports can be controlled such that the collection vessel can receive any ratio or amounts of first powder in fluid $2756_1$ and second powder in fluid $2756_2$.

Method of Forming Covetic Materials

Table 3 shows some non-limiting examples of methods for forming powdered covetic materials.

TABLE 3

| Example Methods | Designation |
|---|---|
| Example Method 1 | Producing organo-metallic materials after dissociation of a hydrocarbon process gas in a microwave reactor-based plasma spray torch |
| Example Method 2 | Growing carbon allotropes on input particles within a microwave reactor |
| Example Method 3 | Coating input materials after dissociation of alternative process gases in a microwave reactor-based plasma spray torch |

Example Method 1

In some implementations of method 1, structured carbons (such as carbon allotropes) are formed in a first region of a microwave reactor (such as through the dissociation of a hydrocarbon process gas). In a second region that is at a lower temperature than the first region, the structured carbons are decorated with a metal so as to form a metalized carbon material (such as an organo-metallic material). The metalized carbon material is further cooled to a temperature below the melting point of the metal. In some implementations, the metalized carbon material is initially in the form of carbon particles that are decorated with a metal. The particles are further cooled so as to form a powder. The powder can be collected and transported to an application facility. The powder comprising metalized carbon material having covetic bonds can be remelted and used in conjunction with any known techniques for forming a component from a powder. Strictly as examples, components can be formed from a powder by using die pressing followed by re-melting, isostatic pressing followed by re-melting, hot forging, metal injection molding, laser sintering, etc.

Example Method 2

In this method 2, one or more hydrocarbon gases (or in some cases gases and liquids) are input into the system. Strictly as examples, the gases and/or liquids that can be input into the system include methane, ethane, methylacetylene-propadiene propane (MAPP), and hexane. In a first region 2104 at a first temperature, the carbon atoms are dissociated from other atoms (such as dissociated from hydrogen). A molten metal 2108 is introduced into the reactor as metal particles. Then, in a second region 2106, the carbons produced in the first region combine with the metal particles. The carbon can grow on the surface of the metal particles and/or grow within the interior of the metal particles. In some situations, and under some conditions, the carbon growth comprises growth of 2D carbons on or in the metal particles. In other situations, and/or under other conditions, the carbon growth comprises growth of 3D carbons on or in the metal particles. In any of the foregoing growth situations, the growth can take place to the maximum extent allowed by the lattice. For example, the molten metal can be aluminum with a face-centered cubic (FCC) crystal structure, and the carbon can form a solid solution with the aluminum up to a particular concentration. In some implementations, the carbon forms a solution with the metal up to a concentration determined by the metal properties (such as the crystal structure) and then precipitate out of the metal-carbon solution to form 2D or 3D carbon on and/or within the metal particles.

The growth in this method 2 is carried out under non-equilibrium thermal conditions. Specifically, various differing thermal conditions to control (for example): (1) first temperatures (such as higher temperatures) in the first region that are needed to control the foregoing dissociation, and (2) second temperatures (such as lower temperatures) in the second region to control insipient melting of metal powders and/or the formation and properties of the metal-carbon particles in the second region. Temperatures in these two zones can be independently controlled. Using this method, the sprayed materials are true covetic materials that exhibit true covetic behaviors.

Example Method 3

In still further non-limiting examples, materials and/or coatings on input particles can be created or deposited from mixed materials such as trimethylamine (TMA), trimethylglycine (TMG), and methylacetylene-propadiene propane. The particles can be cooled and collected as a powder. Some examples of particles that can be created from target materials in the first zone are phased carbons, silicon carbide, metal oxides, metal nitrides or metals. In some cases, the input particles are metals, and compound films (such as metal oxides or metal nitrides) are coated on the metallic input particles, while in other cases, the input particles contain compound materials and metallic coatings are deposited on the input particles. Some examples of particles that can be created from input gases in the first zone are carbon allotropes (such as innate carbons), silicons, ZnO, AlOx, and NiO.

In some implementations, gases, including various non-hydrocarbon gasses or alcohols are input into the first zone and the first zone comprises a sputtering apparatus and a power supply, wherein the sputtering apparatus is configured to generate a plurality of ionic species from a selected target material. The target material and the ionic species combine to form a plurality of particles. The power supply can be an AC, DC, RF, or high-power impulse magnetron sputtering (HIPIMS) power supply and can be configured to generate a plurality of ionic species from the target material by tuning the power, voltage, frequency, repetition rate, and/or other characteristics of the power supply.

FIG. 27C is a schematic depicting a plasma spray process that is used for production of a powdered covetic material.
Powdered Material Processing Sequence A visual representation of an example powdered material processing sequence from hydrocarbon cracking and particle nucleation (such as the shown first region 2104), to graphene growth (such as the shown second region 2106), cooling of the semi-molten particles (such as in the shown cooling region) and collection of powdered covetic material (such as in the collection region, and into the collection vessel 2704) is shown in FIG. 27C. Mechanisms that underlie the efficacy of the example powdered material processing sequence are now briefly discussed.

In absence of a metal precursor (whether metalorganic or particle form), the microwave plasma dissociates methane to form carbon radicals (as well as polycyclic aromatics/acetylene) that will then form few layer (FL) graphene (or stacked lamellae) structures respectively. However, in the presence of a metal precursor in the plasma zone (such as refer to the reactors of FIG. 21A and FIG. 22A), the metal (either from metalorganic nuclei or particle) can serve as a seed site for heterogeneous carbon growth (such as carbon in the form of ionized radical, graphene nuclei, or polycyclic aromatic (acetylene)).

When using metals with a low solubility, such as Al or Cu, graphene sheets can grow (such as either through adatom/monomers or as a cluster) onto the surface of the metal. Characteristics of the growth depends at least in part on symmetry and minimization of interfacial free energy at the metal surface. As such, carbon growth occurs at the metal particle alongside metal atom re-sputtering events at the surface to create intermixed and/or layered metal/carbon structures. As is known in the art, the radius of the metal particle (such as surface curvature), can affect carbon solubility in the metal particle. As an example, a smaller radius (such as corresponding to higher curvature) increases the solubility over equilibrium (at a planar surface), which increase in the solubility can in turn impact the thickness of the graphene layers.

Once the powdered covetic materials 2710 have been collected in a collection vessel, the powdered covetic materials can be further processed using conventional techniques (such as injection molding techniques, other techniques using powdered metal).

Manufacturing Techniques Using Powdered Covetic Materials

Figure 28:
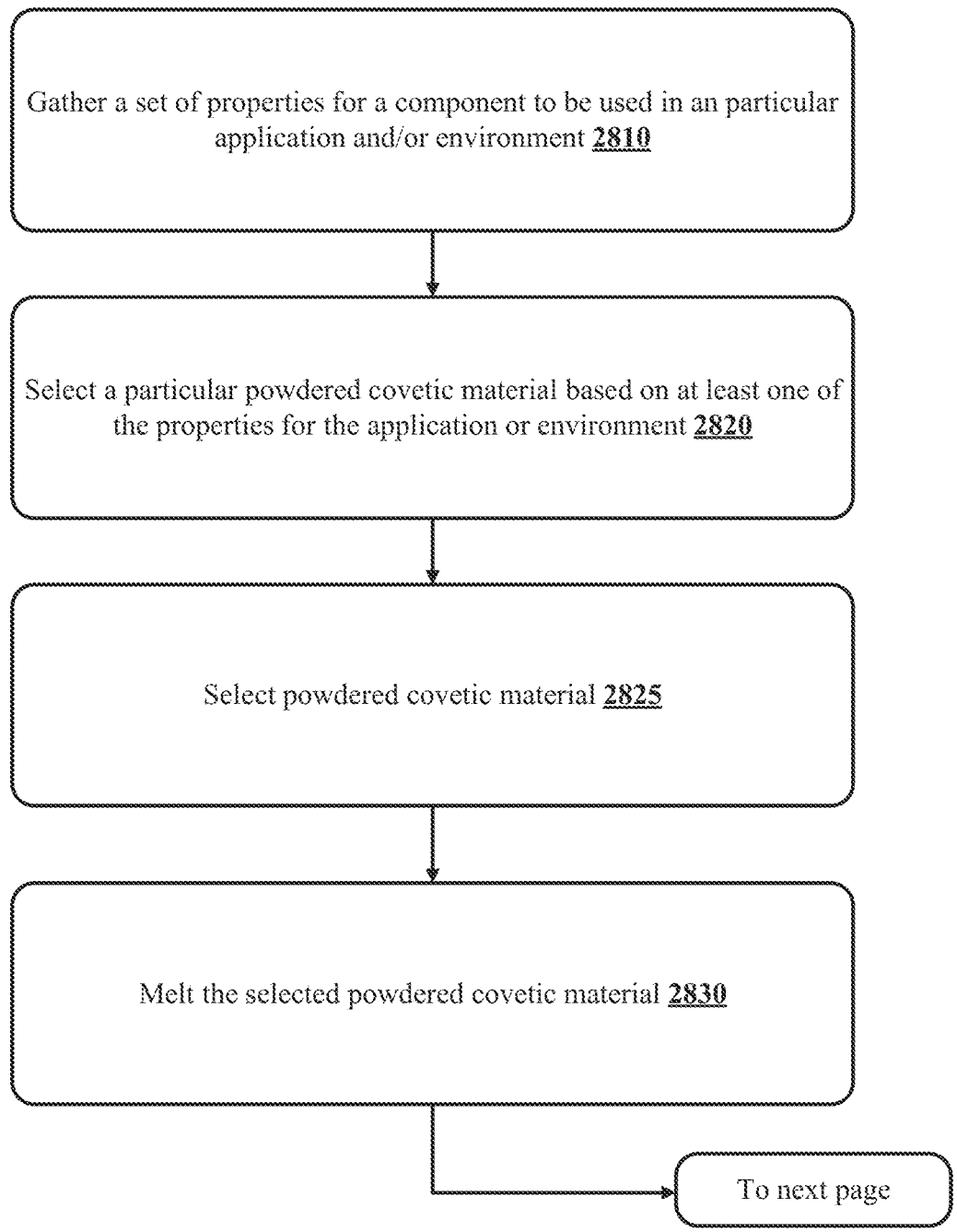
FIG. 28 depicts method for making components from powdered materials, e.g., powdered covetic materials, using injection molding techniques, according to some implementations.

FIG. 28 depicts method for making components from powdered covetic materials using injection molding techniques. As shown, the method is initiated upon gathering a set of properties for a component to be used in a particular application and/or environment (operation 2810), then selecting a particular powdered covetic material based on at least one of the properties for the application or environment (operation 2820). The selection may be based on desired mechanical properties for the component, and/or based on desired anti-corrosive properties of the component in the environments corresponding to its intended use, and/or other desired properties. The selection might be based on multiple desired properties, and in some cases a selection tool solved an optimization problem based on a set of properties and an objective function.

Once the covetic material has been selected (operation 2820), the selected powdered covetic material 2825 is melted (operation 2830) and introduced into a mold (operation 2840). A prescribed temperature and a prescribed pressure are maintained inside the mold for a prescribed duration (operation 2850) after which duration the temperature and pressure inside the mold is brought to about 30° C. and about atmospheric pressure (operation 2860). The component is released from the mold (operation 2870) and deployed in the intended application (operation 2880).

As heretofore mentioned, the selection of a particular covetic material might be based on multiple desired properties, some of which properties might be used as a variable of an objective function. In some cases, the selection of a particular covetic material might be based on a particular dominant property (such as mechanical strength, weight, anti-corrosiveness, etc.). In some cases, the properties of interest are ratios of other properties, such as strength to weight, specific heat to weight, etc.) In some cases, the dominant property is to be maximized (or minimized) subject to one or more constraints on other properties.

As such, powdered covetic materials can be deployed in a wide range of applications. In many cases, the resulting components made from powdered covetic materials outperform components made from other materials. Some example applications that correlate to certain dominant properties are shown and discussed as pertains to the following FIG. 29.

Figure 29:
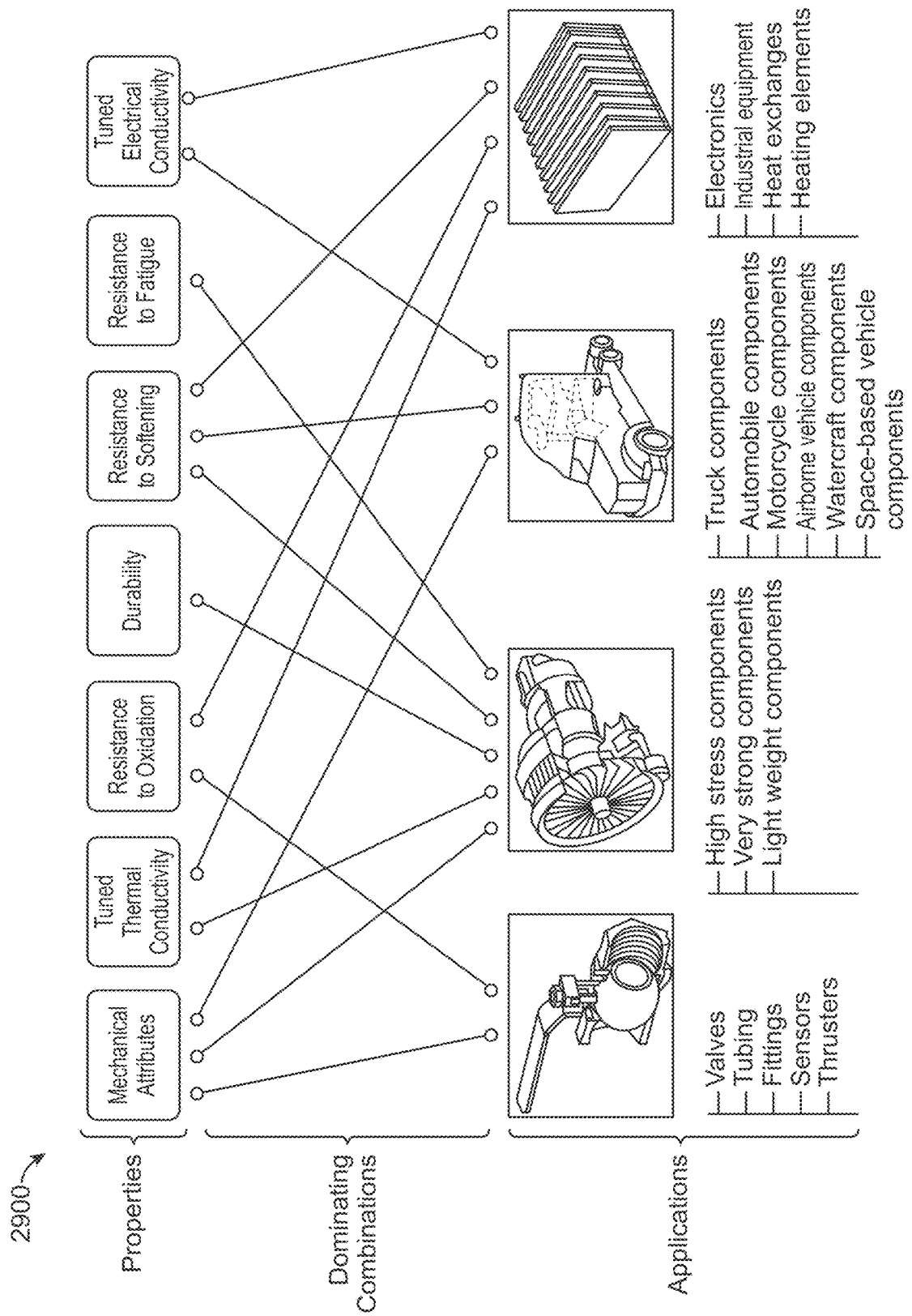
FIG. 29 depicts various properties of materials described herein, including covetic materials, according to various embodiments.

FIG. 29 is a diagram 2900 depicting various properties of covetic materials. The shown properties include mechanical attributes, thermal conductivity, resistance to oxidation, durability, resistance to softening at high temperatures, resistance to fatigue, and electrical conductivity. Individual ones and/or combinations of these parameters become dominant when selecting a particular covetic material for a particular application.

Strictly as an example, resistance to oxidation might be a dominant parameter when selecting a covetic material for use in making corrosion-resistant valves. As another example, when selecting particular covetic materials to be used in the manufacture of blades for aircraft engine turbines, mechanical attributes such as a strength-to-weight ratio, subject to a strength minimum constraint might be a dominating mechanical attribute. The blade might also need to exhibit a very high resistance fatigue.

Typically, covetic materials exhibit not only the aforementioned properties but also are less dense than the metal or alloy that is used in making the covetic powder. A lower density often corresponds to a lower weight for a formed component as compared with the same component made from the metal or alloy in absence of carbon loading. As such, truck parts (such as cab components, as shown), automobile parts (such as doors fenders, roof panels, etc.), motorcycle parts, bicycle parts as well as various components (such as structural members) of airborne vehicles, and/or watercraft, and/or space-based vehicles or platforms can avail of the lower weight-to-strength ratio of covetic materials as compared with the base metals or alloys that are used in making the covetic materials.

As another example, covetic materials often exhibit exceptional thermal conductivity such that structural members formed of covetic materials can be used in high-temperature applications (such as heat sinks for electronics, industrial heat exchangers, etc.).

As yet another example, covetic materials often exhibit exceptional resistance to corrosion. More specifically, covetic laminates made using the foregoing techniques exhibit extremely high corrosion resistance, even at the top layer (such as at the component-to-environment interface). This property is of particular interest when components made with covetic materials are subjected to harsh environments.

As a still further example, covetic materials can be tuned for surface smoothness. More specifically, covetic laminates made using the foregoing techniques exhibit extremely high surface smoothness. This surface smoothness property is of particular interest when the covetic materials serve as a heat shield, such as may be demanded in applications where friction at the surface (such as friction generated as a fluid passes over the surface at high speed) generates unwanted heat at the surface. By using the herein-disclosed techniques, the specific composition of the covetic material and/or by using the herein-disclosed specific techniques for deposition of the covetic material can result in a hydraulically smooth surface, which can in turn be used in airborne and/or space-based vehicles.

In certain implementations, one set of properties may dominate other properties. For example, the surface of a space-based vehicle (such as a satellite) might be required to be substantially non-reflective to a range of electromagnet radiation (such as substantially non-reflective to visible light), while at the same time, the surface of the space-based vehicle might be required to be thermally isolating (such as thermally non-conducting). The foregoing tuning techniques accommodate such situations where a particular desired property (such as non-reflectivity) dominates the tuning of the plasma spray torch so as to produce a substantially non-reflective surface, even at the expense of other properties.

The properties as shown and described as pertains to FIG. 29 are merely examples. Additional properties and/or combinations of properties might be demanded or desirable in various applications, and these additional properties are exhibited in resultant materials based on tuning of inputs and controls of the plasma spray torch. Strictly as examples of the foregoing additional properties, such properties and/or combinations of properties might include or be related to a strength-to-weight metric, and/or a specific density, and/or mechanical toughness, and/or sheer strength, and/or flex strength, etc.

Some applications (e.g., for high-stress/high-temperature operation, or for operation in chemically-harsh environments) have particular specifications as to anti-corrosiveness, and/or strength, and/or hardness, and/or other characteristics of the final material or component. In some situations, the particular specifications can be satisfied by use of an alloy that is, in turn, used to form components in correspondence with the particular application. VIM furnaces are often used for forming alloys. Sometimes, carbon-containing materials in powder form are added to the alloy admixture so as to decrease weight while maintaining strength and/or other characteristics of the alloy.

Unfortunately, a VIM furnace generates a strong magnetic field. The effect of this strong magnetic field on constituents of the powder is often stronger than the effect of gravity on the constituents of the powder. As such, the magnetic field has the unwanted effect of ejecting the powder from the VIM furnace even before the powder has a chance to enter into the crucible of the VIM furnace, to melt, and to then disperse within the admixture melt. One technique to address this unwanted ejection of the powder from the VIM furnace is to pelletize the powder into a dense form such that, when the form is introduced into the VIM furnace, it is not ejected by the magnetic force of the VIM furnace. Rather, the pelletized form enters into the crucible of the VIM furnace such that it melts inside the VIM furnace, and such that it becomes mixed into the molten admixture.

A carbon-containing alloy is thusly formed, preferably a carbon-containing alloy having at least some, more preferably all, of the physical characteristics as described hereinabove with respect to covetic materials. Such physical characteristics shall be understood as including, without limitation, high carbon loading (e.g., above 1.5%, above 5%, above 15%, above 40%, above 60%, and up to 90% of the material is carbon, according to various embodiments); substantially homogeneous dispersal of carbon throughout a surface layer and/or a bulk of the material; presence of carbon at interstitial sites of a crystal lattice of the metal with which the carbon is alloyed; absence of carbon aggregates and/or agglomerates at grain boundaries of the material.

FIG. 30A1 and FIG. 30A2 depicts problems and solutions associated with melting metal-decorated carbons in powder as compared with melting metal-decorated carbons in pellet form. The figures are being presented side-by-side to particularly illustrate the problem (30A100) and solution (30A200) associated with use of powders in a VIM processor.

As is known in the art, vacuum induction melting relies on a high-powered current generation source 3006 to melt metal within a vacuum environment 3002. The induction heating process produces eddy currents within conductors (e.g., metals). The eddy currents in turn produce heat. The magnetic field generated by the heating coils produce an upward force. Each individual particle of the powder 3004 does not weigh enough to overcome the upward forced produced by the electromagnetic force, which results in unwanted ejection 3003 of the metal-decorated carbon powder. FIG. 30A2 depicts the herein-disclosed solution to this unwanted ejection, namely by compressing many individual particles of the powder into a pellet 3008. As a result, the force of gravity acting on the pellet overcomes the force of the magnetic field on constituents of the powder. This solves the previously-discussed problem that the effect of the magnetic field of the VIM processor on a powder is stronger than the effect of gravity on the powder. As such, the pellet enters the crucible and is heated together with the constituents of the admixture.

Once the admixture reaches its melting point, the magnetic fields begin to stir the metal alloy. The alloy melt—including the carbon-containing constituents that are dispersed throughout the alloy melt matrix—can now be poured into a mold that is specific to a component for a given application.

Figure 31:
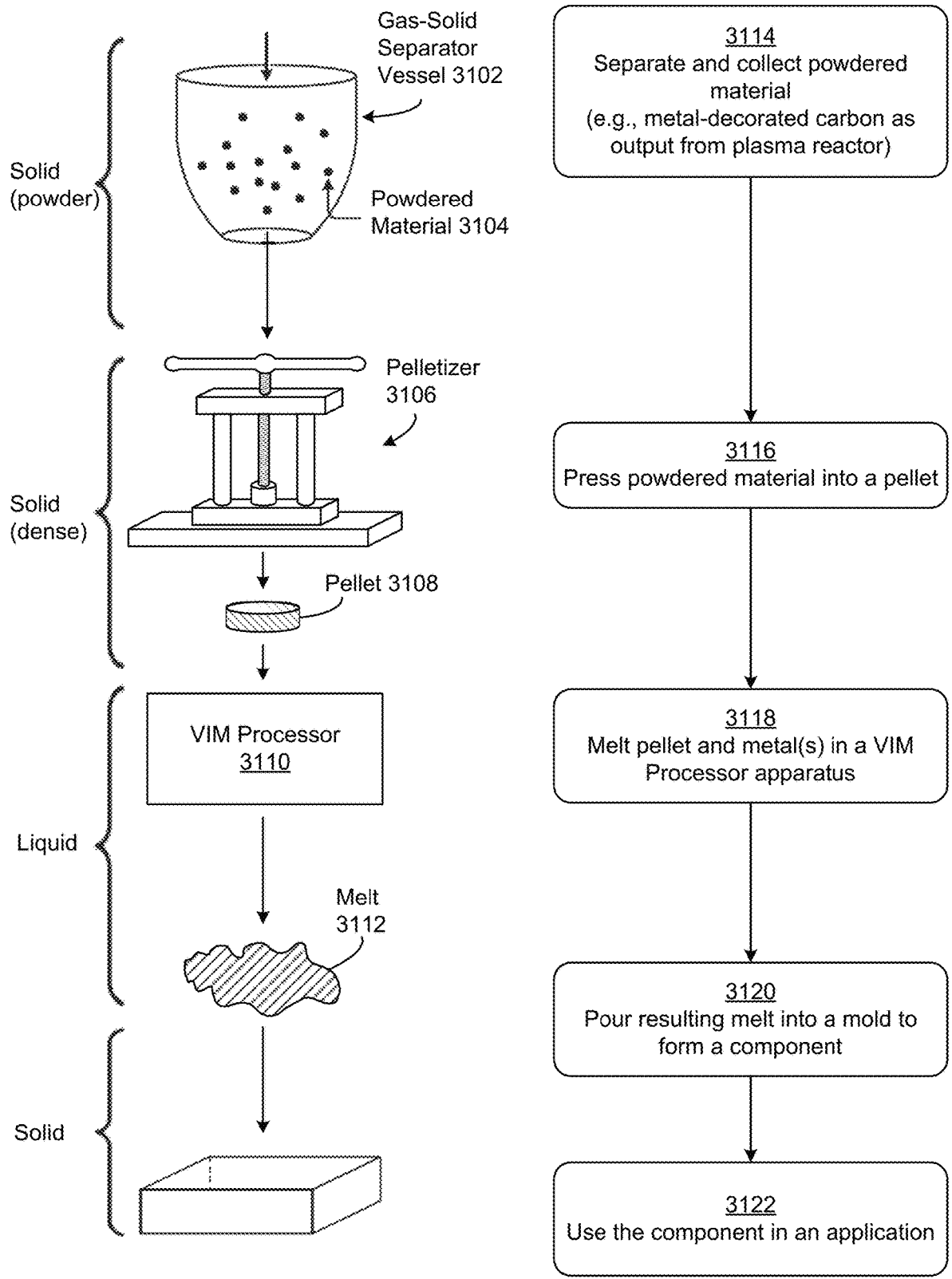
FIG. 31 depicts a method of using a pellet so as to minimize or eliminate ejection of material during introduction of the pellet into a VIM furnace, according to some embodiments.

FIG. 31 depicts a method of using a pellet 3108 so as to minimize or eliminate ejection of material during introduction of the pellet 3108 into the VIM processor 3110. The figure is being presented to illustrate an exemplary materials handling process whereby powdered material 3004 is pelletized before being used in a VIM processor. In additional approaches, the VIM processor 3110 may be substituted, or used in combination with, a vacuum arc melt processing apparatus, an electron beam melt furnace, an ion plating furnace, a plasma flame source, a smelter, a traditional metal-metal melt furnace, or any equivalent(s) and/or combinations thereof that would be understood by a person having ordinary skill in the art upon reading the present disclosure.

To obtain the powdered material, a supply gas (e.g., a hydrocarbon such as methane) is flowed into a plasma reactor to yield a plasma containing dissociated carbon atoms and dissociated hydrogen atoms. At some particular location in the plasma plume, such as where the hydrogen is fully dissociated from the carbon atoms, a metal melt (e.g., a nickel melt) is injected into the plasma. The injected metal melt combines with the dissociated carbon atoms to form a metal-decorated carbon molecules, some of which metal-decorated carbon molecules amalgamate with other metal-decorated carbon molecules. When cooled to a temperature below the melting point of the injected metal, the precipitate exits from the plasma reactor as a powdered material 3104.

After collection of the metal-decorated carbon powder from the plasma reactor (step 3114) the metal-decorated carbon molecules are separated from the dissociated hydrogen molecules (e.g., H2), possibly in a gas-solid separator or other collection vessel that is situated at the exit port of the plasma reactor. For example, and as shown, a gas-solid separator vessel 3102 may be implemented using equipment such as gravity separators, cyclones, scrubbers, electrostatic separators, filters, etc. as would be appreciated by those having ordinary skill in the art upon reading the present disclosure.

In the shown example, the metal-decorated carbon (a solid) and the hydrogen molecules (a gas) may be placed in a cyclone gas-solid separator vessel 3102. This particular configuration uses the concept of inertia to separate the solid (e.g., metal-decorated carbon) from the gas (e.g., the hydrogen). Due to the differences of molecular weight between the metal-decorated carbon and the hydrogen, the lighter material, in this case the hydrogen, will be more affected by the vortex created within the cyclonic gas-solid separator vessel. As such, the hydrogen gas will be forced (by the cyclonic effect) to travel upwards, thus separating the gas from the heavier powdered material 3104 (e.g., the metal-decorated carbon molecules). The shape of the gas-solid separator vessel facilitates flow of the metal-decorated carbon particles downwards towards the bottom of the vessel. This downward flow is in an opposite direction from the upward flow of the hydrogen. As such, the metal-decorated carbon particles can be collected for further processing.

Once the metal-decorated carbon powders have been isolated from the hydrogen and captured, the metal-decorated carbons are compressed to form a rigid body pellet 3108 (step 3116). This pelletizing may be accomplished, for example, through use of pelletizer 3106, such as a 12-ton press that is either automatically actuated or manually operated. Although this example shows use of a 12-ton press as the pelletizer 3106, any pelletizing technique and/or apparatus that would be understood by a skilled artisan apprised of this disclosure as suitable to generate pellets that have sufficient mass to avoid ejection from a VIM processor may be used without departing from the scope of the invention.

The pelletization of the metal-decorated carbon exploits the mechanics of how the metal-decorated carbon interacts with the magnetic flux of the VIM with respect to gravity. More specifically, gravity acts more forcefully on the pellet than does the magnetic flux. As such, when introducing a pellet (rather than a powder) into the VIM processor 3110, the foregoing problem pertaining to ejection of material due to the magnetic forces is eliminated.

Once the pellet is introduced into the crucible of the VIM processor, the pellet will begin to melt and mix with other contents of the crucible (step 3118). During this step, when the pellet melts, it is uniformly dispersed within the metal admixture. To facilitate uniform dispersal, the VIM crucible may be loaded with the pellet alone, with the pellet placed on a metal powder, or with metal powder placed both under and on top of the pellet, according to various embodiments.

The resulting melt 3112 can then be poured into a mold (step 3120) and/or used in conjunction with injection molding equipment to form a component (e.g., turbine blade, automotive components, medical equipment, etc.). In some cases, the resulting output of the VIM processor (e.g., melt 3112) is cooled and then powderized, using any suitable technique, so as to be used with other mechanical part formation methods, for example 3D printing, and in turn, used in any application (step 3122).

Figure 32:
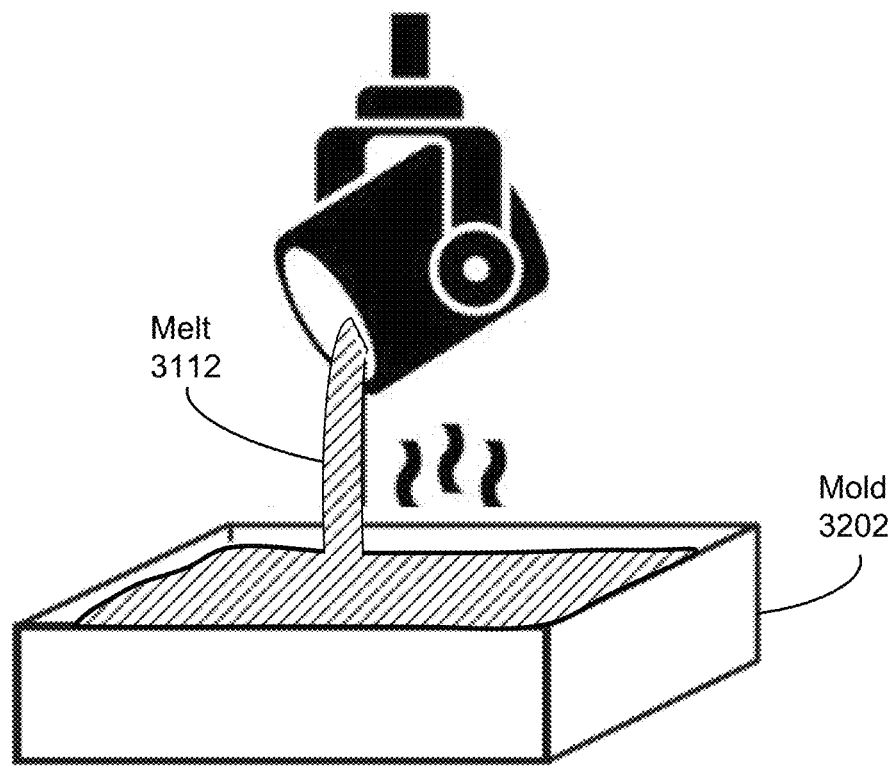
FIG. 32 depicts a melt being placed into a mold, according to some embodiments.

FIG. 32 depicts a melt 3112 being placed into a mold 3202. The melt 3112 can be placed into a mold 3202 of any shape or form. Once the melt has been cooled, the component can be removed from the mold and used in its intended application.

Strictly as an example, a mold for a turbine blade could be used. The melt, consisting of the metal admixture and the carbon-containing constituents, may then be placed in the turbine blade mold and cooled. Once cooled off and removed from the mold, the turbine blade could be used in its intended application. As another example, the melt may be cooled, then powderized, then packaged for use with a 3D printer or other additive manufacturing technique/apparatus.

Figure 33:
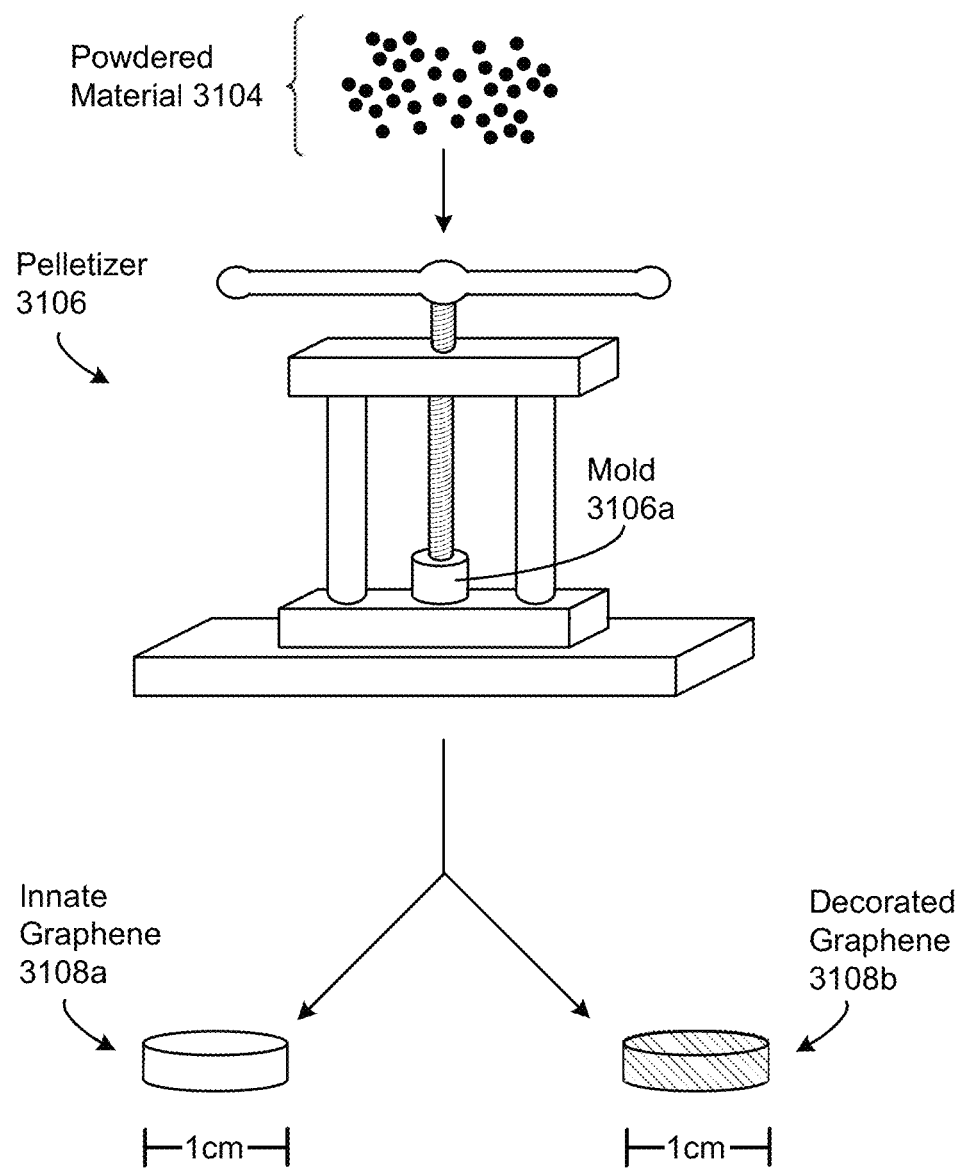
FIG. 33 depicts a simplified schematic of a puck processing technique and apparatus, according to one aspect.

FIG. 33 depicts a simplified schematic of pellet processing, according to various approaches. As described in detail hereinabove with reference to FIG. 31, a powdered material 3104 is obtained, e.g., as output from a microwave plasma reactor, separated from unwanted gases, and pressed into a pellet using a pelletizer 3106. Preferably, the pelletizer 3106 includes a mold having a physical configuration/arrangement suitable to produce a pellet having desired geometry. As shown in FIG. 33, mold 3106a is configured to produce substantially cylindrical pellets (or "pucks") with a diameter of about one centimeter. Of course, skilled artisans will appreciate that the geometric characteristics of the pellets may be chosen and/or tuned based on properties (e.g., magnetic field strength, volume, etc.) of the VIM processor (or equivalent apparatus) to be used to produce desired materials. Notably, the pellets generated according to experiments represented in FIG. 33 were produced without the need for chemical binders.

As also shown in FIG. 33, and demonstrated experimentally, the inventors have successfully produced pellets consisting essentially of innate graphene alone (3108a), as well as pellets formed from metal-decorated carbon, e.g., decorated graphene (3108b). Either type of pellet may be produced using substantially the same technique, with the only difference being the composition of the powder used to generate the pellet.

Figure 34:
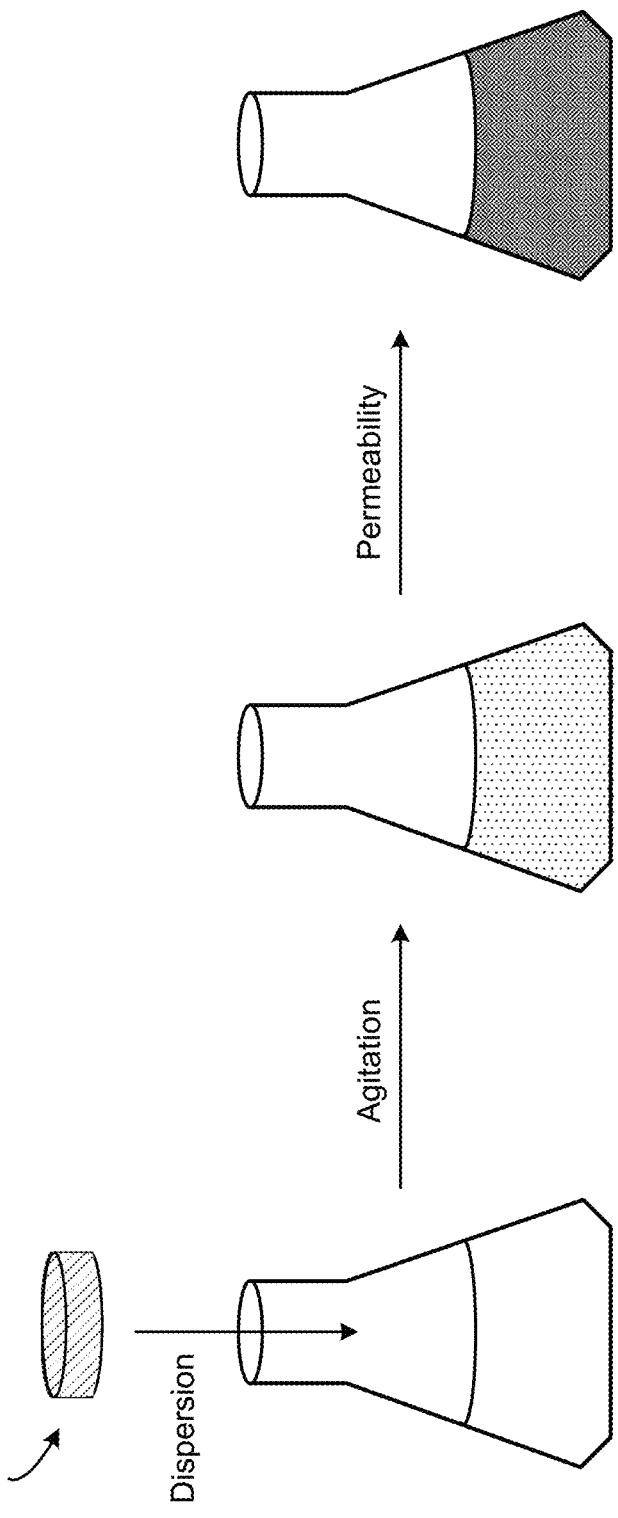
FIG. 34 shows a simplified schematic of a puck dispersion testing process, according to one approach.

In a further experiment, represented schematically by FIG. 34, a pellet, such as pellet 3108, was dispersed in a solution of isopropanol via manual agitation. After agitation, which may be performed manually, using an ultrasonic wand (or other mechanism for ultrasonic agitation), etc. as would be appreciated by a person having ordinary skill in the art upon reading the present disclosure, the resulting suspension exhibited permeability. Magnetic testing verified dispersion of nickel decorated carbon.

In the foregoing specification, the disclosure has been described with reference to specific implementations thereof. It will however be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are to be regarded in an illustrative sense rather than in a restrictive sense.

What is claimed is:

1. A composition of matter, comprising one or more particles, wherein at least some of the one or more particles independently comprise a metal lattice having one or more coherent, planar layers of graphene disposed in the metal lattice.

2. The composition of matter as recited in claim 1, wherein at least some carbon atoms of the one or more coherent, planar layers of graphene are disposed in interstitial sites within the metal lattice.

3. The composition of matter as recited in claim 1, wherein the one or more coherent, planar layers of graphene are interlaced interstitially between basal planes of the metal lattice.

4. The composition of matter as recited in claim 1, wherein the metal lattice comprises one or more metals selected from the group consisting of: aluminum, copper, iron, nickel, titanium, tantalum, tungsten, chromium, molybdenum, cobalt, manganese, niobium, and combinations thereof.

5. The composition of matter as recited in claim 1, wherein the one or more coherent, planar layers of graphene consist of a single layer of the graphene.

6. The composition of matter as recited in claim 1, wherein the one or more coherent, planar layers of graphene include at least five layers of the graphene, and no more than fifteen layers of the graphene.

7. The composition of matter as recited in claim 1, wherein at least some carbon atoms of the one or more layers of graphene are covalently bonded to metal atoms of the metal lattice.

8. The composition of matter as recited in claim 7, wherein the covalent bonds between carbon atoms of the graphene and the metal atoms comprise non-polar covalent bonds.

9. The composition of matter as recited in claim 1, wherein at least some carbon atoms of the one or more layers of graphene are covalently bonded to other carbon atoms of the one or more layers of graphene.

10. The composition of matter as recited in claim 9, wherein the covalent bonds between the carbon atoms of the graphene comprise non-polar covalent bonds.

11. The composition of matter as recited in claim 1, wherein the one or more particles substantially exclude polar covalent bonds.

12. The composition of matter as recited in claim 1, wherein the metal lattice of each of the one or more particles substantially excludes ionic bonds.

13. The composition of matter as recited in claim 1, wherein the one or more coherent, planar layers of graphene are each independently substantially devoid of defects.

14. The composition of matter as recited in claim 1, wherein each of the one or more particles independently comprises from about 15 wt % carbon to about 90 wt % carbon.

15. The composition of matter as recited in claim 1, wherein the metal lattice comprises from about 15 wt % to about 60 wt % carbon at interstitial sites thereof.

16. The composition of matter as recited in claim 1, wherein the metal lattice is characterized by a crystalline structure selected from face centered cubic (FCC), body-centered cubic (BCC), and hexagonal close packed (HCC).

17. The composition of matter as recited in claim 1, wherein each particle is characterized by a lack of carbon aggregate(s) and/or agglomerate(s) at grain boundaries thereof.

18. The composition of matter as recited in claim 1, wherein each of the one or more particles is characterized by a diameter in a range from about 20 nm to about 3.5 µm.

19. The composition of matter as recited in claim 1, wherein a largest discernable feature size of the composition of matter is in a range from about 0.1 nm to about 1 µm.

20. The composition of matter as recited in claim 1, wherein the one or more particles are pressed into a pellet.

* * * * *